(12) United States Patent
Woodgate et al.

(10) Patent No.: US 11,099,448 B2
(45) Date of Patent: Aug. 24, 2021

(54) OFF-AXIS DISPLAY DEVICE

(71) Applicant: RealD Spark, LLC, Boulder, CO (US)

(72) Inventors: Graham J. Woodgate, Henley-on-Thames (GB); Michael G. Robinson, Boulder, CO (US); Jonathan Harrold, Upper Heyford (GB)

(73) Assignee: RealD Spark, LLC, Beverly Hills, CA (US)

( * ) Notice: Subject to any disclaimer, the term of this patent is extended or adjusted under 35 U.S.C. 154(b) by 0 days.

(21) Appl. No.: 17/096,162

(22) Filed: Nov. 12, 2020

(65) Prior Publication Data

US 2021/0149234 A1 May 20, 2021

Related U.S. Application Data

(60) Provisional application No. 63/058,300, filed on Jul. 29, 2020, provisional application No. 62/934,619, filed on Nov. 13, 2019.

(51) Int. Cl.
*G02F 1/139* (2006.01)
*G02F 1/1337* (2006.01)
(Continued)

(52) U.S. Cl.
CPC ........ *G02F 1/1393* (2013.01); *G02B 6/0016* (2013.01); *G02B 6/0036* (2013.01);
(Continued)

(58) Field of Classification Search
None
See application file for complete search history.

(56) References Cited

U.S. PATENT DOCUMENTS 4,621,898 A 11/1986 Cohen
4,974,941 A 12/1990 Gibbons et al.
(Continued)

FOREIGN PATENT DOCUMENTS

CA 2222313 A1 6/1998
CN 1125943 C 10/2003
(Continued)

OTHER PUBLICATIONS

Adachi, et al. "P-228L: Late-News Poster: Controllable Viewing-Angle Displays using a Hybrid Aligned Nematic Liquid Crystal Cell", ISSN, SID 2006 Digest, pp. 705-708.
(Continued)

*Primary Examiner* — Phu Vu
(74) *Attorney, Agent, or Firm* — Penny L. Lowry

(57) ABSTRACT

A switchable backlight for a switchable privacy display apparatus comprises a collimated backlight arranged to provide two off-axis beams and at least one polar control liquid crystal retarder arranged between parallel polarisers. The alignment layers of the liquid crystal retarder are rotated with respect to the electric vector transmission direction of the polarisers. In use in the centre stack of a vehicle, in one mode of operation high image luminance and high image visibility is provided for the passenger while the image is invisible to the driver. In another mode of operation an image is provided to the driver with low stray light to the passenger for night time operation. In a third mode of operation both passenger and driver can see an image with high luminance and image visibility.

30 Claims, 38 Drawing Sheets

(51) Int. Cl.
  *G02F 1/13363* (2006.01)
  *F21V 8/00* (2006.01)
  *G02F 1/1335* (2006.01)
  *G02F 1/1347* (2006.01)
  *H01L 51/52* (2006.01)

(52) U.S. Cl.
  CPC ......... *G02B 6/0068* (2013.01); *G02B 6/0076* (2013.01); *G02F 1/13363* (2013.01); *G02F 1/13471* (2013.01); *G02F 1/133536* (2013.01); *G02F 1/133633* (2021.01); *G02F 1/133738* (2021.01); *G02F 1/133742* (2021.01); *G02F 1/133746* (2021.01); *G02F 1/133757* (2021.01); *H01L 51/5293* (2013.01)

(56) References Cited

U.S. PATENT DOCUMENTS

| | | |
|---|---|---|
| 5,005,108 A | 4/1991 | Pristash et al. |
| 5,035,491 A | 7/1991 | Kawagishi et al. |
| 5,658,490 A | 8/1997 | Sharp et al. |
| 5,715,028 A | 2/1998 | Abileah et al. |
| 5,808,784 A | 9/1998 | Ando et al. |
| 5,835,166 A | 11/1998 | Hall et al. |
| 5,894,361 A | 4/1999 | Yamazaki et al. |
| 5,914,760 A | 6/1999 | Daiku |
| 6,055,103 A | 4/2000 | Woodgate et al. |
| 6,099,758 A | 8/2000 | Verrall et al. |
| 6,144,433 A | 11/2000 | Tillin et al. |
| 6,204,904 B1 | 3/2001 | Tillin et al. |
| 6,222,672 B1 | 4/2001 | Towler et al. |
| 6,392,727 B1 | 5/2002 | Larson et al. |
| 6,437,915 B2 | 8/2002 | Moseley et al. |
| 7,067,985 B2 | 6/2006 | Adachi |
| 7,163,319 B2 | 1/2007 | Kuo et al. |
| 7,227,602 B2 | 6/2007 | Jeon et al. |
| 7,524,542 B2 | 4/2009 | Kim et al. |
| 7,528,893 B2 | 5/2009 | Schultz et al. |
| 7,528,913 B2 | 5/2009 | Kobayashi |
| 7,633,586 B2 | 12/2009 | Winlow et al. |
| 7,660,047 B1 | 2/2010 | Travis et al. |
| 7,766,534 B2 | 8/2010 | Iwasaki |
| 7,834,834 B2 | 11/2010 | Takatani et al. |
| 7,970,246 B2 | 6/2011 | Travis et al. |
| 7,991,257 B1 | 8/2011 | Coleman |
| 8,098,350 B2 | 1/2012 | Sakai et al. |
| 8,154,686 B2 | 4/2012 | Mather et al. |
| 8,237,876 B2 | 8/2012 | Tan et al. |
| 8,249,408 B2 | 8/2012 | Coleman |
| 8,262,271 B2 | 9/2012 | Tillin et al. |
| 8,646,931 B2 | 2/2014 | Choi et al. |
| 8,801,260 B2 | 8/2014 | Urano et al. |
| 8,939,595 B2 | 1/2015 | Choi et al. |
| 8,973,149 B2 | 3/2015 | Buck |
| 9,195,087 B2 | 11/2015 | Terashima |
| 9,274,260 B2 | 3/2016 | Urano et al. |
| 9,304,241 B2 | 4/2016 | Wang et al. |
| 9,324,234 B2 | 4/2016 | Ricci et al. |
| 9,448,355 B2 | 9/2016 | Urano et al. |
| 9,501,036 B2 | 11/2016 | Kang et al. |
| 9,519,153 B2 | 12/2016 | Robinson et al. |
| 10,054,732 B2 | 8/2018 | Robinson et al. |
| 10,126,575 B1 | 11/2018 | Robinson et al. |
| 10,303,030 B2 | 5/2019 | Robinson et al. |
| 10,401,638 B2 | 9/2019 | Robinson et al. |
| 10,488,705 B2 | 11/2019 | Xu et al. |
| 10,649,248 B1 | 5/2020 | Jiang et al. |
| 10,649,259 B2 | 5/2020 | Lee et al. |
| 2002/0024529 A1 | 2/2002 | Miller et al. |
| 2002/0171793 A1 | 11/2002 | Sharp et al. |
| 2003/0089956 A1 | 5/2003 | Allen et al. |
| 2003/0107686 A1 | 6/2003 | Sato et al. |
| 2004/0015729 A1 | 1/2004 | Elms et al. |
| 2004/0100598 A1 | 5/2004 | Adachi et al. |
| 2004/0125430 A1 | 7/2004 | Kasajima et al. |
| 2004/0145703 A1 | 7/2004 | O'Connor et al. |
| 2004/0240777 A1 | 12/2004 | Woodgate et al. |
| 2005/0111100 A1 | 5/2005 | Mather et al. |
| 2005/0117186 A1 | 6/2005 | Li et al. |
| 2005/0157225 A1 | 7/2005 | Toyooka et al. |
| 2005/0190326 A1 | 9/2005 | Jeon et al. |
| 2005/0190329 A1 | 9/2005 | Okumura |
| 2005/0219693 A1 | 10/2005 | Hartkop et al. |
| 2006/0066785 A1 | 3/2006 | Moriya |
| 2006/0082702 A1 | 4/2006 | Jacobs et al. |
| 2006/0203162 A1 | 9/2006 | Ito et al. |
| 2006/0215244 A1 | 9/2006 | Yosha et al. |
| 2006/0244884 A1 | 11/2006 | Jeon et al. |
| 2006/0262258 A1 | 11/2006 | Wang et al. |
| 2006/0262558 A1 | 11/2006 | Cornelissen |
| 2006/0268207 A1 | 11/2006 | Tan et al. |
| 2006/0285040 A1 | 12/2006 | Kobayashi |
| 2007/0035964 A1 | 2/2007 | Olczak |
| 2007/0047254 A1 | 3/2007 | Schardt et al. |
| 2007/0064163 A1 | 3/2007 | Tan et al. |
| 2007/0139772 A1 | 6/2007 | Wang |
| 2007/0223251 A1 | 9/2007 | Liao |
| 2007/0285775 A1 | 12/2007 | Lesage et al. |
| 2008/0068329 A1 | 3/2008 | Shestak et al. |
| 2008/0158491 A1 | 7/2008 | Zhu et al. |
| 2008/0285310 A1 | 11/2008 | Aylward et al. |
| 2008/0316198 A1 | 12/2008 | Fukushima et al. |
| 2009/0040426 A1 | 2/2009 | Mather et al. |
| 2009/0085894 A1 | 4/2009 | Gandhi et al. |
| 2009/0086509 A1 | 4/2009 | Omori et al. |
| 2009/0128735 A1 | 5/2009 | Larson et al. |
| 2009/0128746 A1 | 5/2009 | Kean et al. |
| 2009/0174843 A1 | 7/2009 | Sakai et al. |
| 2009/0213298 A1 | 8/2009 | Mimura et al. |
| 2009/0213305 A1 | 8/2009 | Ohmuro et al. |
| 2009/0244415 A1 | 10/2009 | Ide |
| 2010/0002296 A1 | 1/2010 | Choi et al. |
| 2010/0128200 A1 | 5/2010 | Morishita et al. |
| 2010/0149459 A1 | 6/2010 | Yabuta et al. |
| 2010/0177113 A1 | 7/2010 | Gay et al. |
| 2010/0205667 A1 | 8/2010 | Anderson et al. |
| 2010/0238376 A1 | 9/2010 | Sakai et al. |
| 2010/0283930 A1 | 11/2010 | Park et al. |
| 2010/0289989 A1 | 11/2010 | Adachi et al. |
| 2010/0295755 A1 | 11/2010 | Broughton et al. |
| 2010/0328438 A1 | 12/2010 | Ohyama et al. |
| 2011/0018860 A1 | 1/2011 | Parry-Jones et al. |
| 2011/0032483 A1 | 2/2011 | Hruska et al. |
| 2011/0241983 A1 | 10/2011 | Chang |
| 2011/0286222 A1 | 11/2011 | Coleman |
| 2011/0321143 A1 | 12/2011 | Angaluri et al. |
| 2012/0002121 A1 | 1/2012 | Pirs et al. |
| 2012/0086875 A1 | 4/2012 | Yokota |
| 2012/0127573 A1 | 5/2012 | Robinson et al. |
| 2012/0147280 A1 | 6/2012 | Osterman et al. |
| 2012/0235891 A1 | 9/2012 | Nishitani et al. |
| 2012/0294037 A1 | 11/2012 | Holman et al. |
| 2012/0299913 A1 | 11/2012 | Robinson et al. |
| 2012/0314145 A1 | 12/2012 | Robinson |
| 2012/0327101 A1 | 12/2012 | Blixt et al. |
| 2013/0039062 A1 | 2/2013 | Vinther et al. |
| 2013/0100097 A1 | 4/2013 | Martin |
| 2013/0107174 A1 | 5/2013 | Yun et al. |
| 2013/0128165 A1 | 5/2013 | Lee et al. |
| 2013/0242231 A1 | 9/2013 | Kurata et al. |
| 2013/0278544 A1 | 10/2013 | Cok |
| 2013/0293793 A1 | 11/2013 | Lu |
| 2013/0300985 A1 | 11/2013 | Bulda |
| 2013/0307831 A1 | 11/2013 | Robinson et al. |
| 2013/0321340 A1 | 12/2013 | Seo et al. |
| 2013/0328866 A1 | 12/2013 | Woodgate et al. |
| 2014/0009508 A1 | 1/2014 | Woodgate et al. |
| 2014/0022619 A1 | 1/2014 | Woodgate et al. |
| 2014/0071382 A1 | 3/2014 | Scardato |
| 2014/0098418 A1 | 4/2014 | Lin |
| 2014/0111760 A1 | 4/2014 | Guo et al. |
| 2014/0132887 A1 | 5/2014 | Kurata |
| 2014/0201844 A1 | 7/2014 | Buck |
| 2014/0211125 A1 | 7/2014 | Kurata |

(56) References Cited

U.S. PATENT DOCUMENTS

| | | |
|---|---|---|
| 2014/0232960 A1 | 8/2014 | Schwartz et al. |
| 2014/0240344 A1 | 8/2014 | Tomono et al. |
| 2014/0240828 A1 | 8/2014 | Robinson et al. |
| 2014/0268358 A1 | 9/2014 | Kusaka et al. |
| 2014/0286043 A1 | 9/2014 | Sykora et al. |
| 2014/0289835 A1 | 9/2014 | Varshavsky et al. |
| 2014/0361990 A1 | 12/2014 | Leister |
| 2015/0055366 A1 | 2/2015 | Chang et al. |
| 2015/0116212 A1 | 4/2015 | Freed et al. |
| 2015/0177447 A1 | 6/2015 | Woodgate et al. |
| 2015/0177563 A1 | 6/2015 | Cho et al. |
| 2015/0185398 A1 | 7/2015 | Chang et al. |
| 2015/0205157 A1 | 7/2015 | Sakai et al. |
| 2015/0268479 A1 | 9/2015 | Woodgate et al. |
| 2015/0286061 A1 | 10/2015 | Seo et al. |
| 2015/0286817 A1 | 10/2015 | Haddad et al. |
| 2015/0301400 A1 | 10/2015 | Kimura et al. |
| 2015/0346417 A1 | 12/2015 | Powell |
| 2015/0346532 A1 | 12/2015 | Do et al. |
| 2015/0378085 A1 | 12/2015 | Robinson et al. |
| 2016/0103264 A1 | 4/2016 | Lee et al. |
| 2016/0132721 A1 | 5/2016 | Bostick et al. |
| 2016/0147074 A1 | 5/2016 | Kobayashi et al. |
| 2016/0154259 A1 | 6/2016 | Kim et al. |
| 2016/0216420 A1 | 7/2016 | Gaides et al. |
| 2016/0216540 A1 | 7/2016 | Cho et al. |
| 2016/0224106 A1 | 8/2016 | Liu |
| 2016/0238869 A1 | 8/2016 | Osterman et al. |
| 2016/0334898 A1 | 11/2016 | Kwak et al. |
| 2016/0349444 A1 | 12/2016 | Robinson et al. |
| 2016/0356943 A1 | 12/2016 | Choi et al. |
| 2016/0357046 A1 | 12/2016 | Choi et al. |
| 2017/0003436 A1 | 1/2017 | Inoue et al. |
| 2017/0031206 A1 | 2/2017 | Smith et al. |
| 2017/0090103 A1 | 3/2017 | Holman |
| 2017/0092187 A1 | 3/2017 | Bergquist |
| 2017/0092229 A1 | 3/2017 | Greenebaum et al. |
| 2017/0115485 A1 | 4/2017 | Saito et al. |
| 2017/0123241 A1 | 5/2017 | Su et al. |
| 2017/0139110 A1 | 5/2017 | Woodgate et al. |
| 2017/0168633 A1 | 6/2017 | Kwak et al. |
| 2017/0205558 A1 | 7/2017 | Hirayama et al. |
| 2017/0236494 A1 | 8/2017 | Sommerlade et al. |
| 2017/0269283 A1 | 9/2017 | Wang et al. |
| 2017/0269285 A1 | 9/2017 | Hirayama et al. |
| 2017/0329399 A1 | 11/2017 | Azam et al. |
| 2017/0336661 A1 | 11/2017 | Harrold et al. |
| 2017/0339398 A1 | 11/2017 | Woodgate et al. |
| 2017/0343715 A1 | 11/2017 | Fang et al. |
| 2018/0014007 A1 | 1/2018 | Brown |
| 2018/0052346 A1 | 2/2018 | Sakai et al. |
| 2018/0082068 A1 | 3/2018 | Lancioni et al. |
| 2018/0095581 A1 | 4/2018 | Hwang et al. |
| 2018/0113334 A1* | 4/2018 | Fang ............... G02F 1/1323 |
| 2018/0188576 A1 | 7/2018 | Xu et al. |
| 2018/0188603 A1 | 7/2018 | Fang et al. |
| 2018/0196275 A1 | 7/2018 | Robinson et al. |
| 2018/0210243 A1 | 7/2018 | Fang et al. |
| 2018/0231811 A1 | 8/2018 | Wu |
| 2018/0252949 A1 | 9/2018 | Klippstein et al. |
| 2018/0259799 A1 | 9/2018 | Kroon |
| 2018/0259812 A1 | 9/2018 | Goda et al. |
| 2018/0321523 A1 | 11/2018 | Robinson et al. |
| 2018/0321553 A1 | 11/2018 | Robinson et al. |
| 2018/0329245 A1 | 11/2018 | Robinson et al. |
| 2018/0364526 A1 | 12/2018 | Finnemeyer et al. |
| 2019/0086706 A1 | 3/2019 | Robinson et al. |
| 2019/0121173 A1 | 4/2019 | Robinson et al. |
| 2019/0154896 A1 | 5/2019 | Yanai |
| 2019/0196236 A1 | 6/2019 | Chen et al. |
| 2019/0197928 A1 | 6/2019 | Schubert et al. |
| 2019/0215509 A1 | 7/2019 | Woodgate et al. |
| 2019/0227366 A1 | 7/2019 | Harrold et al. |
| 2019/0235304 A1 | 8/2019 | Tamada et al. |
| 2019/0250458 A1 | 8/2019 | Robinson et al. |
| 2019/0293858 A1 | 9/2019 | Woodgate et al. |
| 2019/0293983 A1 | 9/2019 | Robinson et al. |
| 2019/0353944 A1 | 11/2019 | Acreman et al. |
| 2020/0159055 A1 | 5/2020 | Robinson et al. |
| 2020/0225402 A1 | 7/2020 | Ihas et al. |

FOREIGN PATENT DOCUMENTS

| | | |
|---|---|---|
| CN | 1776484 A | 5/2006 |
| CN | 101681061 A | 3/2010 |
| CN | 104133292 A | 11/2014 |
| CN | 204740413 U | 11/2015 |
| CN | 209171779 U | 7/2019 |
| GB | 2418518 A | 3/2006 |
| GB | 2428100 A | 1/2007 |
| GB | 2482065 A | 1/2012 |
| GB | 2486935 B | 9/2013 |
| JP | H01130783 U | 9/1989 |
| JP | H11174489 A | 7/1999 |
| JP | 2007148279 A | 6/2007 |
| JP | 2007273288 A | 10/2007 |
| KR | 20120011228 A | 2/2012 |
| KR | 101990286 B1 | 6/2019 |
| TW | M537663 U | 3/2017 |
| WO | 2005071449 A2 | 8/2005 |
| WO | 2010021926 A2 | 2/2010 |
| WO | 2014011328 A1 | 1/2014 |
| WO | 2015040776 A1 | 3/2015 |
| WO | 2015057625 A1 | 4/2015 |
| WO | 2015143227 A1 | 9/2015 |
| WO | 2015157184 A1 | 10/2015 |
| WO | 2015190311 A1 | 12/2015 |
| WO | 2016195786 A1 | 12/2016 |
| WO | 2018035492 A1 | 2/2018 |
| WO | 2018208618 A1 | 11/2018 |
| WO | 2019055755 A1 | 3/2019 |
| WO | 2019067846 A1 | 4/2019 |
| WO | 2019147762 A1 | 8/2019 |

OTHER PUBLICATIONS

Brudy et al., "Is Anyone Looking? Mitigating Shoulder Surfing on Public Displays through Awareness and Protection", Proceedings of the International Symposium on Persuasive Displays (Jun. 3, 2014), pp. 1-6.

CN201780030715.3 Notification of the First Office Action dated Jan. 21, 2020.

EP-16860628.3 Extended European Search Report of European Patent Office dated Apr. 26, 2019.

EP-17799963.8 Extended European Search Report of European Patent Office dated Oct. 9, 2019.

Gass, et al. "Privacy LCD Technology for Cellular Phones", Sharp Laboratories of Europe Ltd, Mobile LCD Group, Feb. 2007, pp. 45-49.

Ishikawa, T., "New Design for a Highly Collimating Turning Film", SID 06 Digest, pp. 514-517.

Kalantar, et al. "Backlight Unit With Double Surface Light Emission," J. Soc. Inf. Display, vol. 12, Issue 4, pp. 379-387 (Dec. 2004).

PCT/US2016/058695 International search report and written opinion of the international searching authority dated Feb. 28, 2017.

PCT/US2017/032734 International search report and written opinion of the international searching authority dated Jul. 27, 2017.

PCT/US2018/031206 International search report and written opinion of the international searching authority dated Jul. 20, 2018.

PCT/US2018/031218 International search report and written opinion of the international searching authority dated Jul. 19, 2018.

PCT/US2018/051021 International search report and written opinion of the international searching authority dated Nov. 21, 2018.

PCT/US2018/051027 International search report and written opinion of the international searching authority dated Nov. 30, 2018.

PCT/US2018/053328 International search report and written opinion of the international searching authority dated Nov. 30, 2018.

PCT/US2018/059249 International search report and written opinion of the international searching authority dated Jan. 3, 2019.

(56) References Cited

OTHER PUBLICATIONS

PCT/US2018/059256 International search report and written opinion of the international searching authority dated Jan. 3, 2019.
PCT/US2019/014889 International search report and written opinion of the international searching authority dated May 24, 2019.
PCT/US2019/014902 International search report and written opinion of the international searching authority dated Jun. 25, 2019.
PCT/US2019/023659 International search report and written opinion of the international searching authority dated Jun. 10, 2019.
PCT/US2019/038409 International search report and written opinion of the international searching authority dated Sep. 19, 2019.
PCT/US2019/038466 International search report and written opinion of the international searching authority dated Nov. 5, 2019.
PCT/US2019/042027 International search report and written opinion of the international searching authority dated Oct. 15, 2019.
PCT/US2019/054291 International search report and written opinion of the international searching authority dated Jan. 6, 2020.
PCT/US2019/059990 International search report and written opinion of the international searching authority dated Feb. 28, 2020.
PCT/US2019/066208 International search report and written opinion of the international searching authority dated Feb. 27, 2020.
PCT/US2020/017537 International search report and written opinion of the international searching authority dated Apr. 29, 2020.
PCT/US2020/040686 International search report and written opinion of the international searching authority dated Nov. 20, 2020.
PCT/US2020/044574 International search report and written opinion of the international searching authority dated Oct. 21, 2020.
PCT/US2020/060155 International search report and written opinion of the international searching authority dated Feb. 5, 2021.
PCT/US2020/060191 International search report and written opinion of the international searching authority dated Feb. 8, 2021.
Robson, et al. "Spatial and temporal contrast-sensitivity functions of the visual system", J. Opt. Soc. Amer., vol. 56, pp. 1141-1142 (1966).
Weindorf et al., "Active Circular Polarizer OLED E-Mirror", Proceedings of the Society for Information Display 25th Annual Symposium of Vehicle Displays, Livonia, MI, pp. 225-237, Sep. 25-26, 2018.
CN201880042320.X Notification of the First Office Action dated May 25, 2021.
EP-18855604.7 Extended European Search Report of European Patent Office dated Jun. 1, 2021.
Simonyan et al., "Very Deep Convolutional Networks For Large-Scale Image Recognition", ICLR 2015.
EP-18857077.4 Extended European Search Report of European Patent Office dated Jun. 16, 2021.

* cited by examiner

OFF-AXIS DISPLAY DEVICE

TECHNICAL FIELD

This disclosure generally relates to illumination from light modulation devices, and more specifically relates to control of privacy display.

BACKGROUND

Privacy displays provide image visibility to a primary user that is typically in an on-axis position and reduced visibility of image content to a snooper, that is typically in an off-axis position. A privacy function may be provided by micro-louvre optical films that transmit some light from a display in an on-axis direction with low luminance in off-axis positions. However such films have high losses for head-on illumination and the micro-louvres may cause Moiré artefacts due to beating with the pixels of the spatial light modulator. The pitch of the micro-louvre may need selection for panel resolution, increasing inventory and cost.

Switchable privacy displays may be provided by control of the off-axis optical output.

Control may be provided by means of luminance reduction, for example by means of switchable backlights for a liquid crystal display (LCD) spatial light modulator. Display backlights in general employ waveguides and edge emitting sources. Certain imaging directional backlights have the additional capability of directing the illumination through a display panel into viewing windows. An imaging system may be formed between multiple sources and the respective window images. One example of an imaging directional backlight is an optical valve that may employ a folded optical system and hence may also be an example of a folded imaging directional backlight. Light may propagate substantially without loss in one direction through the optical valve while counter-propagating light may be extracted by reflection off tilted facets as described in U.S. Pat. No. 9,519,153, which is incorporated by reference herein in its entirety.

In a known privacy display the privacy mode is provided by the addition of a removable louver film, such as marketed by 3M Corporation, which may not be fitted or removed by users reliably and therefore in practice, is not assiduously attached by the user every time they are outside the office. In another known privacy display the control of privacy mode is electronically activated but control is vested in the user who must execute a keystroke to enter privacy mode.

BRIEF SUMMARY

According to a first aspect of the present disclosure, there is provided a display device comprising: a spatial light modulator arranged to output spatially modulated light, a display polariser arranged on a side of the spatial light modulator, the display polariser being a linear polariser; an additional polariser arranged on the same side of the spatial light modulator as the display polariser, the additional polariser being a linear polariser; at least one polar control retarder arranged between the display polariser and the additional polariser, wherein the at least one polar control retarder comprises: a switchable liquid crystal retarder comprising a layer of liquid crystal material and two surface alignment layers disposed adjacent to the layer of liquid crystal material and on opposite sides thereof, wherein at least one of the surface alignment layers has a pretilt having a pretilt direction with a component in the plane of the layer of liquid crystal material that is at an acute non-zero angle to the electric vector transmission directions of at least one of the display polariser and the additional polariser in at least part of the display device.

Advantageously the polar direction for maximum transmission may be inclined at an acute angle to the direction normal to the surface of the display device. The polar direction for minimum transmission may be inclined in a different direction.

The display polariser and the additional polariser may have electric vector transmission directions that may be parallel. Advantageously transmission in the direction of maximum transmission is maximised.

One of the surface alignment layers may be arranged to provide homogeneous alignment in the adjacent liquid crystal material, said one of the surface alignment layers having said pretilt having a pretilt direction with a component in the plane of the layer of liquid crystal material that may be at an acute non-zero angle to the electric vector transmission directions of at least one of the display polariser and the additional polariser in at least part of the display device. Advantageously increased resilience to applied mechanical force may be achieved.

The other of the surface alignment layers may be arranged to provide homeotropic alignment in the adjacent liquid crystal material. Advantageously the size of the polar region for which low light transmission is provided may be increased.

The other of the surface alignment layers may be arranged to provide homogeneous alignment in the adjacent liquid crystal material. Advantageously the thickness of the layer or liquid crystal material may be reduced.

In this case, when the display polariser and the additional polariser have electric vector transmission directions that are parallel, the other of the surface alignment layers may have said pretilt having a pretilt direction with a component in the plane of the layer of liquid crystal material that is parallel or orthogonal to the electric vector transmission directions of the display polariser and the additional polariser.

The other of the surface alignment layers may have said pretilt having a pretilt direction with a component in the plane of the layer of liquid crystal material that may be at an acute non-zero angle to the electric vector transmission directions of at least one of the display polariser and the additional polariser in at least part of the display device. Advantageously the size of the polar region for which low light transmission is provided may be increased.

Each of the surface alignment layers may be arranged to provide homeotropic alignment in the adjacent liquid crystal material, said surface alignment layers having said pretilt having a pretilt direction with a component in the plane of the layer of liquid crystal material that may be at an acute non-zero angle to the electric vector transmission directions of at least one of the display polariser and the additional polariser in at least part of the display device. Advantageously a wide-angle mode of operation may be achieved with no applied voltage to achieve reduced power consumption.

Each of the surface alignment layers may have a pretilt having a pretilt direction with a component in the plane of the layer of liquid crystal material that may be at an acute non-zero angle to the electric vector transmission directions of at least one of the display polariser and the additional polariser in at least part of the display device. Advantageously the size of the polar region for which low light transmission is provided may be increased.

The at least one polar control retarder further may include at least one passive compensation retarder. Advantageously the size of the polar region for which low light transmission is provided may be increased.

The at least one passive compensation retarder may comprise a passive compensation retarder having its optical axis perpendicular to the plane of the retarder. Advantageously the thickness of the polar control retarder may be reduced.

The at least one passive compensation retarder may comprise a pair of passive compensation retarders which may have optical axes in the plane of the retarders that may be crossed. Advantageously increased retardance may be achieved and cost may be reduced.

The angle between the optical axes may be bisected by the electric vector transmission direction of at least one of the display polariser and additional polariser. Advantageously the size of the polar region for which low light transmission is provided may be increased.

Said at least one of the surface alignment layers may have a pretilt having a pretilt direction with a component in the plane of the layer of liquid crystal material that may be at the same acute non-zero angle to the electric vector transmission directions of the display polariser and the additional polariser at all positions across the surface alignment layer. Advantageously the cost and complexity of fabrication of the surface alignment layer may be reduced.

Said at least one of the surface alignment layers may have a pretilt having a pretilt direction with a component in the plane of the layer of liquid crystal material that may be at an acute non-zero angle to the electric vector transmission directions of the display polariser and the additional polariser that varies monotonically along a predetermined axis across the surface alignment layer in at least part of the display device. Advantageously the uniformity of luminance reduction may be increased for an off-axis snooper.

Where the non-zero angle varies monotonically, the acute non-zero angle may have an acute non-zero average value. Advantageously, the polar direction for maximum transmission may be inclined at an acute angle to the direction normal to the surface of the display device.

Said display polariser may be an output display polariser arranged on the output side of the spatial light modulator. Advantageously the polar control retarder may be fitted after fabrication of the spatial light modulator, reducing complexity. An emissive display may be provided with off-axis luminance control.

In some embodiments, there may not be a reflective polariser arranged between the output display polariser and the at least one polar control retarder. Advantageously thickness and cost may be reduced. Front of display reflectivity to ambient light is reduced.

In other embodiments, a reflective polariser may be arranged between the output polariser and the at least one polar control retarder, the reflective polariser being a linear polariser arranged to pass the same linearly polarised polarisation component as the output polariser.

The spatial light modulator may comprise an emissive spatial light modulator arranged to emit the spatially modulated light. Advantageously display thickness may be reduced.

The display device may further comprise a backlight arranged to output light, the spatial light modulator may comprise a transmissive spatial light modulator arranged to receive and spatially modulate the output light from the backlight. Advantageously increased reduction of light in undesirable polar directions may be provided.

The display device may further comprise a backlight arranged to output light, the spatial light modulator may comprise a transmissive spatial light modulator arranged to receive and spatially modulate the output light from the backlight and said display polariser may be an input display polariser arranged on the input side of the spatial light modulator. Advantageously front of screen thickness is reduced. Frontal reflections may be reduced.

The display device may further comprise: an output display polariser arranged on the output side of the spatial light modulator; a further additional polariser arranged on the output side of the spatial light modulator, the further additional polariser being a linear polariser having an electric vector transmission direction that may be parallel to the electric vector transmission directions of the display polariser and the additional polariser; and at least one further polar control retarder arranged between the further additional polariser and the output display polariser. Advantageously increased reduction of off-axis luminance may be achieved. Increased security factor may be provided.

The display device may further comprise: a further additional polariser arranged on the same side of the spatial light modulator as the additional polariser outside the additional polariser, the further additional polariser being a linear polariser having an electric vector transmission direction that may be parallel to the electric vector transmission directions of the display polariser and the additional polariser; and at least one further polar control retarder arranged between the additional polariser and the further additional polariser. Advantageously the size of the polar region for which low light transmission is provided may be increased.

The backlight may comprise: at least one first light source arranged to provide input light; at least one second light source arranged to provide input light in an opposite direction from the at least one first light source; a waveguide arrangement comprising at least one waveguide, the waveguide arrangement being arranged to receive the input light from the at least one first light source and the at least one second light source and to cause light from the at least one first light source and the at least one second light source to exit from the waveguide arrangement by breaking total internal reflection; and an optical turning film component comprising: an input surface arranged to receive the light exiting from a waveguide through a light guiding surface of the waveguide by breaking total internal reflection, the input surface extending across the plane; and an output surface facing the input surface, wherein the input surface may comprise an array of elongate prismatic elements. Advantageously at least two different illumination profiles may be provided that achieves increased efficiency in desirable polar angular regions.

The waveguide arrangement may comprise: a waveguide extending across a plane and comprising: first and second opposed light guiding surfaces arranged to guide light along the optical waveguide, the second light guiding surface being arranged to guide light by total internal reflection, and first and second input ends arranged between the first and second light guiding surfaces and extending in a lateral direction between the first and second light guiding surfaces; wherein the at least one first light source may be arranged to input light into the waveguide through the first input end and the at least one second light source may be arranged to input light into the waveguide through the second input end, and the waveguide may be arranged to cause light from the at least one first light source and the at least one second light source to exit from the waveguide through one of the first and second light guiding surfaces by breaking total internal reflection. Advantageously thickness may be reduced.

The waveguide arrangement may comprise: a first waveguide extending across a plane and comprising first and second opposed light guiding surfaces arranged to guide light along the optical waveguide, the second light guiding surface being arranged to guide light by total internal reflection; and a first input end arranged between the first and second light guiding surfaces and extending in a lateral direction between the first and second light guiding surfaces; wherein the at least one first light source may be arranged to input light into the first waveguide through the first input end, and the first waveguide may be arranged to cause light from the at least one first light source to exit from the first waveguide through one of the first and second light guiding surface by breaking total internal reflection; a second waveguide extending across the plane and arranged in series with the first waveguide and comprising first and second opposed light guiding surfaces arranged to guide light along the optical waveguide, the second light guiding surface being arranged to guide light by total internal reflection, and a second input end arranged between the first and second light guiding surfaces and extending in a lateral direction between the first and second light guiding surfaces; wherein the at least one second light source may be arranged to input light into the second waveguide through the second input end, and the second waveguide may be arranged to cause light from the at least one second light source to exit from the second waveguide through one of the first and second light guiding surfaces by breaking total internal reflection, and wherein the first and second waveguides may be oriented so that at least one first light source and at least one second light source input light into the first and second waveguides in opposite directions. Advantageously increased uniformity of luminance may be output across the area of the display.

The prismatic elements may each comprise a pair of elongate facets defining a ridge therebetween. Advantageously light from the waveguide may be directed towards desirable observer locations.

The ridges may extend across the plane at non-zero angles to the lateral direction. Advantageously off-axis illumination may be provided.

The ridges may extend across the plane parallel to the lateral direction. Light sources may be arranged at the top and bottom of display, advantageously reducing the width of left and right side bezels.

Embodiments of the present disclosure may be used in a variety of optical systems. The embodiments may include or work with a variety of projectors, projection systems, optical components, displays, microdisplays, computer systems, processors, self-contained projector systems, visual and/or audio-visual systems and electrical and/or optical devices. Aspects of the present disclosure may be used with practically any apparatus related to optical and electrical devices, optical systems, presentation systems or any apparatus that may contain any type of optical system. Accordingly, embodiments of the present disclosure may be employed in optical systems, devices used in visual and/or optical presentations, visual peripherals and so on and in a number of computing environments.

Before proceeding to the disclosed embodiments in detail, it should be understood that the disclosure is not limited in its application or creation to the details of the particular arrangements shown, because the disclosure is capable of other embodiments. Moreover, aspects of the disclosure may be set forth in different combinations and arrangements to define embodiments unique in their own right. Also, the terminology used herein is for the purpose of description and not of limitation.

These and other advantages and features of the present disclosure will become apparent to those of ordinary skill in the art upon reading this disclosure in its entirety.

BRIEF DESCRIPTION OF THE DRAWINGS

Embodiments are illustrated by way of example in the accompanying FIGURES, in which like reference numbers indicate similar parts, and in which.

DETAILED DESCRIPTION

Figure 1A:
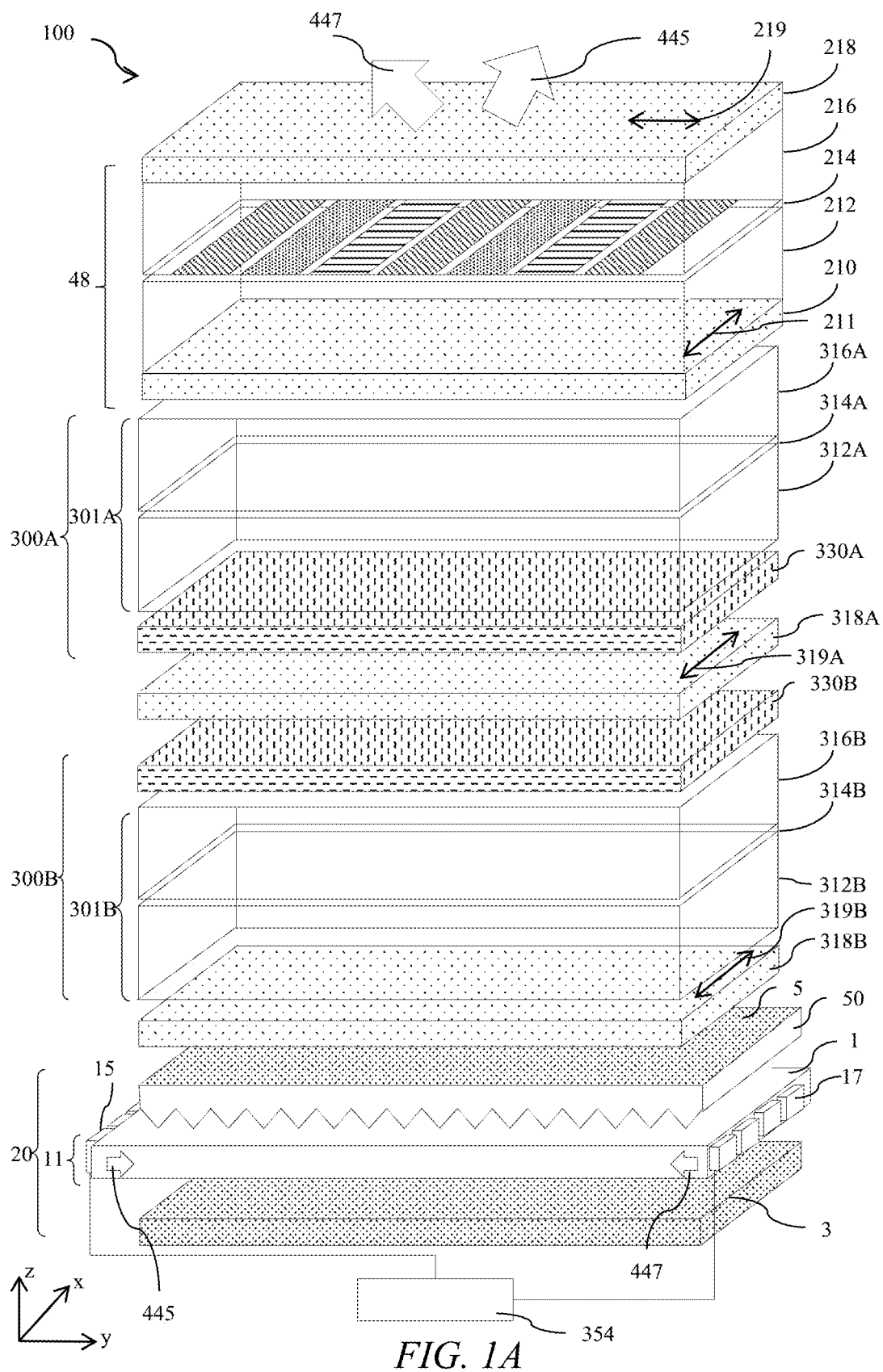
FIG. 1A is a schematic diagram illustrating a front perspective view of a switchable privacy display comprising a transmissive spatial light modulator.

Terms related to optical retarders for the purposes of the present disclosure will now be described.

In a layer comprising a uniaxial birefringent material there is a direction governing the optical anisotropy whereas all directions perpendicular to it (or at a given angle to it) have equivalent birefringence.

The optical axis of an optical retarder refers to the direction of propagation of a light ray in the uniaxial birefringent material in which no birefringence is experienced. This is different from the optical axis of an optical system which may for example be parallel to a line of symmetry or normal to a display surface along which a principal ray propagates.

For light propagating in a direction orthogonal to the optical axis, the optical axis is the slow axis when linearly polarized light with an electric vector direction parallel to the slow axis travels at the slowest speed. The slow axis direction is the direction with the highest refractive index at the design wavelength. Similarly the fast axis direction is the direction with the lowest refractive index at the design wavelength.

For positive dielectric anisotropy uniaxial birefringent materials the slow axis direction is the extraordinary axis of the birefringent material. For negative dielectric anisotropy uniaxial birefringent materials the fast axis direction is the extraordinary axis of the birefringent material.

The terms half a wavelength and quarter a wavelength refer to the operation of a retarder for a design wavelength $\lambda_0$ that may typically be between 500 nm and 570 nm. In the present illustrative embodiments exemplary retardance values are provided for a wavelength of 550 nm unless otherwise specified.

The retarder provides a phase shift between two perpendicular polarization components of the light wave incident thereon and is characterized by the amount of relative phase, $\Gamma$, that it imparts on the two polarization components; which is related to the birefringence $\Delta n$ and the thickness d of the retarder by $$\Gamma = 2 \cdot \pi \cdot \Delta n \cdot d / \lambda_0 \qquad \text{eqn. 1}$$

In eqn. 1, $\Delta n$ is defined as the difference between the extraordinary and the ordinary index of refraction, i.e.

$$\Delta n = n_e - n_o \qquad \text{eqn. 2}$$

For a half-wave retarder, the relationship between d, $\Delta n$, and $\lambda_0$ is chosen so that the phase shift between polarization components is $\Gamma = \pi$. For a quarter-wave retarder, the relationship between d, $\Delta n$, and $\lambda_0$ is chosen so that the phase shift between polarization components is $\Gamma = \pi/2$.

The term half-wave retarder herein typically refers to light propagating normal to the retarder and normal to the spatial light modulator.

Some aspects of the propagation of light rays through a transparent retarder between a pair of polarisers will now be described.

The state of polarisation (SOP) of a light ray is described by the relative amplitude and phase shift between any two orthogonal polarization components. Transparent retarders do not alter the relative amplitudes of these orthogonal polarisation components but act only on their relative phase. Providing a net phase shift between the orthogonal polarisation components alters the SOP whereas maintaining net relative phase preserves the SOP. In the current description, the SOP may be termed the polarisation state.

A linear SOP has a polarisation component with a non-zero amplitude and an orthogonal polarisation component which has zero amplitude.

A linear polariser transmits a unique linear SOP that has a linear polarisation component parallel to the electric vector transmission direction of the linear polariser and attenuates light with a different SOP.

Absorbing polarisers are polarisers that absorb one polarisation component of incident light and transmit a second orthogonal polarisation component. Examples of absorbing linear polarisers are dichroic polarisers.

Reflective polarisers are polarisers that reflect one polarisation component of incident light and transmit a second orthogonal polarisation component. Examples of reflective polarisers that are linear polarisers are multilayer polymeric film stacks such as DBEF™ or APF™ from 3M Corporation, or wire grid polarisers such as ProFlux™ from Moxtek. Reflective linear polarisers may further comprise cholesteric reflective materials and a quarter waveplate arranged in series.

A retarder arranged between a linear polariser and a parallel linear analysing polariser that introduces no relative net phase shift provides full transmission of the light other than residual absorption within the linear polariser.

A retarder that provides a relative net phase shift between orthogonal polarisation components changes the SOP and provides attenuation at the analysing polariser.

In the present disclosure an 'A-plate' refers to an optical retarder utilizing a layer of birefringent material with its optical axis parallel to the plane of the layer.

A 'positive A-plate' refers to positively birefringent A-plates, i.e. A-plates with a positive $\Delta n$.

In the present disclosure a 'C-plate' refers to an optical retarder utilizing a layer of birefringent material with its optical axis perpendicular to the plane of the layer. A 'positive C-plate' refers to positively birefringent C-plate, i.e. a C-plate with a positive $\Delta n$. A 'negative C-plate' refers to a negatively birefringent C-plate, i.e. a C-plate with a negative $\Delta n$.

'O-plate' refers to an optical retarder utilizing a layer of birefringent material with its optical axis having a component parallel to the plane of the layer and a component perpendicular to the plane of the layer. A 'positive O-plate' refers to positively birefringent O-plates, i.e. O-plates with a positive $\Delta n$.

Achromatic retarders may be provided wherein the material of the retarder is provided with a retardance $\Delta n \cdot d$ that varies with wavelength $\lambda$ as $$\Delta n \cdot d / \lambda = \kappa \qquad \text{eqn. 3}$$

where $\kappa$ is substantially a constant.

Examples of suitable materials include modified polycarbonates from Teijin Films. Achromatic retarders may be provided in the present embodiments to advantageously minimise colour changes between polar angular viewing directions which have low luminance reduction and polar angular viewing directions which have increased luminance reductions as will be described below.

Various other terms used in the present disclosure related to retarders and to liquid crystals will now be described.

A liquid crystal cell has a retardance given by $\Delta n \cdot d$ where $\Delta n$ is the birefringence of the liquid crystal material 414 in the liquid crystal cell and d is the thickness of the liquid crystal cell, independent of the alignment of the liquid crystal material 414 in the liquid crystal cell.

Homogeneous alignment refers to the alignment of liquid crystals in switchable liquid crystal displays where molecules align substantially parallel to a substrate. Homogeneous alignment is sometimes referred to as planar alignment. Homogeneous alignment may typically be provided with a small pre-tilt such as 2 degrees, so that the molecules at the surfaces of the alignment layers of the liquid crystal cell are slightly inclined as will be described below. Pretilt is arranged to minimise degeneracies in switching of cells.

In the present disclosure, homeotropic alignment is the state in which rod-like liquid crystalline molecules align substantially perpendicularly to the substrate. In discotic liquid crystals homeotropic alignment is defined as the state in which an axis of the column structure, which is formed by disc-like liquid crystalline molecules, aligns perpendicularly to a surface. In homeotropic alignment, pretilt is the tilt angle of the molecules that are close to the alignment layer and is typically close to 90 degrees and for example may be 88 degrees.

In a twisted liquid crystal layer, a twisted configuration (also known as a helical structure or helix) of nematic liquid crystal molecules is provided. The twist may be achieved by means of a non-parallel alignment of alignment layers. Further, cholesteric dopants may be added to the liquid crystal material 414 to break degeneracy of the twist direction (clockwise or anti-clockwise) and to further control the pitch of the twist in the relaxed (typically undriven) state. A supertwisted liquid crystal layer has a twist of greater than 180 degrees. A twisted nematic layer used in spatial light modulators typically has a twist of 90 degrees.

Liquid crystal molecules with positive dielectric anisotropy are switched from a homogeneous alignment (such as an A-plate retarder orientation) to a homeotropic alignment (such as a C-plate or O-plate retarder orientation) by means of an applied electric field.

Liquid crystal molecules with negative dielectric anisotropy are switched from a homeotropic alignment (such as a C-plate or O-plate retarder orientation) to a homogeneous alignment (such as an A-plate retarder orientation) by means of an applied electric field.

Rod-like molecules have a positive birefringence so that $n_e > n_o$ as described in eqn. 2. Discotic molecules have negative birefringence so that $n_e < n_o$.

Positive retarders such as A-plates, positive O-plates and positive C-plates may typically be provided by stretched films or rod-like liquid crystal molecules. Negative retarders such as negative C-plates may be provided by stretched films or discotic like liquid crystal molecules.

Parallel liquid crystal cell alignment refers to the alignment direction of homogeneous alignment layers being parallel or more typically antiparallel. In the case of pre-tilted homeotropic alignment, the alignment layers may have components that are substantially parallel or antiparallel. Hybrid aligned liquid crystal cells may have one homogeneous alignment layer and one homeotropic alignment layer. Twisted liquid crystal cells may be provided by alignment layers that do not have parallel alignment, for example oriented at 90 degrees to each other.

Transmissive spatial light modulators may further comprise retarders between the input display polariser and the output display polariser for example as disclosed in U.S. Pat. No. 8,237,876, which is herein incorporated by reference in its entirety. Such retarders (not shown) are in a different place to the passive compensation retarders of the present embodiments. Such retarders compensate for contrast degradations for off-axis viewing locations, which is a different effect to the luminance reduction for off-axis viewing positions of the present embodiments.

Terms related to privacy display appearance will now be described.

A private mode of operation of a display is one in which an observer sees a low contrast sensitivity such that an image is not clearly visible. Contrast sensitivity is a measure of the ability to discern between the luminance of different levels in a static image. Inverse contrast sensitivity may be used as a measure of visual security, in that a high visual security level (VSL) corresponds to low image visibility.

For a privacy display providing an image to an observer, visual security may be given as:

$$VSL = (Y+R)/(Y-K) \qquad \text{eqn. 4}$$

where VSL is the visual security level, Y is the luminance of the white state of the display at a snooper viewing angle, K is the luminance of the black state of the display at the snooper viewing angle and R is the luminance of reflected light from the display.

Panel contrast ratio is given as:

$$C = Y/K \qquad \text{eqn. 5}$$

For high contrast optical LCD modes, the white state transmission remains substantially constant with viewing angle. In the contrast reducing liquid crystal modes of the present embodiments, white state transmission typically reduces as black state transmission increases such that $$Y + K \sim P \cdot L \qquad \text{eqn. 6}$$

The visual security level may then be further given as:

$$VSL = \frac{(C + I \cdot \rho/\pi \cdot (C+1)/(P \cdot L))}{(C-1)} \qquad \text{eqn. 7}$$

where off-axis relative luminance, P is typically defined as the percentage of head-on luminance, L at the snooper angle and the display may have image contrast ratio C and the surface reflectivity is $\rho$.

The off-axis relative luminance, P is sometimes referred to as the privacy level. However, such privacy level P describes relative luminance of a display at a given polar angle compared to head-on luminance, and is not a measure of privacy appearance.

The display may be illuminated by Lambertian ambient illuminance I. Thus, in a perfectly dark environment, a high contrast display has VSL of approximately 1.0. As ambient illuminance increases, the perceived image contrast degrades, VSL increases and a private image is perceived.

For typical liquid crystal displays the panel contrast C is above 100:1 for almost all viewing angles, allowing the visual security level to be approximated to:

$$VSL = 1 + I \cdot \rho/(\pi \cdot P \cdot L) \qquad \text{eqn. 8}$$

The perceptual image security may be determined from the logarithmic response of the eye, such that $$S = \log_{10}(V) \qquad \text{eqn. 9}$$

Desirable limits for S were determined in the following manner. In a first step a privacy display device was provided. Measurements of the variation of privacy level, $P(\theta)$ of the display device with polar viewing angle and variation of reflectivity $\rho(\theta)$ of the display device with polar viewing angle were made using photopic measurement equipment. A light source such as a substantially uniform luminance light box was arranged to provide illumination from an illuminated region that was arranged to illuminate the privacy display device along an incident direction for reflection to a viewer positions at a polar angle of greater than 0° to the normal to the display device. The variation $I(\theta)$ of illuminance of a substantially Lambertian emitting lightbox with polar viewing angle was determined by measuring the variation of recorded reflective luminance with polar viewing angle taking into account the variation of reflectivity $\rho(\theta)$. The measurements of $P(\theta)$, $r(\theta)$ and $I(\theta)$ were used to determine the variation of Security Factor $S(\theta)$ with polar viewing angle along the zero elevation axis.

In a second step a series of high contrast images were provided on the privacy display including (i) small text images with maximum font height 3 mm, (ii) large text images with maximum font height 30 mm and (iii) moving images.

In a third step each observer (with eyesight correction for viewing at 1000 mm where appropriate) viewed each of the images from a distance of 1000 m, and adjusted their polar angle of viewing at zero elevation until image invisibility was achieved for one eye from a position near on the display at or close to the centre-line of the display. The polar location of the observer's eye was recorded. From the relationship S(θ), the security factor at said polar location was determined. The measurement was repeated for the different images, for various display luminance $Y_{max}$, different lightbox illuminance I(q=0), for different background lighting conditions and for different observers.

From the above measurements S<1.0 provides low or no visual security, 1.0≤S<1.5 provides visual security that is dependent on the contrast, spatial frequency and temporal frequency of image content, 1.5≤S<1.8 provides acceptable image invisibility (that is no image contrast is observable) for most images and most observers and S≥1.8 provides full image invisibility, independent of image content for all observers.

In comparison to privacy displays, desirably wide-angle displays are easily observed in standard ambient illuminance conditions. One measure of image visibility is given by the contrast sensitivity such as the Michelson contrast which is given by:

$$M=(I_{max}-I_{min})/(I_{max}+I_{min}) \quad \text{eqn. 10}$$

and so:

$$M=((Y+R)-(K+R))/((Y+R)+(K+R))=(Y-K)/(Y+K+2\cdot R) \quad \text{eqn. 11}$$

Thus the visual security level (VSL), is equivalent (but not identical to) 1/M. In the present discussion, for a given off-axis relative luminance, P the wide-angle image visibility, W is approximated as $$W=1/VSL=1/(1+I\cdot\rho/(\pi\cdot P\cdot L)) \quad \text{eqn. 12}$$

In the present discussion the colour variation Δε of an output colour $(u_w'+\Delta u', v_w'+\Delta v')$ from a desirable white point $(u_w', v_w')$ may be determined by the CIELUV colour difference metric, assuming a typical display spectral illuminant and is given by:

$$\Delta\varepsilon=(\Delta u'^2+\Delta v'^2)^{1/2} \quad \text{eqn. 13}$$

Catadioptric elements employ both refraction and reflection, which may be total internal reflection or reflection from metallised surfaces.

The structure and operation of various directional display devices will now be described. In this description, common elements have common reference numerals. It is noted that the disclosure relating to any element applies to each device in which the same or corresponding element is provided. Accordingly, for brevity such disclosure is not repeated.

A switchable privacy display apparatus will now be described.

Figure 1B:
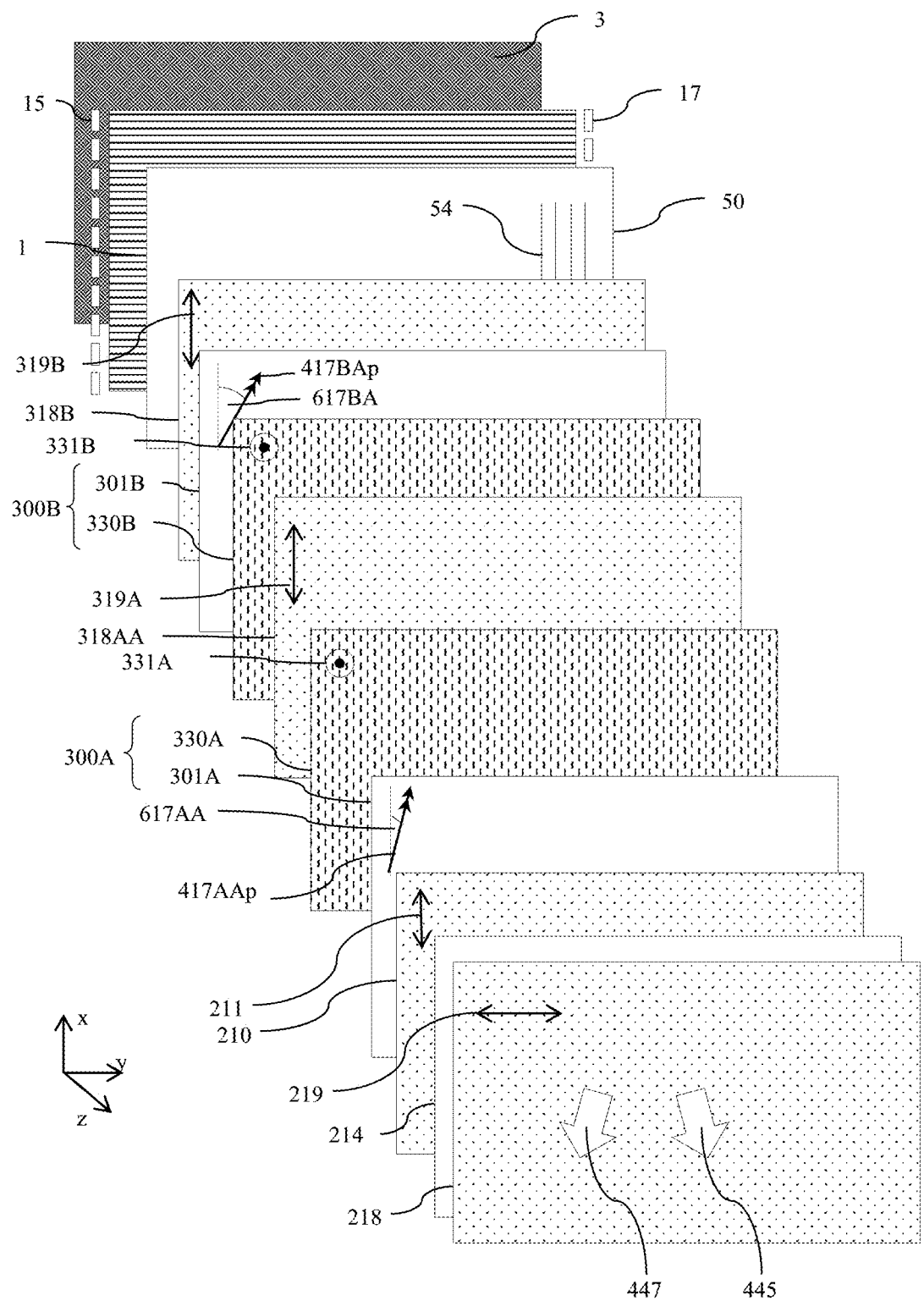
FIG. 1B is a schematic graph illustrating a front perspective view of a stack of optical components in the apparatus of FIG. 1A.

FIG. 1A is a schematic diagram illustrating a front perspective view of a switchable privacy display device 100 comprising a transmissive spatial light modulator 48; and FIG. 1B is a schematic graph illustrating a front perspective view of a stack of optical components in the apparatus of FIG. 1A.

The display apparatus 100 comprises: a backlight apparatus 20; and a spatial light modulator 48 arranged to receive light from the backlight apparatus 20. The spatial light modulator 48 comprises a transmissive spatial light modulator 48 arranged to receive and spatially modulate the output light from the backlight 20.

The spatial light modulator 48 comprises a display output polariser 218, a display input polariser 210 arranged on the input side of the spatial light modulator 48, the display polarisers 210, 218 being linear polarisers. The spatial light modulator 48 may comprise a liquid crystal display comprising substrates 212, 216, and liquid crystal layer 214 having red, green and blue pixels 220, 222, 224. The output display polariser 218 is crossed with the display input polariser 210 and is arranged to provide high extinction ratio for light from the pixels 220, 222, 224 of the spatial light modulator 48. Typical polarisers 210, 218 may be absorbing polarisers such as dichroic polarisers.

An additional polariser 318A is arranged on the same side of the spatial light modulator 48 as the input display polariser 210, the additional polariser 318A being a linear polariser. A polar control retarder 300 arranged between the display input polariser 210 and the additional polariser 318.

The display input polariser 210, the additional polariser 318A and the further additional polariser 318B have electric vector transmission directions 211, 319A, 319B that are parallel with the x-axis and each other. The electric vector transmission direction 219 is set to be parallel to the y-axis to provide high image contrast in the spatial light modulator 48.

The at least one polar control retarder 300A further includes at least one passive compensation retarder 330A. The at least one passive compensation retarder 330 comprises a passive compensation retarder 330A having its optical axis 331A perpendicular to the plane of the retarder 330A, that is the retarder 330A is a negative C-plate.

The display device 100 further comprises a backlight 20 arranged to output light 445, 447, and the spatial light modulator 48 comprises a transmissive spatial light modulator 48 arranged to receive and spatially modulate the output light from the backlight 20.

The display device 100 further comprises: a further additional polariser 318B arranged on the same side of the spatial light modulator 48 as the additional polariser 318A outside the additional polariser 318A, the further additional polariser 318B being a linear polariser having an electric vector transmission direction that is parallel to the electric vector transmission directions 211, 319 of the display polariser 210 and the additional polariser 318A; and at least one further polar control retarder 300B arranged between the additional polariser 318A and the further additional polariser 318B.

The polar control retarders 300A, 300B each include a switchable liquid crystal retarder 301A, 301B comprising a layer 314A, 314B of liquid crystal material 414A, 414B. The materials 414A, 414B may be the same or may be different as will be described further below. Liquid crystal retarders 301 further comprise transparent substrates 312, 316, electrodes and alignment layers as will be described further with respect to FIG. 5B.

The backlight 20 comprises: at least one first light source 15 arranged to provide input light 445 (plural first light sources 15 being shown by way of non-limitative example); at least one second light source 17 (plural second light sources 17 being shown by way of non-limitative example) arranged to provide input light 447 in an opposite direction from the at least one first light source 15.

A waveguide arrangement 11 is arranged to receive the input light 445, 447 from the first light source 15 and the second light source 17 and to cause light from the first light source 15 and the second light source 17 to exit from the waveguide arrangement 11 by breaking total internal reflection. The light sources 15, 17 each comprise an array of light sources such as an array of LEDs. The backlight apparatus 20 further comprises a light source control system 354 arranged to control the at least one first light source 15 and the at least one second light source 17 independently.

The backlight apparatus 20 further comprises a rear reflector 3 arranged to receive light exiting from the surfaces 6,8 of waveguide 1 and direct it back through the waveguide 1 as will be described hereinbelow.

The backlight apparatus 20 further comprises an optical turning film component 50 arranged to receive extracted light from the waveguide 1, the operation of which will be further described hereinbelow.

Optical stack 5 may comprise diffusers, reflective polarisers and other known optical backlight structures. Asymmetric diffusers, that may comprise asymmetric surface relief features for example, may be provided in the optical stack 5 with increased diffusion in the elevation direction in comparison to the lateral direction may be provided. Advantageously image uniformity may be increased.

Considering FIG. 1B, the orientation of various optical axes and electric vector transmission directions is disclosed. Liquid crystal retarders 301A, 301B have pretilt directions with components 417AAp, 417BAp in the plane of the layers 314A, 314B of liquid crystal material 414A, 414B that are at acute non-zero angles 617A, 617B to the electric vector transmission directions 211, 319A, 319B of the display device polariser 210 and the additional polarisers 318A, 318B. More generally, at least one of the alignment layers 419A, 419B may have a pretilt direction with components 417AAp, 417BAp in the plane of the layer 314 of liquid crystal material 414 that are at non-zero acute angles 617AA, 617BA to at least one of the electric vector transmission directions 211, 319A, 319B of the display device polariser 218 and the additional polarisers 318A, 318B.

Herein, references to components of pre-tilt directions being at an "acute non-zero angle" to electric vector transmission directions of polarisers are references to an angle as viewed normal to the plane in which the component is defined. This may equally be considered as the angle between the component of the pre-tilt direction and the projection of the electric vector transmission direction onto the plane in which the component is defined, for example as shown in FIG. 1B and corresponding drawings.

The structure of the liquid crystal retarders 301A, 301B will be considered further with respect to FIGS. 5A-B hereinbelow.

The structure of an alternative polar control retarder, and control of polar control retarders will now be further described.

Figure 2A:
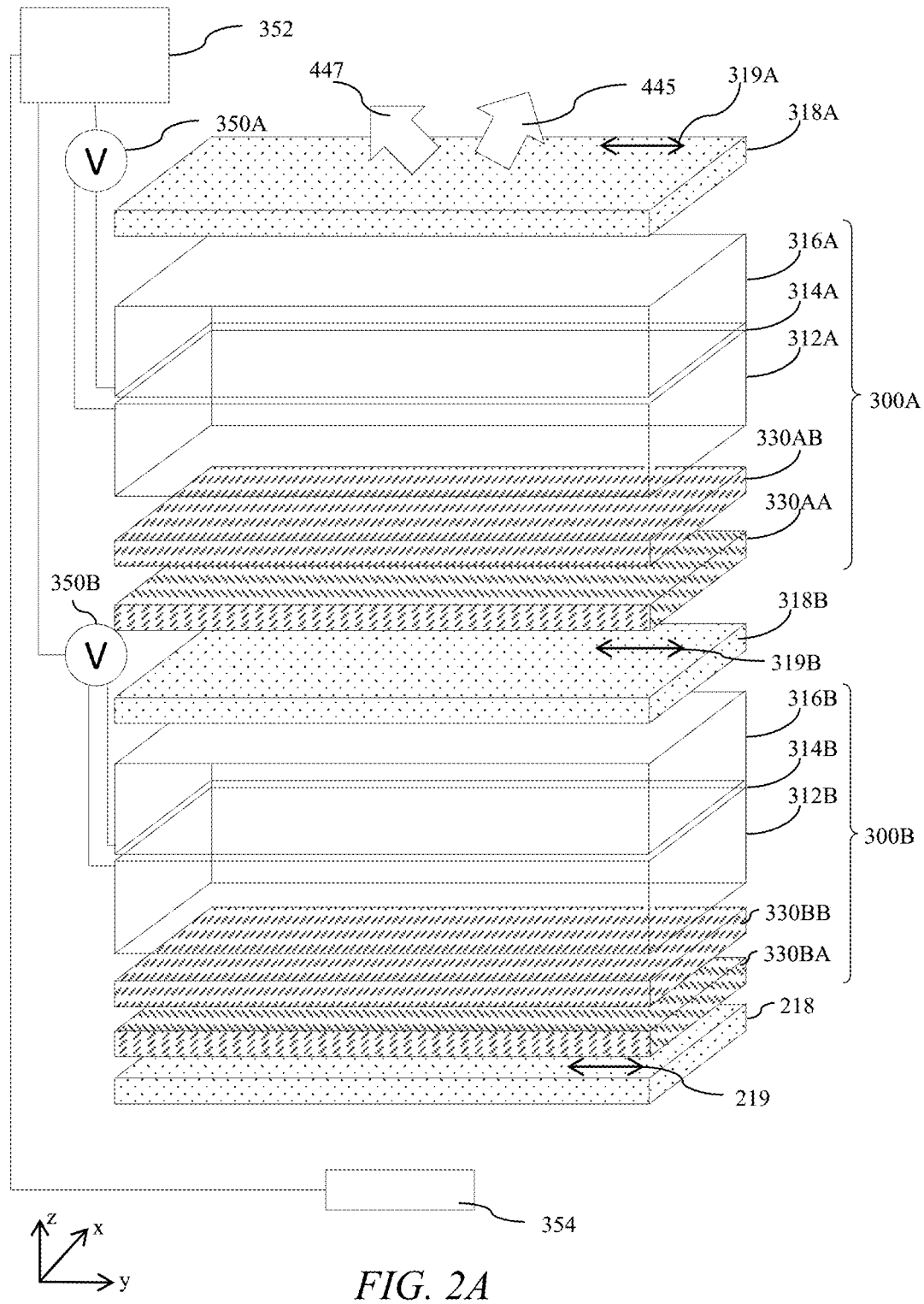
FIG. 2A is a schematic diagram illustrating a front perspective view of an alternative optical stack for a switchable privacy display.
Figure 2B:
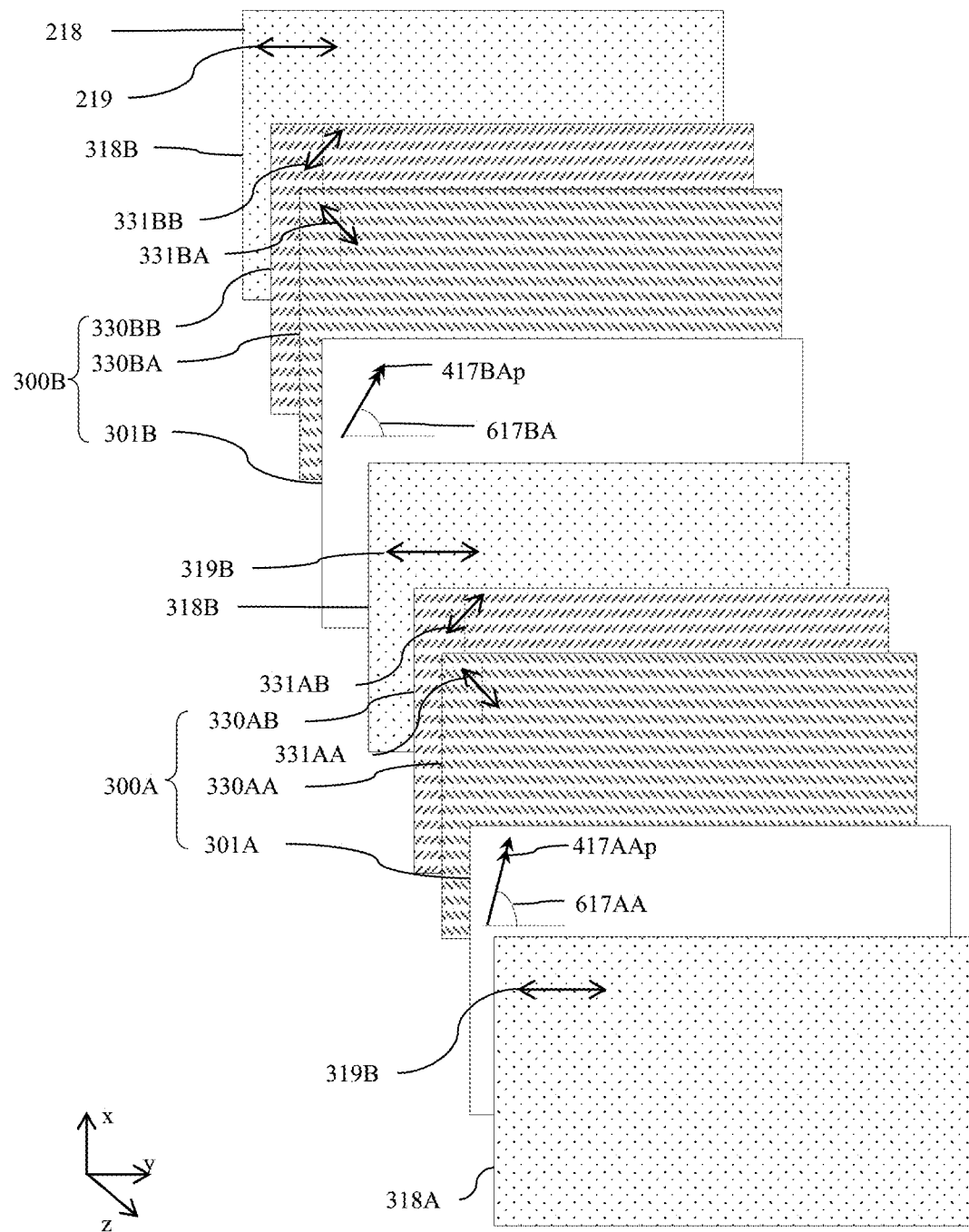
FIG. 2B is a schematic graph illustrating a front perspective view of a stack of optical components in the apparatus of FIG. 2A.

FIG. 2A is a schematic diagram illustrating a front perspective view of an alternative optical stack for a switchable privacy display device 100; and FIG. 2B is a schematic graph illustrating a front perspective view of a stack of optical components in the apparatus of FIG. 2A. Features of the embodiment of FIGS. 2A-B not discussed in further detail may be assumed to correspond to the features with equivalent reference numerals as discussed above, including any potential variations in the features.

For purposes of explanation, FIG. 2A illustrates the output polariser 218 of a spatial light modulator 48. Backlight 20 and transmissive spatial light modulator 48 may be arranged on the input side of polariser 218.

In comparison to the arrangement of FIGS. 1A-B in the alternative embodiment of FIGS. 2A-B the polar control retarders 300A, 300B are arranged on the output side of the spatial light modulator 48. The display device 100 thus further comprises: an output display polariser 218 arranged on the output side of the spatial light modulator 48; a further additional polariser 318B arranged on the output side of the spatial light modulator 48, the further additional polariser 318B being a linear polariser having an electric vector transmission direction that is parallel to the electric vector transmission directions 219, 319 of the display polariser 218 and the additional polariser 318A; and at least one further polar control retarder 300 arranged between the further additional polariser 318B and the output display polariser 218.

Advantageously the arrangement of FIG. 2A, may be retrofitted by a display user or during manufacture on the output side of a spatial light modulator 48. Further, such an arrangement may be provided for use with an emissive spatial light modulator in a similar manner to that illustrated in FIG. 3 hereinbelow.

FIGS. 2A-B further illustrates an alternative embodiment to the negative C-plate passive control retarders 330A, 330B of FIGS. 1A-B wherein the at least one passive compensation retarder 330 comprises a pair of passive compensation retarders 330A, 330B which have optical axes 331A, 331B in the plane of the retarders 330A, 330B that are crossed. The angle between the optical axes 331A, 331B is bisected by the electric vector transmission direction 211, 219, 319 of the display polariser 210, 218 and additional polariser 318 which are parallel in this example. More generally the angle between the optical axes 331A, 331B is bisected by the electric vector transmission direction 211, 219, 319 of at least one of the display polariser 210, 218 and additional polariser 318 respectively. The passive A-plate retarders 330AA, 330AB, 330BA, 330BB of FIG. 2C may advantageously be easier to manufacture in large area at lower cost than the C-plate retarders of FIGS. 1A-B.

FIGS. 2A-B further illustrate that the electric vector transmission directions 219, 319A, 319B of the polarisers 219, 318A, 318B are rotated by 90 degrees with respect to those illustrated in FIGS. 1A-B. Liquid crystal retarders 301A, 301B have pretilt directions with a component 417AAp, 417BAp in the plane of the layers 314A, 314B of liquid crystal material 414A, 414B that are in the same direction as illustrated in FIGS. 1A-B, and so are at acute non-zero angles 617AA, 617BA to the electric vector transmission directions 219, 319A, 319B of the display device polariser 218 and the additional polarisers 318A, 318B that are complementary to the corresponding angles in FIGS. 1A-B. The operation of the display 100 is substantially not affected by such a 90 degree rotation of the electric vector transmission directions 219, 319A, 319B of the polarisers 219, 318A, 318B.

FIGS. 2A-B further illustrates that the display 100 including that of FIG. 1A may further comprise a control system arranged to control the polar control retarders 300A, 300B by means of drivers 350A, 350B to change the operating voltage across the liquid crystal layers 314A, 314B respectively. Controller 352 is provided to control the drivers 350A, 350B and further control the light source controller 354 of FIG. 1A.

As will be described further below, the display device 100 is arranged to display an image and capable of operating in at least a public mode (for two or more users), a privacy single user mode, and a low stray light single user mode. In the privacy mode the privacy function is provided and the visibility of the image to an off-axis viewer is reduced compared to the public mode and the visibility of the image to the primary user in an off-axis position remains visible in both the privacy and public modes. The control system 350, 352, 354 selectively operates the display device 100 in the public mode, the privacy mode or the low stray light mode for at least one region of the displayed image, typically the entire displayed image. Such display device may be used in applications such as but not limited to switchable privacy displays such as laptops, monitors, TV, cell phone, tablets, wearable displays, ATM displays and automotive displays.

Figure 2C:
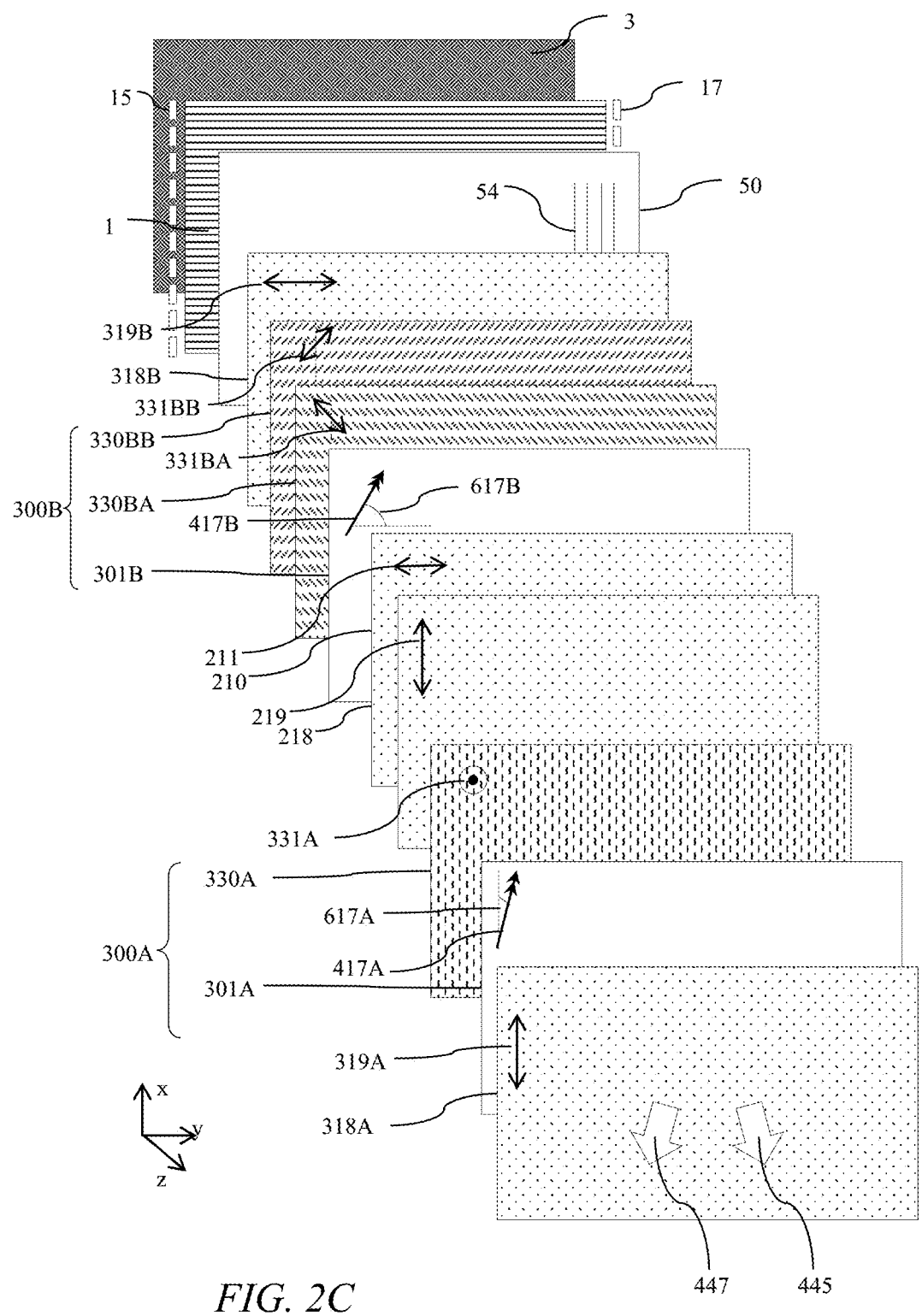
FIG. 2C is a schematic diagram illustrating a front perspective view of an alternative stack of optical components for a switchable privacy display.

FIG. 2C is a schematic diagram illustrating a front perspective view of an alternative stack of optical components for a switchable privacy display device 100. Features of the embodiment of FIG. 2C not discussed in further detail may be assumed to correspond to the features with equivalent reference numerals as discussed above, including any potential variations in the features.

The alternative arrangement of FIG. 2C differs from the arrangement of FIGS. 1A-B and FIG. 2A. In a first respect, the first polar control retarder 300A comprises a liquid crystal polar control retarder 301A and C-plate 330A and the second polar control retarder 300B comprises a liquid crystal polar control retarder 301B and crossed A-plates 330BA, 330BB. Advantageously increased off-axis control of display output may be achieved by selection of different polar control retarders 300A, 300B. In construction, additional air gaps may be provided behind the spatial light modulator 48 while maintaining image contrast, increasing assembly yield and reducing cost.

In another respect, the first polar control retarder 300A is arranged on the output side of the output polariser 218 and the second polar control retarder 300B is arranged on the input side of the input polariser 210. Advantageously the efficiency of light extraction from the backlight 20 may be increased.

An emissive display structure will now be described.

Figure 3:
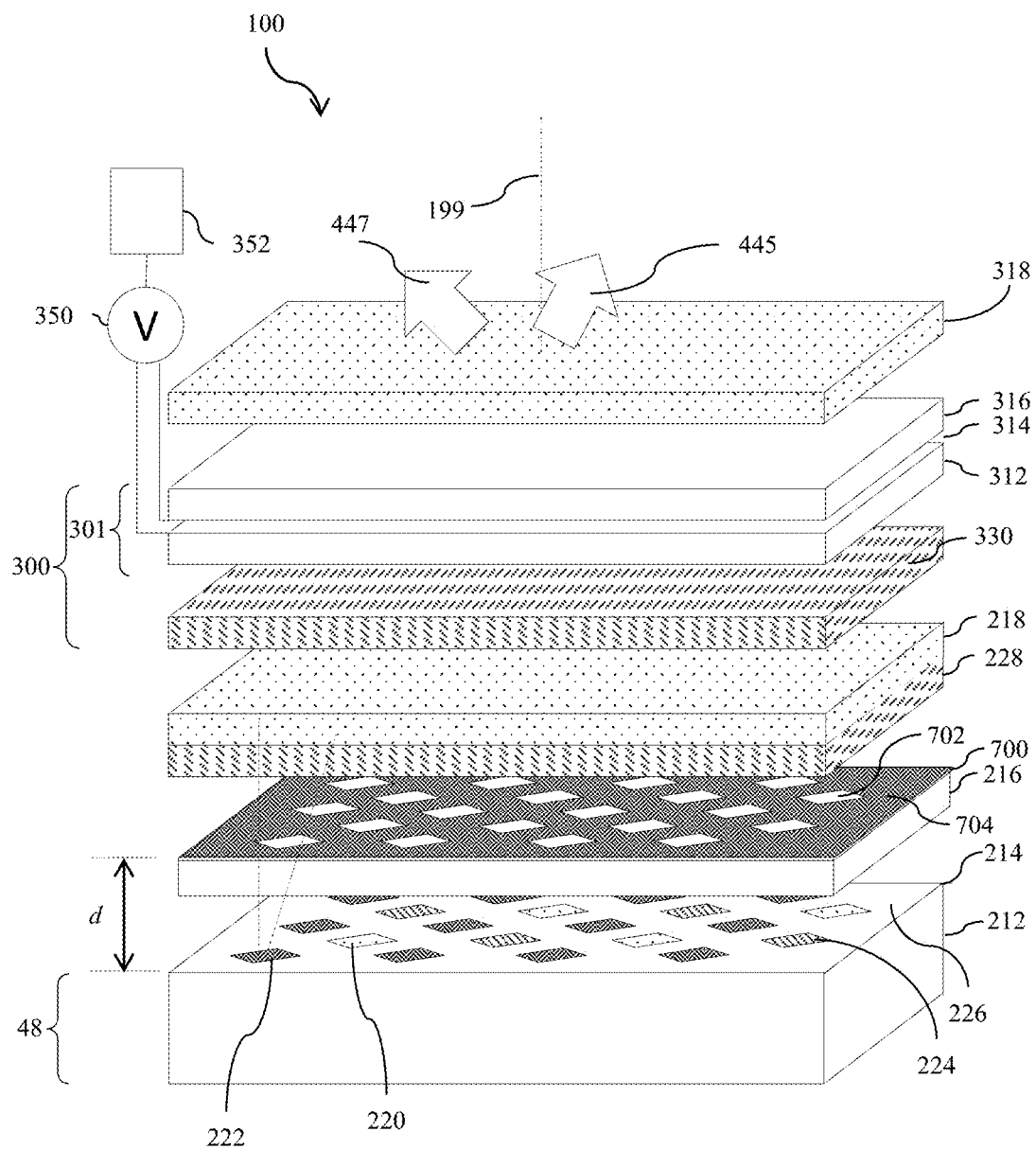
FIG. 3 is a schematic diagram illustrating a front perspective view of a switchable privacy display comprising an emissive spatial light modulator.

FIG. 3 is a schematic diagram illustrating a front perspective view of a switchable privacy display device 100 comprising an emissive spatial light modulator 48. Features of the embodiment of FIG. 3 not discussed in further detail may be assumed to correspond to the features with equivalent reference numerals as discussed above, including any potential variations in the features.

The spatial light modulator 48 comprises an emissive spatial light modulator 48 arranged to emit the spatially modulated light. Emissive display 100 may further comprise a quarter waveplate 228 and display output polariser 218 that is arranged to reduce frontal reflections from the pixel plane 214 of the emissive display 100. Said display polariser is the output display polariser 2218 arranged on the output side of the spatial light modulator 48.

The embodiment of FIG. 3 illustrates a single polar control retarder 300. Alternatively, two polar control retarders 300A, 300B and further additional polariser 318B such as illustrated in FIG. 2A may be provided.

The emissive display 100 further comprises a parallax barrier 700 comprising light absorbing regions 704 and light transmitting aperture regions 702. The operation of the parallax barrier 700 in the present embodiments will be further described with reference to FIG. 33 hereinbelow.

The operation of the display 100 in an automotive vehicle will now be described.

Figure 4A:
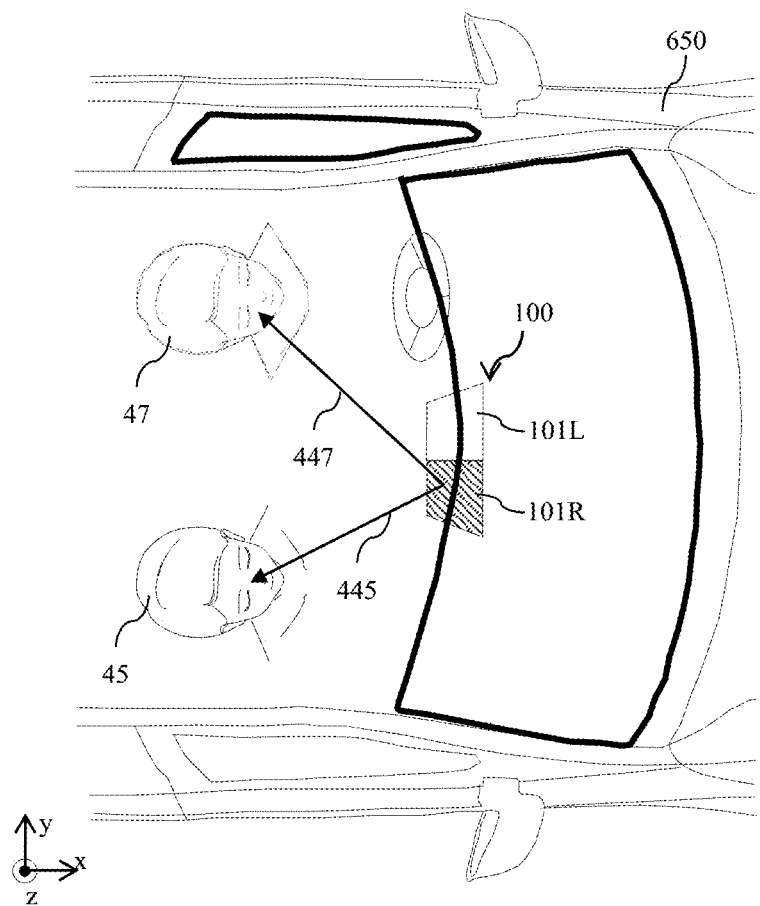
FIG. 4A is a schematic diagram illustrating a top view of a privacy display in an automotive vehicle.
Figure 4B:
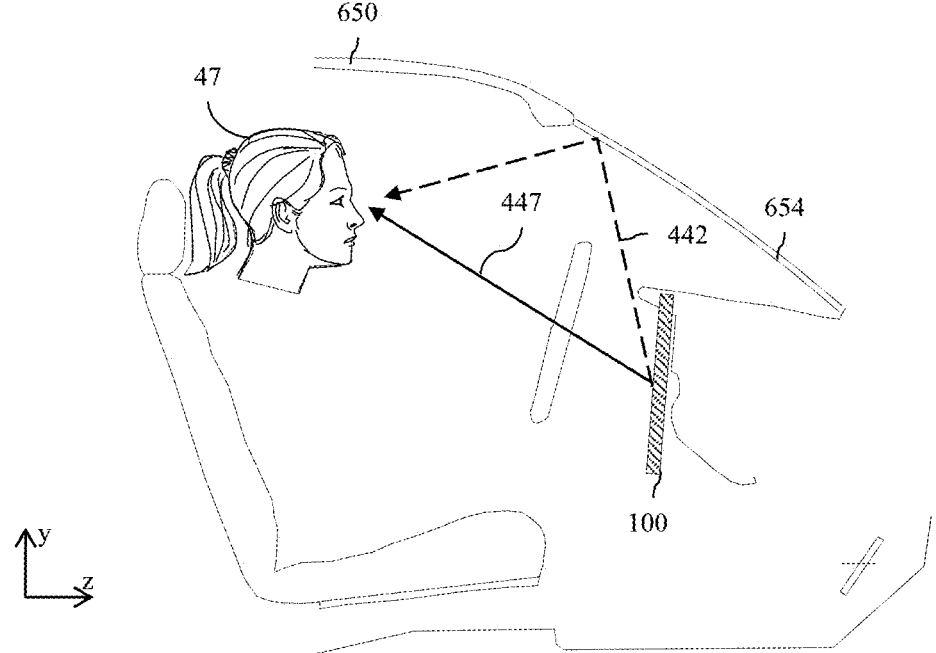
FIG. 4B is a schematic diagram illustrating a side view of a switchable illumination apparatus with different solid angles in first and second lobe directions.

FIG. 4A is a schematic diagram illustrating a top view of a privacy display device 100 in an automotive vehicle 650; and FIG. 4B is a schematic diagram illustrating a side view of a privacy display device 100 in an automotive vehicle 650.

Display 100 is arranged in a centre stack display (CSD) location, that is between two occupant users 45, 47 that may be the front passenger and driver respectively. Light 445, 447 may be output to the user 45 and user 47 respectively. Display 100 illustrates an alternative embodiment comprising a first part 101L that may provide images to both passenger 45 and driver 47 and a second part 101R that comprises a switchable off-axis privacy display as described elsewhere herein.

It may be desirable in a public mode to provide an image to both users 45, 47.

In a privacy mode it may be desirable to provide an image to the passenger 45 that is invisible to the driver 47. Advantageously the passenger may view entertainment information without distraction to the driver.

In a low stray light mode, it may be desirable to provide an image to the driver with desirable luminance while reducing the luminance to the passenger. Advantageously the brightness of internal surfaces of the vehicle may be reduced during night time operation, reducing driver distraction. Further, larger area displays may be provided with desirably low cabin internal illumination.

Further it may be desirable to provide low levels of stray light 442 directed to windows 654 of the vehicle, to reduce the visibility of reflected image data.

The structure of polar control retarders 300 for off-axis illumination control will now be described.

Figure 5A:
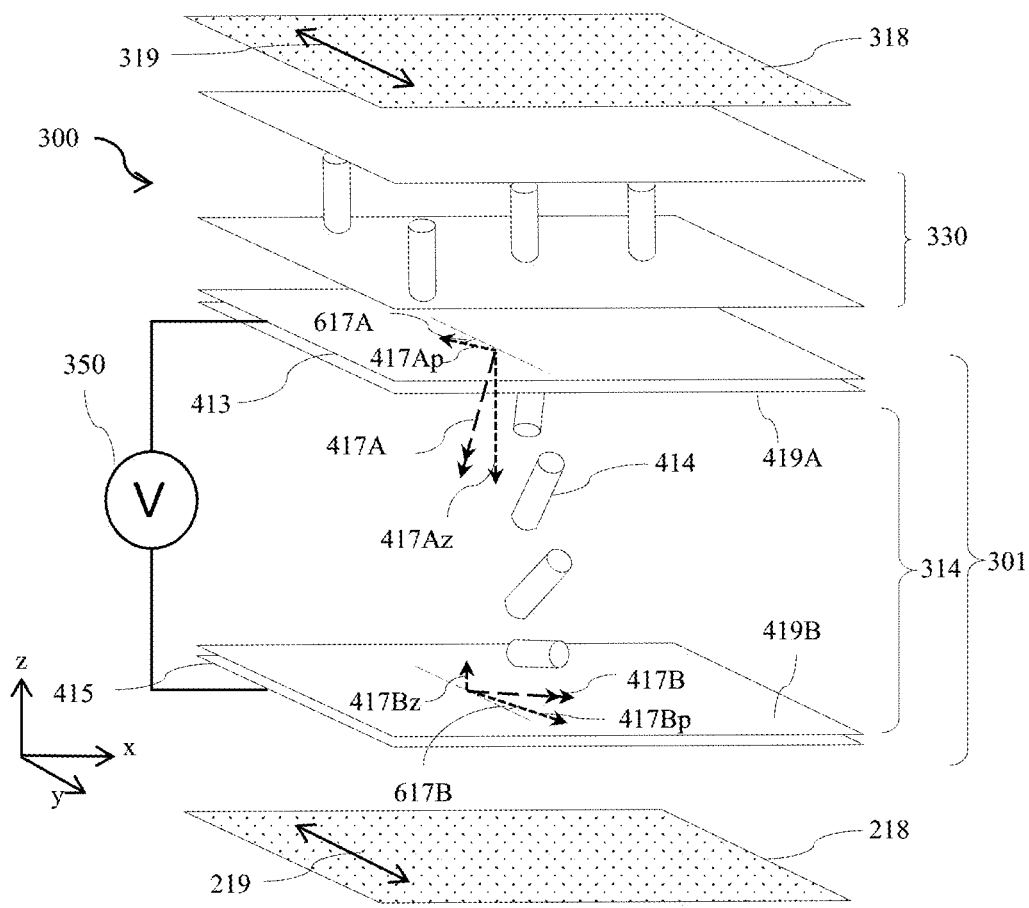
FIG. 5A is a schematic diagram illustrating a front perspective view of a polar control retarder comprising a liquid crystal retarder with alignment layers having pretilt directions with components in the plane of the layer of liquid crystal material that is at an acute non-zero angle to the electric vector transmission directions of the display polariser and the additional polariser.

FIG. 5A is a schematic diagram illustrating a front perspective view of a polar control retarder 300 comprising a liquid crystal retarder 301 with alignment layers 419A, 419B having pretilt directions 417 with components 417Ap, 417Bp in the plane of the layer 314 of liquid crystal material 414 that is at acute non-zero angles 617A, 617B to the electric vector transmission directions 219, 319 of the display device polariser 218 and the additional polariser 318 which are parallel in this example. More generally, at least one of the alignment layers 419A, 419B may have pretilt directions 417 with components 417Ap, 417Bp in the plane of the layer 314 of liquid crystal material 414 that are at acute non-zero angles 617A, 617B to at least one of the electric vector transmission directions 219, 319 of the display device polariser 218 and the additional polariser 318. In this example, the acute non-zero angles 617A, 617B are present across the entirety of the display device 100. This is also the case in all embodiments where not otherwise specified. However, more generally the acute non-zero angles 617A, 617B are present across any part of the display device 100, in which case the technical effects described below are achieved for that part.

Figure 5B:
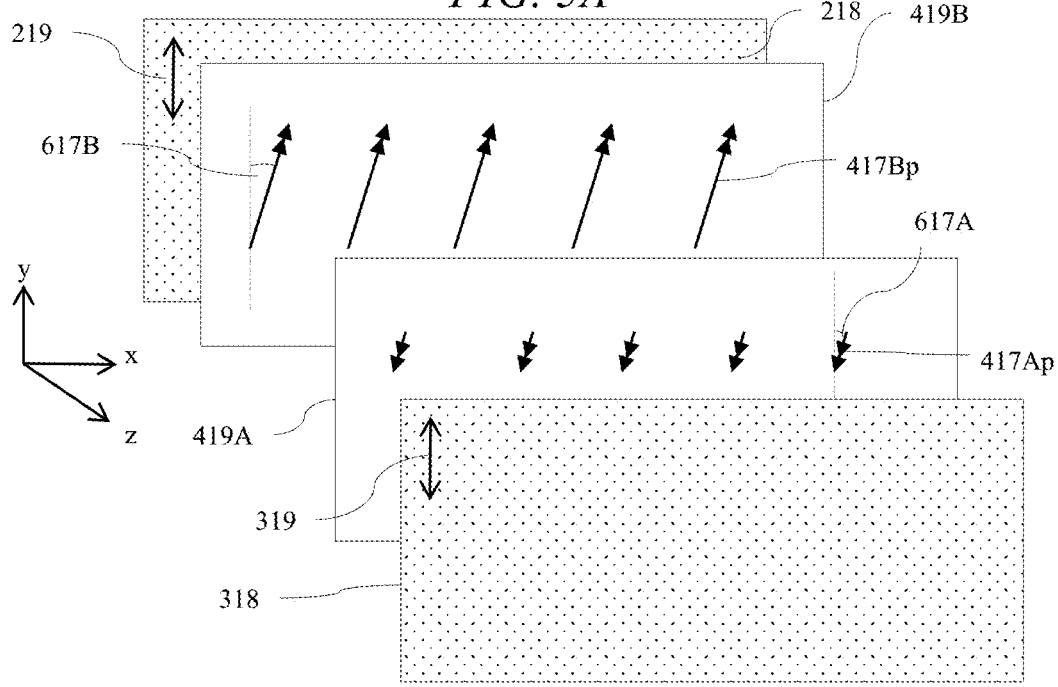
FIG. 5B is a schematic diagram illustrating a front view of alignment layers having a pretilt direction with components in the plane of the layer of liquid crystal material that are at acute non-zero angles to the electric vector transmission directions of the display polariser and the additional polariser.

FIG. 5B is a schematic diagram illustrating a front view of one alignment layer 419B having a pretilt direction 417B with a component 417Bp in the plane of the layer 314 of liquid crystal material 414 that is at an acute non-zero angle 617B to the electric vector transmission directions 219 of the display device polariser 218 and the additional polariser 318.

Features of the embodiment of FIGS. 5A-B not discussed in further detail may be assumed to correspond to the features with equivalent reference numerals as discussed above, including any potential variations in the features.

The at least one polar control retarder 300 comprises: a switchable liquid crystal retarder 301 comprising a layer 314 of liquid crystal material 414. Electrodes 413, 415 are arranged on the substrates 312, 316 (as illustrated in FIG. 1A) and driver 350 is arranged to provide a voltage across the layer 314 in at least one mode of operation.

Two surface alignment layers 419A, 419B are disposed adjacent to the layer 314 of liquid crystal material 414 and on opposite sides thereof, wherein each of the surface alignment layers 419A, 419B has a pretilt having a pretilt direction 417 with a component 417Ap, 417Bp in the plane of the layer 314 of liquid crystal material 414 that are at acute non-zero angles 617A, 617B to the electric vector transmission directions 211, 219, 319 of the display polariser 210, 218 and the additional polariser 318.

The switchable liquid crystal retarder 301 further comprises two surface alignment layers 419A, 419B disposed adjacent to the layer 314 of liquid crystal material 414 and on opposite sides thereof, wherein the surface alignment layers 419A, 419B each have a pretilt having a pretilt direction 417 with a component 417Ap, 417Bp in the plane of the layer 314 of liquid crystal material 414 that is at a non-zero angle 617 to the electric vector transmission directions 211, 219, 319 of the display polariser 210, 218 and the additional polariser 318.

FIG. 5A illustrates the surface alignment layer 419B is arranged to provide homogeneous alignment in the adjacent liquid crystal material 414, said surface alignment layer 419B having said pretilt having a pretilt direction 417 with a component 417Bp in the plane of the layer 314 of liquid crystal material 414 that is at an acute non-zero angle 617B to the electric vector transmission directions 219, 319 of the display polariser 218 and the additional polariser 318. In other embodiments such as in FIG. 1A the component 417Bp is at an acute non-zero angle 617B to the electric vector transmission directions 211, 319 of the display polariser 210 and the additional polariser 318.

The other of the surface alignment layers 419A is arranged to provide homeotropic alignment in the adjacent liquid crystal material 414. The other of the surface alignment layers 419A has said pretilt having a pretilt direction 417A with a component 417Ap in the plane of the layer 314 of liquid crystal material 414 that is at a non-zero angle 617A to the electric vector transmission directions 211, 319 of the display polariser 218 and the additional polariser 318. Thus each of the surface alignment layers 419A, 419B have pretilts having pretilt directions 417A, 417B with components 417Ap, 417Bp in the plane of the layer 314 of liquid crystal material 414 that are at acute non-zero angles 617A, 617B to the electric vector transmission directions 211, 219, 319 of the display polariser 210, 218 and the additional polariser 318.

FIG. 5B illustrates that the pretilt direction may be the same at all positions across the surface alignment layer 419B so that the surface alignment layers 419A, 419B each have pretilts having pretilt directions 417 with components 417Ap, 417Bp in the plane of the layer 314 of liquid crystal material 414 that are at the same non-zero acute angle 617A, 617B to the electric vector transmission directions 211, 219, 319 of the display polariser 210, 218 and the additional polariser 318.

It may be desirable to reduce cost and complexity of the liquid crystal retarder 301.

Figure 5C:
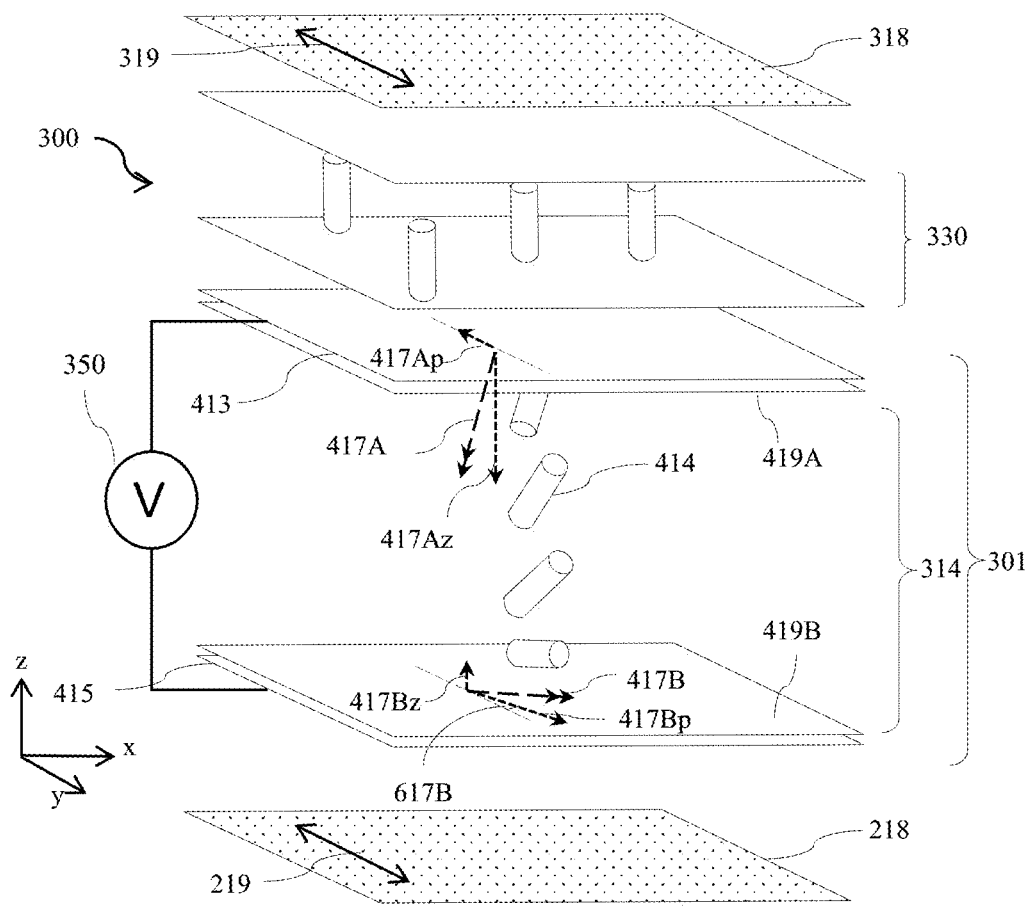
FIG. 5C is a schematic diagram illustrating a front perspective view of a polar control retarder comprising a liquid crystal retarder with a homogeneous alignment layer having a pretilt direction with a component in the plane of the layer of liquid crystal material that is at an acute non-zero angle to the electric vector transmission directions of the display polariser and the additional polariser and a homeotropic alignment layer having pretilt direction with a component in the plane of the layer of liquid crystal material that is at a zero angle to the electric vector transmission directions of the display polariser and the additional polariser.

FIG. 5C is a schematic diagram illustrating a front perspective view of a polar control retarder 300 comprising a liquid crystal retarder 301 with a homogeneous alignment layer 419B having a pretilt direction 417B with a component 417Bp in the plane of the layer of liquid crystal material 414 that is at an acute non-zero angle 617B to the electric vector transmission directions 219, 319 of the display polariser 218 and the additional polariser 318; and a homeotropic alignment layer 419A having a pretilt direction 417A with a component 417Ap in the plane of the layer of liquid crystal material 414 that is parallel to (at a zero angle to) the electric vector transmission directions 219, 319 of the display polariser 218 and the additional polariser 219. As an alternative, the homeotropic alignment layer 419A could a pretilt directions 417A with a component 417Ap in the plane of the layer of liquid crystal material 414 that is orthogonal to the electric vector transmission directions 219, 319 of the display polariser 218 and the additional polariser 219, and in this alternative the operation is not substantially affected.

Figure 5D:
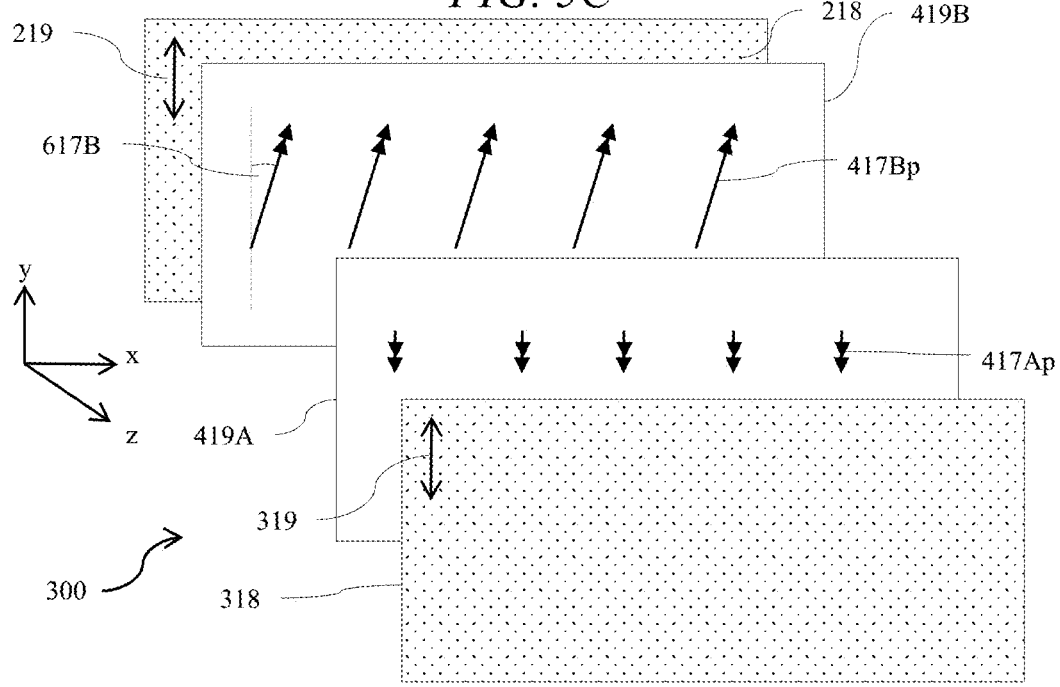
FIG. 5D is a schematic diagram illustrating a front view of a homogeneous alignment layer having a pretilt direction with a component in the plane of the layer of liquid crystal material that is at an acute non-zero angle to the electric vector transmission directions of the display polariser and the additional polariser, and a homeotropic alignment layer having a pretilt direction with a component in the plane of the layer of liquid crystal material that is at an acute zero angle to the electric vector transmission directions of the display polariser and the additional polariser.

FIG. 5D is a schematic diagram illustrating a front perspective view of components of polar control retarder 300 comprising a homogeneous alignment layer 419B having a pretilt direction 417B with a component 417Bp in the plane of the layer of liquid crystal material 414 that is at an acute non-zero angle 617B to the electric vector transmission directions 219, 319 of the display polariser 218 and the additional polariser 318; and a homeotropic alignment layer 419A having a pretilt direction 417A with a component 417Ap in the plane of the layer of liquid crystal material 414 that is aligned with (at a zero angle to) the electric vector transmission directions 219, 319 of the display polariser 218 and the additional polariser 318 respectively.

Figure 29A:
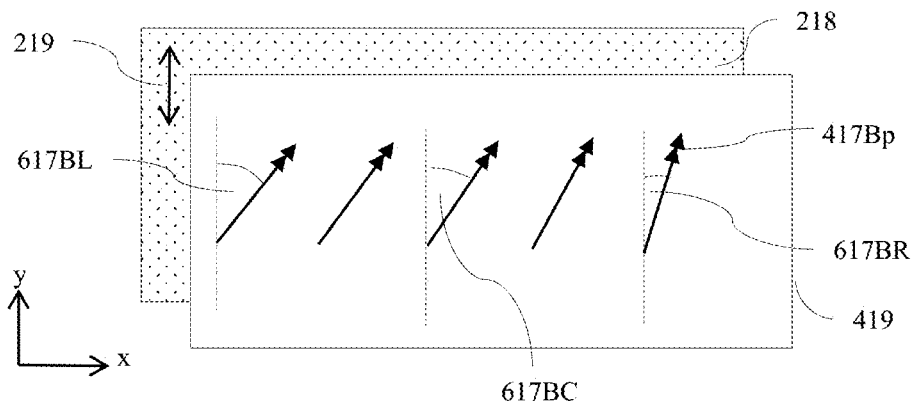
FIG. 29A is a schematic diagram illustrating a front view of an alignment layer having pretilt directions with a component in the plane of the layer of liquid crystal material that is at a non-zero angle to the electric vector transmission directions of the display polariser and the additional polariser and which vary across the plane of the alignment layer.

In comparison to the arrangement of FIG. 5A, the alternative arrangement of FIG. 5C comprises a constant alignment direction that is aligned with the edges of the display. Such an arrangement is more conveniently manufactured with reduced cost. In arrangements wherein the alignment direction changes such as illustrated in FIG. 29A, advantageously the complexity of manufacture of the homeotropic alignment layer 419A is reduced and cost is reduced.

The transmission of light propagating through the structure of FIG. 5A will now be described.

Figure 6A:
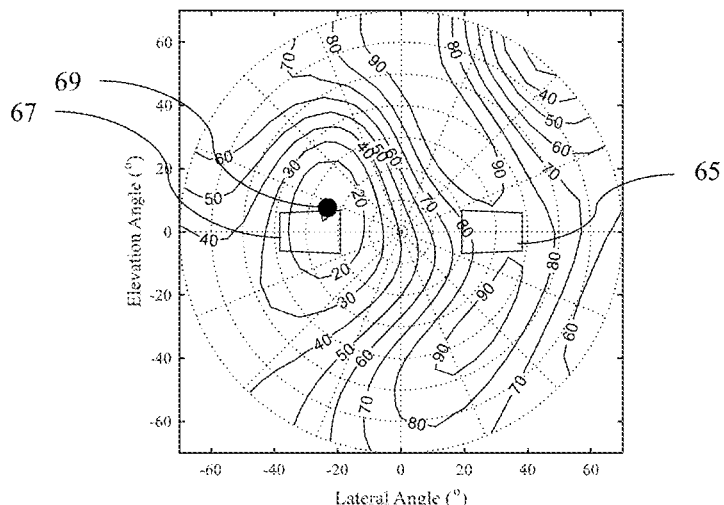
FIG. 6A is a schematic graph illustrating the polar variation of transmission for the polar control retarder of FIG. 5B with first pretilt directions of 30°.
Figure 6B:
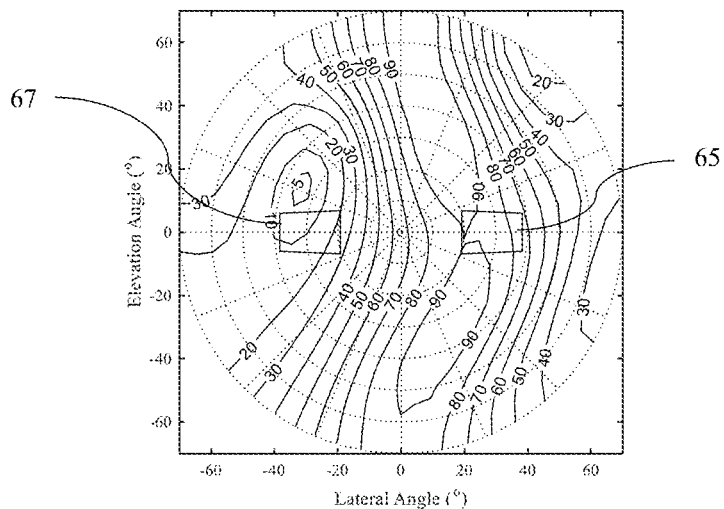
FIG. 6B is a schematic graph illustrating the polar variation of transmission for the polar control retarder of FIG. 5B with second pretilt directions of 20°.
Figure 6C:
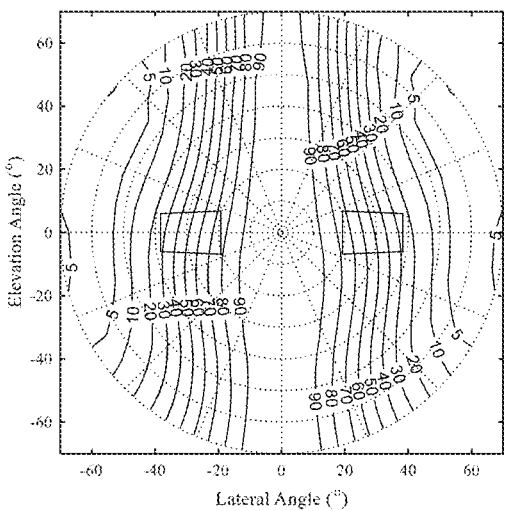
FIG. 6C is a schematic graph illustrating the polar variation of transmission for the polar control retarder of FIG. 5B with second pretilt directions of 0°.

FIG. 6A is a schematic graph illustrating the polar variation of transmission for the polar control retarder 300 of FIG. 5B with first pretilt directions 417 of TABLE 1 when angle 617 is 30° for both alignment layers 419A, 419B; FIG. 6B is a schematic graph illustrating the polar variation of transmission for the polar control retarder 300 of FIG. 5B with second pretilt directions 417 of TABLE 1 when angle 617 is 20° for both alignment layers 419A, 419B; and FIG. 6C is a schematic graph illustrating the polar variation of transmission for the polar control retarder 300 of FIG. 5B with second pretilt directions 417 of TABLE 1 when angle 617 is 0° for both alignment layers 419A, 419B.

TABLE 1

| Layer | Alignment type | LC layer 314 retardance | Additional passive retarder 330 type | Additional passive retarder 330 retardance |
|---|---|---|---|---|
| 419A | Homogeneous | 1250 nm | | |
| 419B | Homeotropic | | | |
| 330 | | | Negative C-plate | −1000 nm |

The polar profiles also illustrate the fields of view 65, 67 of users 45, 47 respectively for a 14" landscape 16:9 aspect ratio display viewed from 700 mm distance in the z-axis and offset by laterally by 400 mm. In a private mode of operation it would be desirable to provide high image visibility to the off-axis user 45 and high image security level to the off-axis user 47. The acute non-zero angles 617 advantageously achieve high transmission is provided to user 45 with field of view 65 and low transmission is provided to user 47 with field of view 67.

By way of comparison with the present embodiments, FIG. 6C illustrates that the transmission when the angle 617 is zero degrees is symmetric about the on-axis direction and both users 45, 47 are provided with an equal reduction in luminance, that is no off-axis asymmetry is achieved. Undesirably such an arrangement does not achieve different privacy properties for the two off-axis users 45, 47.

In the present embodiments there is not a reflective polariser arranged between the output display polariser 210, 218 and the at least one polar control retarder 300. If such a reflective polariser 302 were to be arranged between the output polariser 218 and the polar control retarder 300B of FIG. 2A, then light would be selectively reflected at off-axis angles from the display, depending on the drive conditions of the liquid crystal retarder 301. However, the reflection properties are symmetric and so do not achieve the desirable off-axis reflection properties of the present embodiments.

The elevation location 69 of the transmission minimum may be adjusted by control voltage of operation of the liquid crystal retarder 301. Such location 69 may thus be arranged to provide optimum user locations 47 at non zero elevation locations, and may be adjusted in correspondence to user 47 location, for example by sensing the location of the user 47 and setting the drive voltage by drivers 350A, 350B accordingly. Advantageously increased freedom of user 47 location for optimal privacy performance may be achieved.

Desirable illumination for the off-axis display 100 of FIG. 4A will now be described.

Figure 7A:
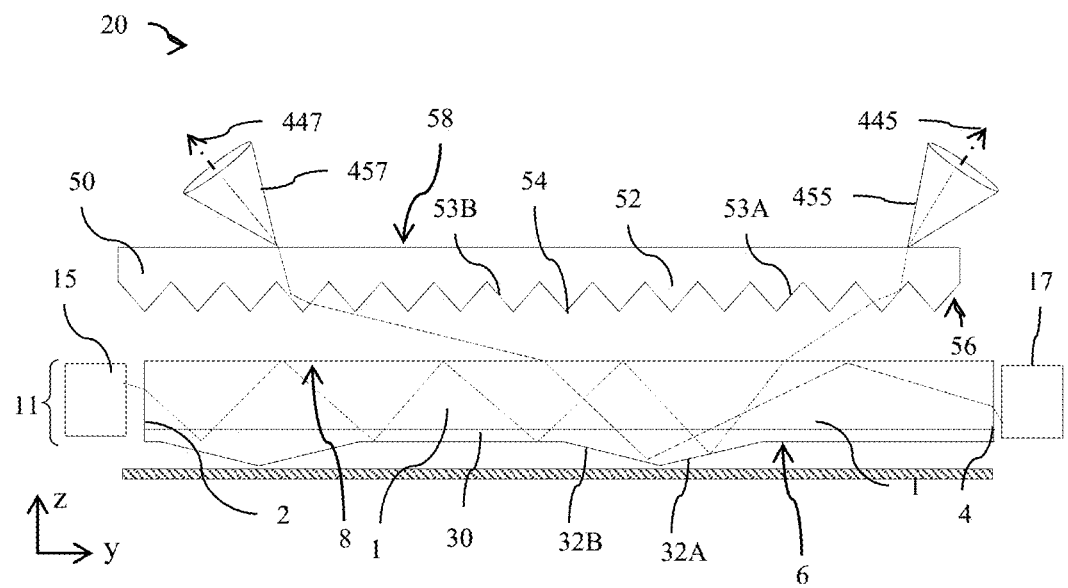
FIG. 7A is a schematic diagram illustrating a side view of a switchable backlight comprising a waveguide arrangement, a rear reflector and an optical turning film and outputting light beams with the same solid angles in first and second lobe directions.
Figure 7B:
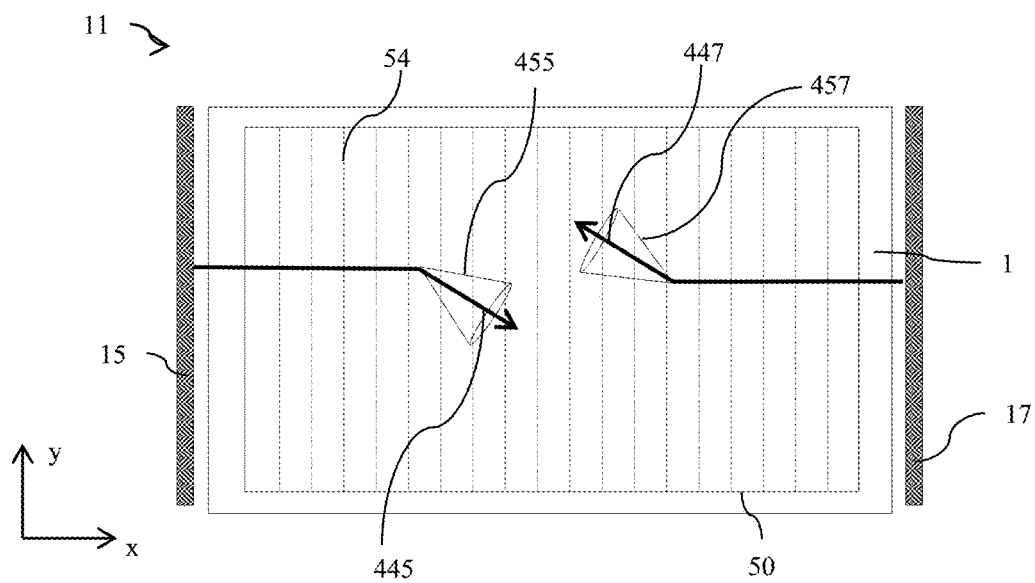
FIG. 7B is a schematic diagram illustrating a front view of a waveguide arrangement.

FIG. 7A is a schematic diagram illustrating a side view of a switchable backlight 20 comprising a waveguide arrangement 11, a rear reflector 3 and an optical turning film component 50 and outputting light beams 445, 447 with the same angular distributions 455, 457 in first and second lobe directions; and FIG. 7B is a schematic diagram illustrating a front view of a waveguide arrangement 11. Features of the embodiments of FIGS. 7A-B not discussed in further detail may be assumed to correspond to the features with equivalent reference numerals as discussed above, including any potential variations in the features.

The waveguide arrangement 11 comprises: a waveguide 1 extending across a plane and comprising: first and second opposed light guiding surfaces 6,8 arranged to guide light along the optical waveguide 1, the second light guiding surface 8 being arranged to guide light by total internal reflection.

First and second input ends 2,4 are arranged between the first and second light guiding surfaces 6,8 and extend in a lateral direction between the first and second light guiding surfaces 6,8.

The at least one first light source 15 is arranged to input light 445 into the waveguide 1 through the first input end 2 and the at least one second light source 17 is arranged to input light 447 into the waveguide 1 through the second input end 4.

The waveguide 1 is arranged to cause light 445, 447 from the at least one first light source 15 and the at least one second light source 17 to exit from the waveguide 1 through one of the first and second light guiding surfaces 6,8 by breaking total internal reflection.

An optical turning film component 50 comprises: an input surface 56 arranged to receive the light exiting from a waveguide 1 through a light guiding surface 6, 8 of the waveguide 1 by breaking total internal reflection, the input surface 56 extending across the plane; and an output surface 58 facing the input surface 56, wherein the input surface comprises an array of elongate prismatic elements 52 comprising ridges 54.

The waveguide 1 is arranged to cause light 445, 447 from the at least one first light source 15 and the at least one second light source 17 to exit from the waveguide 1 with a common angular distribution 455, 457.

The structure of illustrative waveguides for use in the embodiment of FIGS. 7A-B will now be described.

Figure 8A:
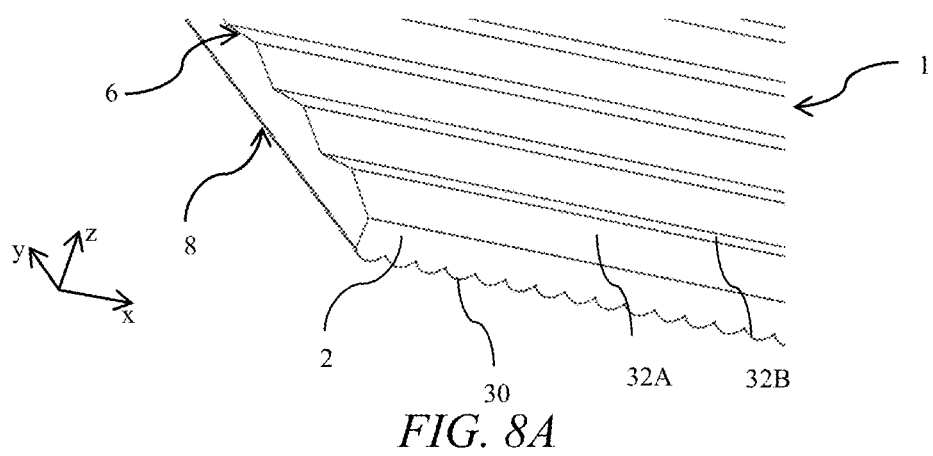
FIG. 8A is a schematic diagram illustrating a front perspective view of an optical waveguide for the waveguide arrangement of FIG. 7A comprising microstructures on first and second sides of the optical waveguide.
Figure 8B:
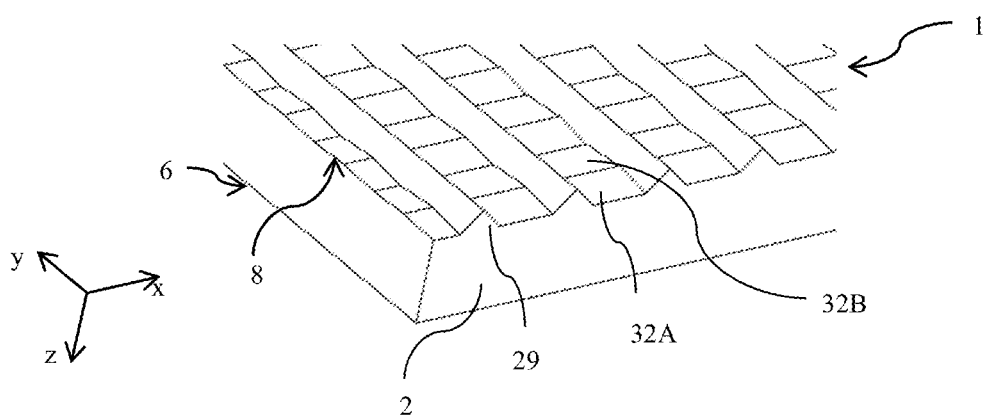
FIG. 8B is a schematic diagram illustrating a front perspective view of an alternative optical waveguide for the waveguide arrangement of FIG. 7A comprising microstructures on the same side of the optical waveguide.

FIG. 8A is a schematic diagram illustrating a front perspective view of an optical waveguide 1 for the waveguide arrangement 11 of FIG. 7A comprising microstructures on first and second sides of the optical waveguide 1; and FIG. 8B is a schematic diagram illustrating a front perspective view of an alternative optical waveguide 1 for the waveguide arrangement 11 of FIG. 7A comprising microstructures on the same side of the optical waveguide 1. Features of the embodiments of FIGS. 8A-B not discussed in further detail may be assumed to correspond to the features with equivalent reference numerals as discussed above, including any potential variations in the features.

Waveguides 1 comprise arrays of inclined facets 32A, 32B that extend along the lateral (x-axis) direction. The waveguide 1 of FIG. 8A comprises lenticular microstructure 30 while waveguide 1 of FIG. 8B comprises prismatic elements 29 that extend orthogonal to the lateral direction. The facets 32 and elements 29, 30 of the waveguides 1 are arranged to adjust the propagation of guiding light 445, 447 within the waveguides 1 so that some light leaks from the waveguide 1 by breaking internal reflection.

Figure 9A:
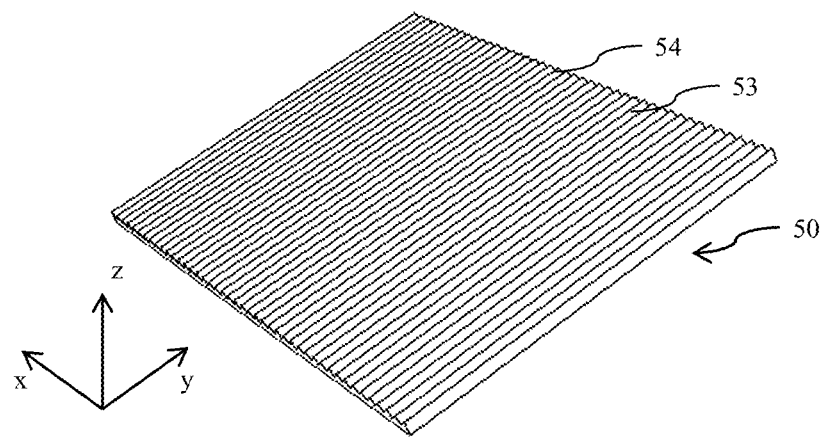
FIG. 9A is a schematic diagram illustrating a front perspective view of an optical turning film component for the backlight of FIG. 7A.

FIG. 9A is a schematic diagram illustrating a front perspective view of an optical turning film component 50 for the backlight 20 of FIG. 7A.

The prismatic elements 52 each comprise a pair of elongate facets 53 defining a ridge 54 therebetween. The ridges 54 extend across the plane parallel to the lateral direction, the ridges 54 being straight. The output surface 58 is planar.

Figure 9B:
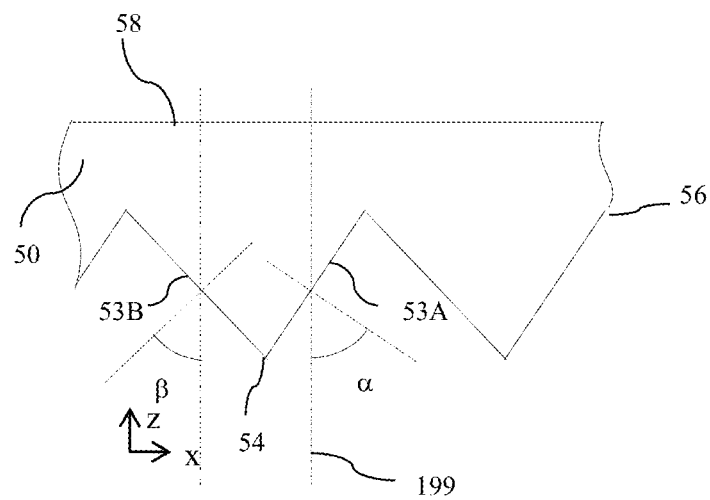
FIG. 9B is a schematic diagram illustrating a side view of an optical turning film component.

FIG. 9B is a schematic diagram illustrating a side view of an optical turning film component 50. In the present embodiments facet angles of respective facets 53, defined between a normal to the facet and a normal to the plane, are between 40° and 70° and preferably between 47.5° and 62.5°. Advantageously desirable locations for off-axis users 45, 47 with high luminance and/or high security factor, S may be provided as will be further described hereinbelow.

The facets 53 on opposite sides of the ridge 54 have facet angles, defined between a normal to the facet and a normal to the plane, that are different. Advantageously light 445, 447 is directed towards different off-axis locations with respective angular distributions 455, 457.

Figure 9C:
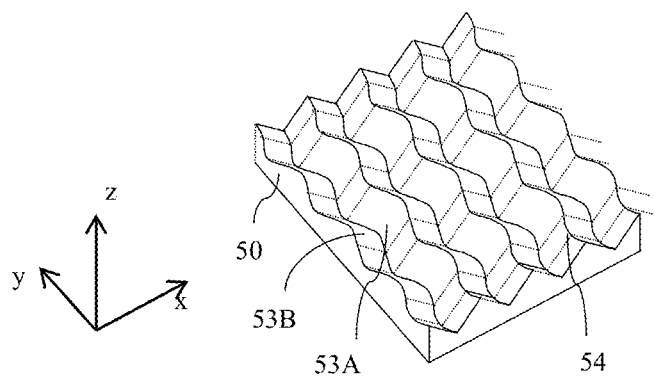
FIG. 9C is a schematic diagram illustrating a front perspective view of an alternative optical turning film component surface for the backlight of FIG. 7A.

FIG. 9C is a schematic diagram illustrating a front perspective view of an alternative optical turning film component 50 surface suitable for the backlight 20 of FIG. 7A.

The ridges 54 and facets 53A, 53B comprise wobble that provide some light diffusion and increase the size of the angular distributions 455, 457. Advantageously display uniformity may be increased. Visibility of artefacts arising from manufacturing defects of waveguide 1 may be reduced, advantageously increasing yield and reducing cost. Visibility of defects from damage in use of waveguide 1 may be reduced, advantageously increasing lifetime.

Figures 10, 11:
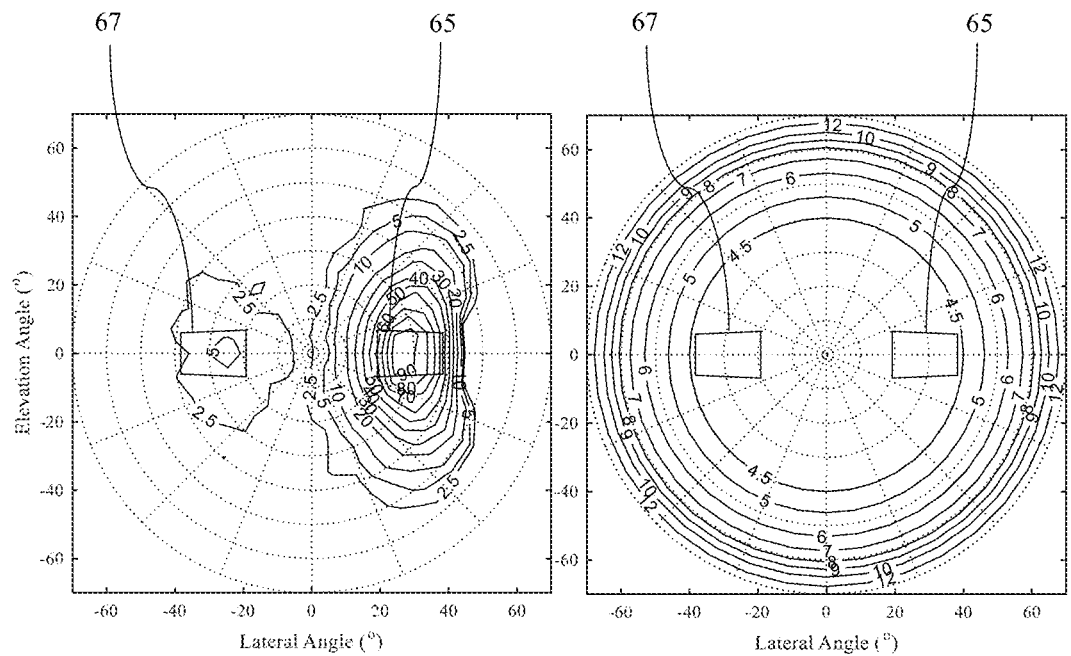
FIG. 10 is a schematic graph illustrating the polar variation of luminance output for the backlight of FIG. 7A operating to direct light to a first user and to provide a private image to a second user.
FIG. 11 is a schematic graph illustrating the polar variation of front surface reflectivity for the display apparatus of FIG. 1A.

FIG. 10 is a schematic graph illustrating the polar variation of luminance output for the backlight 20 of FIG. 7A operating to direct light to a first user 45 and to provide a private image to a second user 47. Such an arrangement is provided by means of light source 15 with no light from light source 17. Advantageously user 45 sees a high luminance image and user 47 sees a low luminance image. Such an arrangement may be used to provide a low stray light image to the passenger 45 for night time operation.

FIG. 11 is a schematic graph illustrating the polar variation of front surface reflectivity for the display device 100 apparatus of FIG. 1A, that arises from Fresnel reflectivity of a single surface in air.

Figure 12:
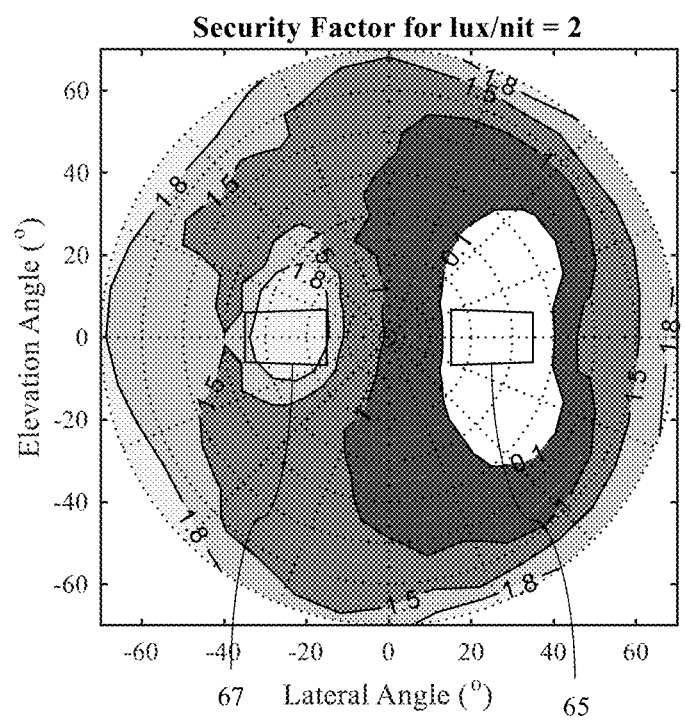
FIG. 12 is a schematic graph illustrating the polar variation of visual security level, S in a privacy mode of operation for the display device of FIG. 1A and backlight luminance profile of FIG. 10 with a display head-on luminance, of value $Y_{max}$ measured in nits that is half of the illuminance of value I measured in lux.

FIG. 12 is a schematic graph illustrating the polar variation of visual security level, S in a privacy mode of operation for the display device 100 of FIG. 1A, backlight 20 luminance profile of FIG. 10, wherein the first polar control retarder 300A comprises the transmission profile of FIG. 6A, and the second polar control retarder 300B has the same prescription as for retarder 300A, however the alignment layers are reflected about a horizontal axis. Advantageously increased symmetry is achieved in the direction orthogonal to the lateral direction (elevation angle direction).

The security factor, S is presented for display device 100 head-on luminance, of value $Y_{max}$ measured in nits that is half of the illuminance of value I measured in lux.

Advantageously the user 45 has a field of view 65 that has a security factor S<0.1, that is high image visibility is achieved across the display 100. Advantageously the user 47 has a field of view 67 that has a security factor S≥1.5 for all image area and S≥1.8 for some of the display area, that is high image security is achieved and at least some images are invisible to the user 47 across the entire display area.

Advantageously an off-axis privacy display is provided for the passenger 45 of a vehicle. The driver 47 may have substantially no visibility of the content of the image data as seen by the passenger, such as entertainment content.

It would be desirable to switch the display 100 so that it can be seen by the driver.

Figures 13A, 13B:
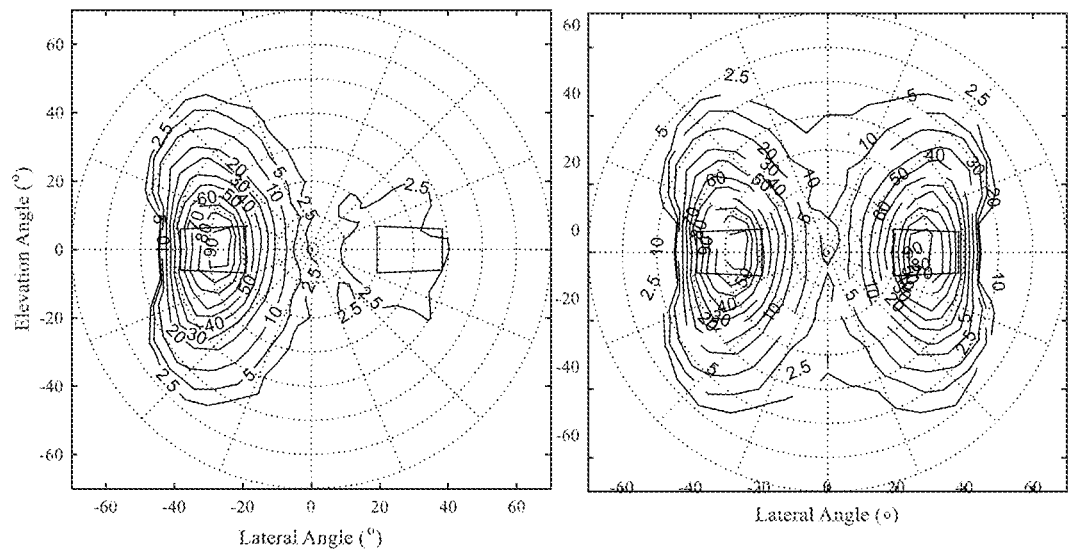
FIGS. 13A-B are schematic graphs illustrating the polar variation of luminance output for the backlight of FIG. 7A operating to direct light to first and second users.

FIGS. 13A-B are schematic graphs illustrating the polar variation of luminance output for the backlight 20 of FIG. 7A operating to direct light to first and second users 45, 47. FIG. 13A illustrates the output from operation of light source 17 only, while FIG. 13B illustrates the output from operation of both light sources 15, 17.

The embodiment of FIG. 13A may be used to achieve a low stray light display while providing desirable illumination to user 47. The embodiment of FIG. 13B may be used to achieve visibility of the display to both users. Such embodiments may be provided with the polar control retarders 300 driven for wide angle operation. In alternative embodiments of the present disclosure the polar control retarders 300 may be omitted.

Figure 14:
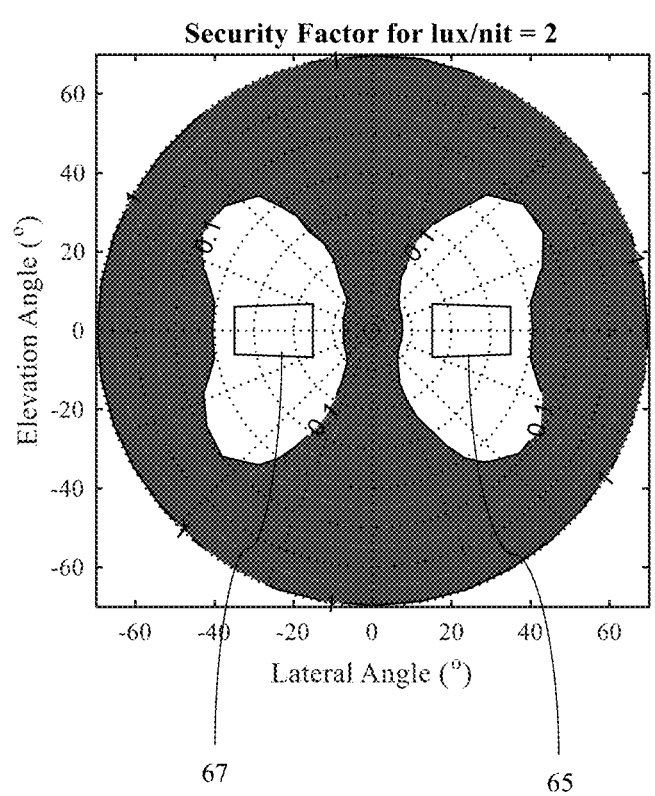
FIG. 14 is a schematic graph illustrating the polar variation of visual security level, S in a dual user mode of operation for the display device of FIG. 1A and backlight luminance profile of FIG. 13B with a display head-on luminance, of value $Y_{max}$ measured in nits that is half of the illuminance of value I measured in lux.

FIG. 14 is a schematic graph illustrating the polar variation of visual security level, S in a dual user mode of operation for the display device 100 of FIG. 1A and backlight 20 luminance profile of FIG. 13B with a display device 100 head-on luminance, of value $Y_{max}$ measured in nits that is half of the illuminance of value I measured in lux wherein the polar control retarders 300A, 300B, 300C are driven for high wide angle transmission. Advantageously high image visibility is achieved over wide polar ranges for users 45, 47.

It may be desirable to provide increased uniformity of luminance across the backlight 20.

Figure 15:
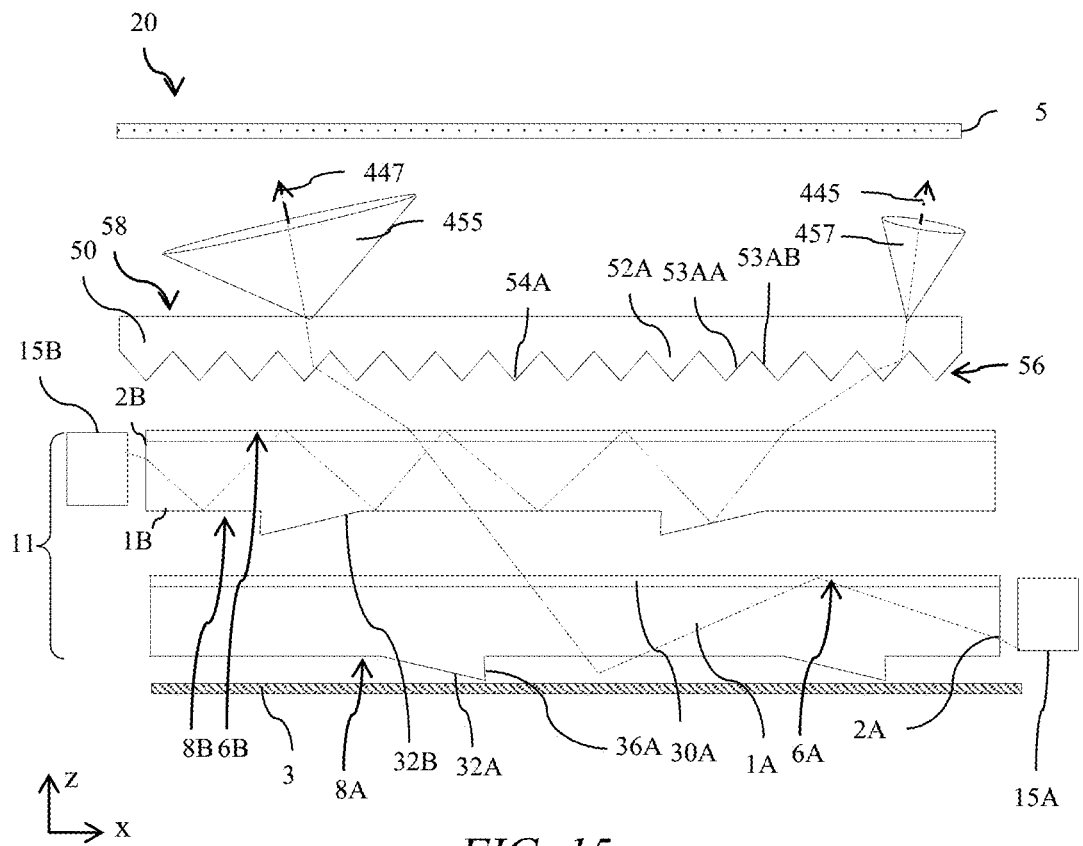
FIG. 15 is a schematic diagram illustrating a side view of an alternative switchable backlight comprising a waveguide arrangement comprising two waveguides arranged in series, a rear reflector and an optical turning film and outputting light beams in first and second lobe directions.

FIG. 15 is a schematic diagram illustrating a side view of an alternative switchable backlight 20 comprising a waveguide arrangement 11 comprising two waveguides 1A, 1B arranged in series, a rear reflector 3 and an optical turning film component 50 and outputting light 445, 447 in first and second lobe directions. Features of the embodiment of FIG. 15 not discussed in further detail may be assumed to correspond to the features with equivalent reference numerals as discussed above, including any potential variations in the features.

The waveguide arrangement 11 comprises first and second waveguides.

The first waveguide 1A extends across a plane and comprises first and second opposed light guiding surfaces 6A,8A arranged to guide light along the optical waveguide 1A, the second light guiding surface 8A being arranged to guide light by total internal reflection; and a first input end 2A arranged between the first and second light guiding surfaces 6A,8A and extending in a lateral direction between the first and second light guiding surfaces 6A,8A; wherein the at least one first light source 15A is arranged to input light 447 into the first waveguide 1A through the first input end 2A, and the first waveguide 1A is arranged to cause light from the at least one first light source 15A to exit from the first waveguide 1A through one of the first and second light guiding surfaces 6A,8A by breaking total internal reflection;

The second waveguide 1B extends across the plane arranged in series with the first waveguide 1A and comprises first and second opposed light guiding surfaces 6B,8B arranged to guide light along the optical waveguide 1B, the second light guiding surface being arranged to guide light by total internal reflection, and a second input end 2B arranged between the first and second light guiding surfaces 6B,8B and extending in a lateral direction between the first and second light guiding surfaces 6B,8B.

The at least one second light source 15B is arranged to input light 445 into the second waveguide 1B through the second input end 2B, and the second waveguide 1B is arranged to cause light from the at least one second light source 15B to exit from the second waveguide 1B through one of the first and second light guiding surfaces 6B,8B by breaking total internal reflection, and wherein the first and second waveguides 1A, 1B are oriented so that at least one first light source 15A and at least one second light source 15B input light 445, 447 into the first and second waveguides 1A, 1B in opposite directions.

A backlight apparatus 20 comprises: a first waveguide 1A extending across a plane and comprising first and second opposed light guiding surfaces 6A,8A arranged to guide light along the optical waveguide 1A, the second light guiding surface being arranged to guide light by total internal reflection; and a first input end 2A arranged between the first and second light guiding surfaces 6A,8A and extending in a lateral direction between the first and second light guiding surfaces 6A,8A; at least one first light source 15A arranged to input light 447 into the first waveguide 1A through the first input end 2A, wherein the first waveguide 1A is arranged to cause light from the at least one first light source 15A to exit from the first waveguide 1A through one of the first and second light guiding surfaces 6A,8A by breaking total internal reflection; a second waveguide 1B extending across the plane in series with the first waveguide 1A and comprising: first and second opposed light guiding surfaces 6B,8B arranged to guide light along the optical waveguide 1B, the second light guiding surface being arranged to guide light by total internal reflection, and a second input end 2B arranged between the first and second light guiding surfaces 6B,8B and extending in a lateral direction between the first and second light guiding surfaces 6B,8B; at least one second light source 15B arranged to input light 445 into the second waveguide 1B through the second input end 2B, wherein the second waveguide 1B is arranged to cause light from the at least one second light source 15B to exit from the second waveguide 1B through one of the first and second light guiding surfaces 6B,8B by breaking total internal reflection, wherein the first and second waveguides 1A, 1B are oriented so that at least one first light source 15A and at least one second light source 15B input light 445,447 into the first and second waveguides 1A, 1B in opposite directions; and an optical turning film component 50 comprising: an input surface 56 arranged to receive the light exiting from a waveguide 1A, 1B through a light guiding surface of the waveguide 1A, 1B by breaking total internal reflection, the input surface 56 extending across the plane; and an output surface 58 facing the input surface 56, wherein the input surface 56 comprises an array of elongate prismatic elements 52 each comprising a pair of elongate facets 53 defining a ridge 54 therebetween, the ridges 54 extending across the plane at non-zero angles to the lateral direction.

In comparison to the embodiment of FIG. 7A, the stacked waveguides 1A, 1B of FIG. 15 may each achieve increased uniformity in the direction orthogonal to the lateral direction. Advantageously display uniformity may be increased to both users 45, 47.

Figure 16A:
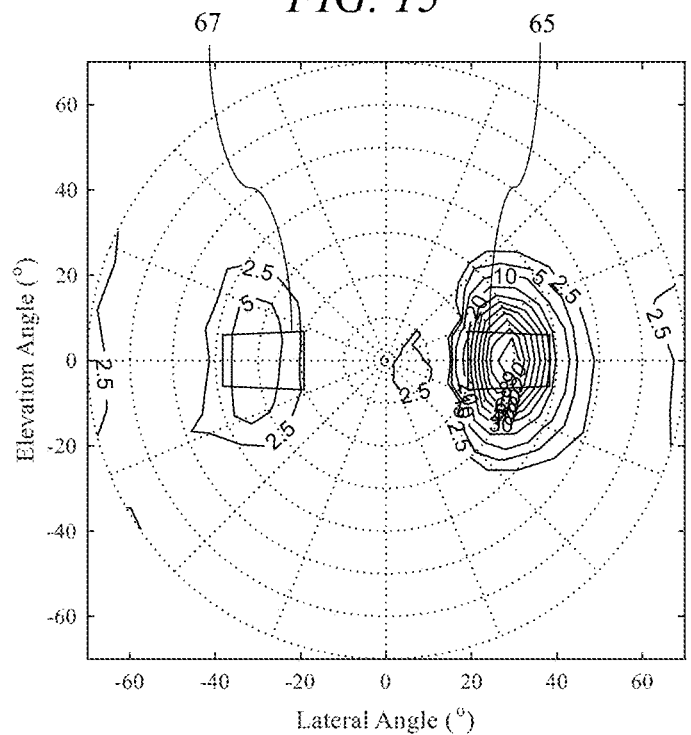
FIG. 16A is a schematic graph illustrating the polar variation of luminance output for the backlight of FIG. 15 operating to direct light to a first user and to provide a private image to a second user.

FIG. 16A is a schematic graph illustrating the polar variation of luminance output for the backlight 20 of FIG. 15 operating to direct light to a first user 45 and to provide a private image to a second user 47. Advantageously the size of the distribution 455 is reduced and higher efficiency may be achieved.

A display comprising two homogeneous alignment layers 419A, 419B for liquid crystal retarders 301A, 301B of FIG. 1A will now be described.

Figure 16B:
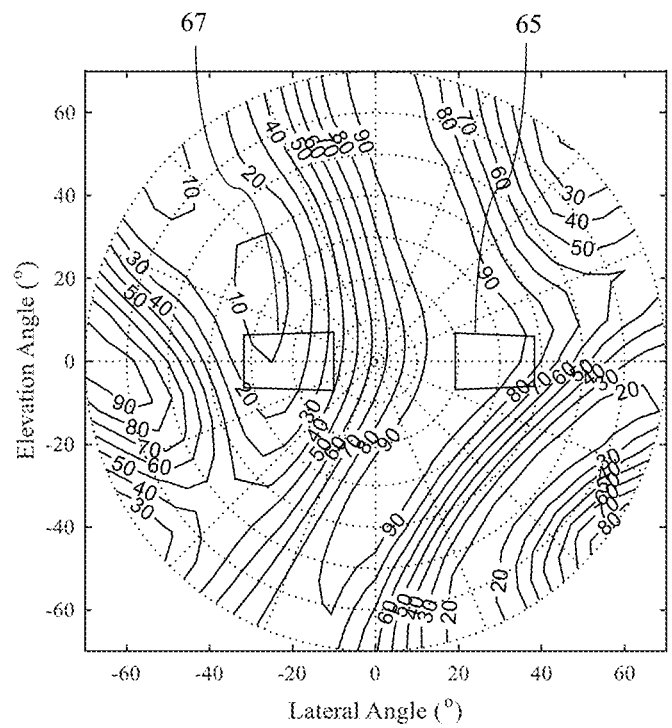
FIG. 16B is a schematic graph illustrating the polar variation of transmission for a first polar control retarder.

FIG. 16B is a schematic graph illustrating the polar variation of transmission for a first polar control retarder 300A, as shown in TABLE 2 and angles 617A, 617B of 20° wherein both of the surface alignment layers 419A, 419B are arranged to provide homogeneous alignment in the adjacent liquid crystal material 414. Advantageously homogeneous alignment may achieve increased resilience to applied mechanical stress with faster liquid crystal 414 relaxation times than for homeotropic alignment. Further, thinner layers 314 may be provided, reducing cost and complexity of fabrication.

TABLE 2

| Alignment type | LC layer 314 retardance | Additional passive retarder 330 type | Additional passive retarder 330 retardance |
|---|---|---|---|
| Homogeneous Homogeneous | 750 nm | | |
| | | Negative C-plate | −500 nm |

Figure 16C:
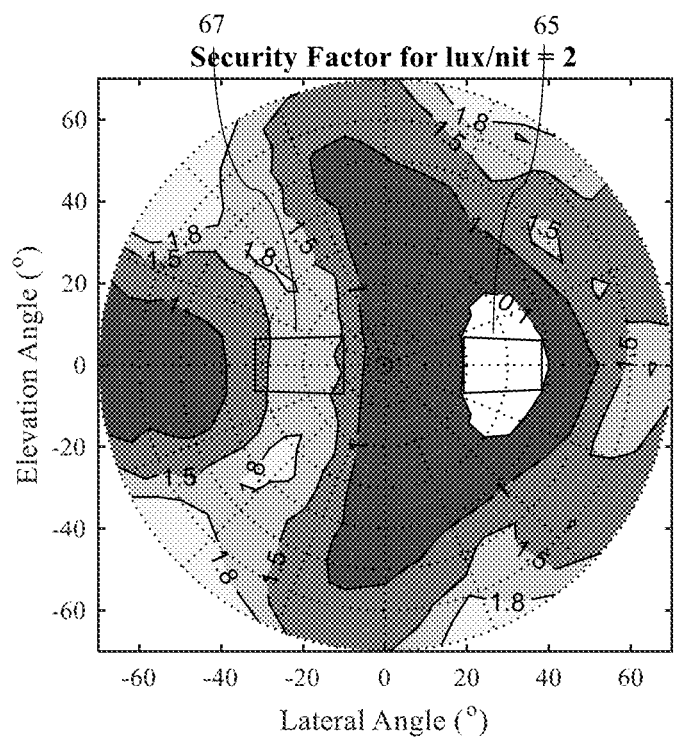
FIG. 16C is a schematic graph illustrating the polar variation of visual security level, S in a privacy mode of operation for the display device of FIG. 1A and profiles of FIG. 16B with a display head-on luminance, of value $Y_{max}$ measured in nits that is half of the illuminance of value I measured in lux.

FIG. 16C is a schematic graph illustrating the polar variation of visual security level, S in a privacy mode of operation for the display device 100 of FIG. 1A; reflection profile of FIG. 11; first polar control retarder 300A transmission profile of FIG. 16B; second polar control retarder 300B transmission profile of FIG. 16B, reflected about an axis in the lateral direction. Advantageously increased symmetry in the elevation direction is achieved.

A display device 100 head-on luminance, of value $Y_{max}$ measured in nits that is half of the illuminance of value I measured in lux.

In the embodiment of FIG. 16C, the locations of the users 45, 47 are illustrated as being at different off-axis angles in the lateral direction, for example with the display tilted slightly towards the user 47, thus the fields of views 65, 67 are not at the same polar angles. Advantageously desirable display nominal location and tilt angle may be compensated to achieve optimal privacy for the user 47.

In alternative embodiments (for which no illustrative embodiment is provided), each of the surface alignment layers 419A, 419B is arranged to provide homeotropic alignment in the adjacent liquid crystal material 414, said surface alignment layers 419A, 419B having said pretilt having a pretilt direction 417 with a component 417Ap, 417Bp in the plane of the layer 314 of liquid crystal material 414 that are at acute non-zero angles 617A, 617B to the electric vector transmission directions 211, 219, 319 of the display polariser 210, 218 and the additional polariser 318. Advantageously such polar retarders have a wide-angle mode for zero drive voltage, and thus power consumption is reduced in the mode in which image data from the display is seen by both users 45, 47.

Figure 16D:
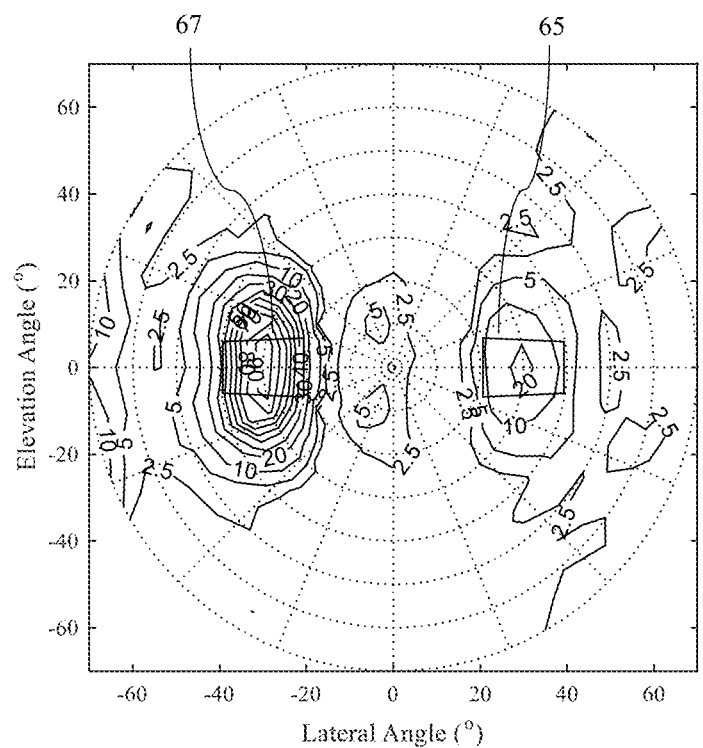
FIG. 16D is a schematic graph illustrating the polar variation of luminance output for the backlight of FIG. 15 operating to direct light to first and second users.
Figure 16E:
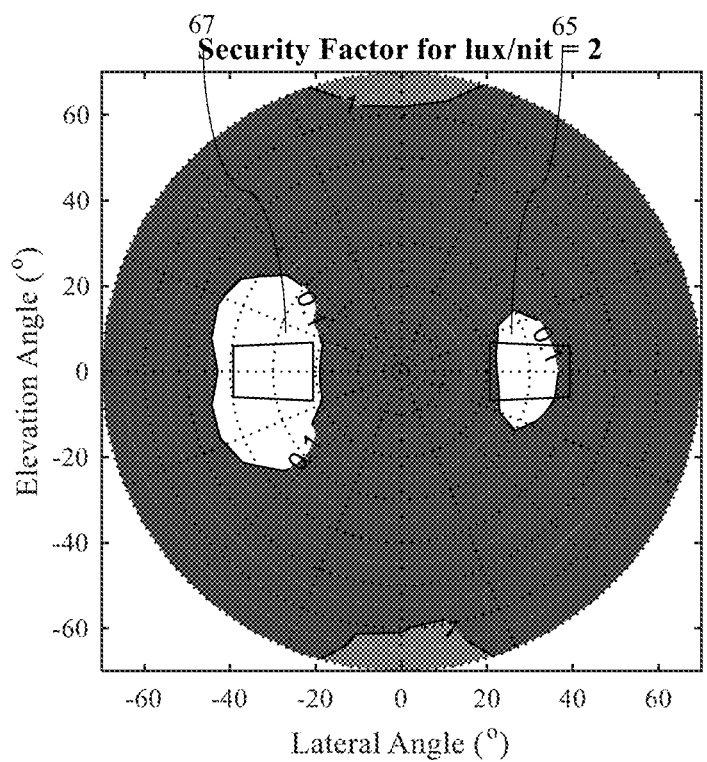
FIG. 16E is a schematic graph illustrating the polar variation of visual security level, S in a dual user mode of operation for the display device of FIG. 1A and backlight luminance profile of FIG. 16D with a display head-on luminance, of value $Y_{max}$ measured in nits that is half of the illuminance of value I measured in lux.

FIG. 16D is a schematic graph illustrating the polar variation of luminance output for the backlight 20 of FIG. 15 operating to direct light to first and second users 45, 47; and FIG. 16E is a schematic graph illustrating the polar variation of visual security level, S in a dual user mode of operation for the display device 100 of FIG. 1A and backlight 20 luminance profile of FIG. 16D with a display device 100 head-on luminance, of value $Y_{max}$ measured in nits that is half of the illuminance of value I measured in lux wherein the polar control retarders 300A, 300B, 300C are driven for high wide angle transmission.

Advantageously high image visibility is provided for both users 45, 47 with a region that may be further expanded by adding diffusers into the optical stack 5 of FIG. 1A.

An alternative arrangement of privacy display will now be described.

Figure 17A:
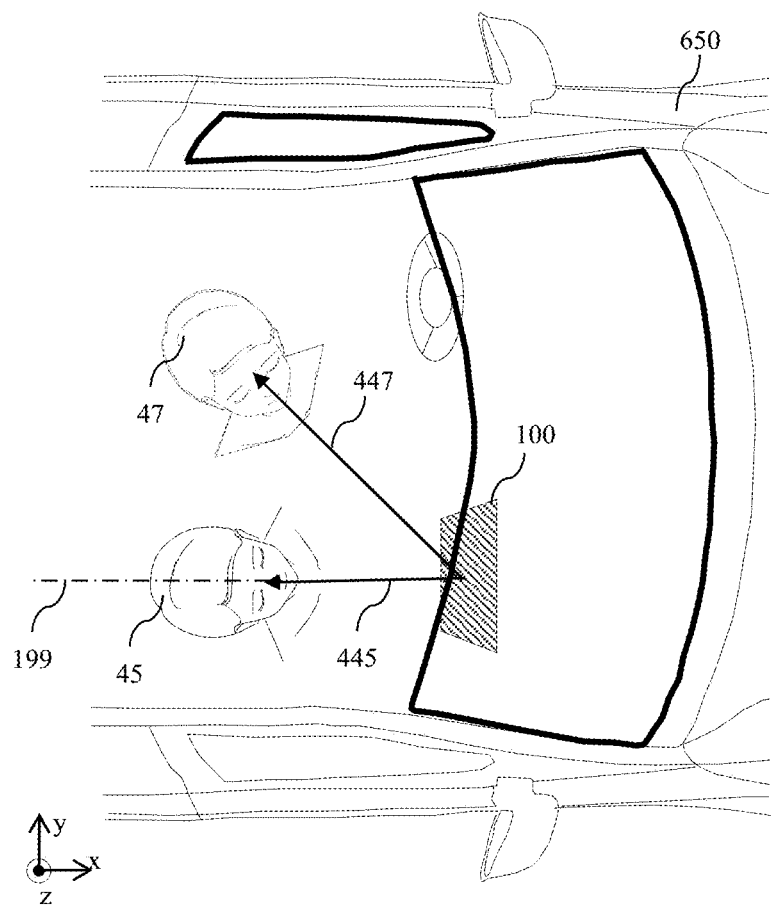
FIG. 17A is a schematic diagram illustrating a top view of a privacy display for use by a passenger in an automotive vehicle.

FIG. 17A is a schematic diagram illustrating a top view of a privacy display 100 for use by a passenger in an automotive vehicle 650. Features of the embodiment of FIG. 17A not discussed in further detail may be assumed to correspond to the features with equivalent reference numerals as discussed above, including any potential variations in the features.

In comparison with the arrangement of FIG. 4A, the alternative embodiment of FIG. 17A comprises a display 100 that is arranged to provide high image visibility to the passenger 45 and high image invisibility to driver 47. Of particular concern for regulatory compliance is the ability of the driver 47 to move to the centre of the vehicle 650 to attempt to view image data on the display 100. As such it would be desirable to provide high image security at polar locations that are relatively close to the optical axis 199 of the display 100.

Figure 17B:
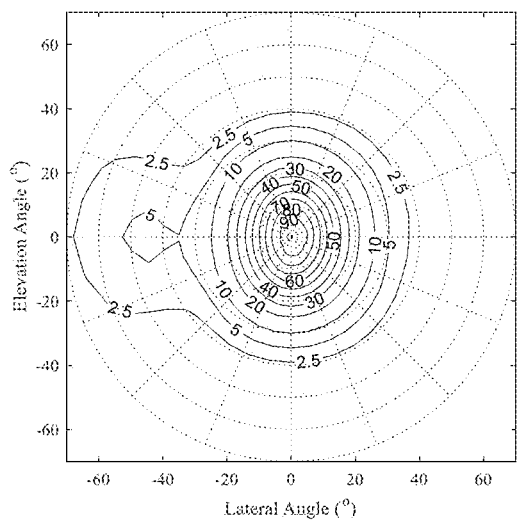
FIG. 17B is a schematic graph illustrating the polar variation of luminance output for an alternative backlight of FIG. 15 primarily operating to direct light to the passenger.

FIG. 17B is a schematic graph illustrating the polar variation of luminance output for an alternative backlight of FIG. 15 primarily operating to direct light to the passenger. FIG. 17B differs from FIG. 16A in that the output is substantially on-axis in privacy mode of operation. Referring to FIG. 15, the turning film component 50 prisms may be adjusted to achieve such an illumination for light from light sources 15B. The backlight 20 of FIG. 15 may be further arranged with other arrangements of components as will now be illustrated.

Figure 17C:
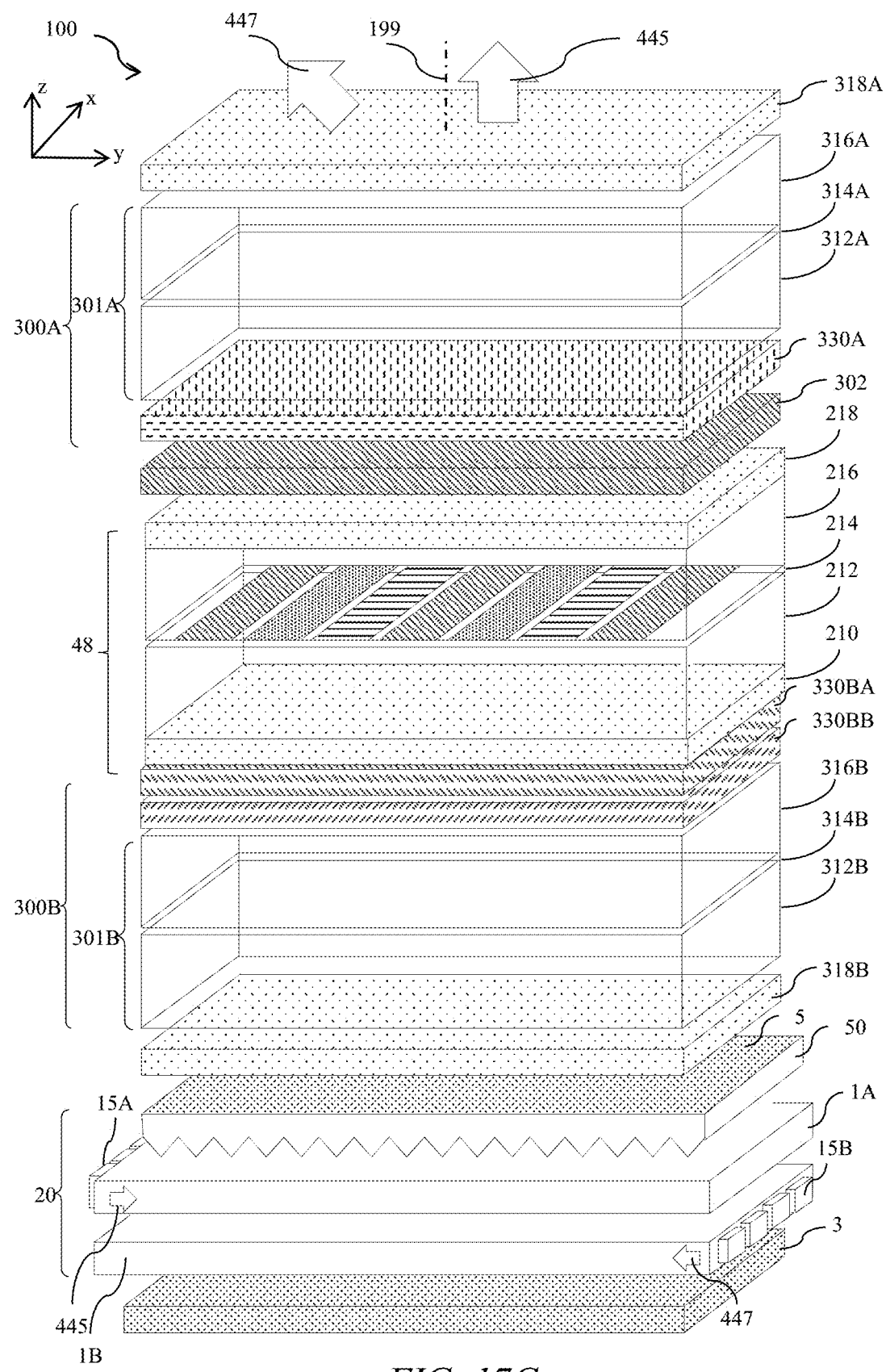
FIG. 17C is a schematic diagram illustrating a front perspective view of a switchable privacy display comprising a transmissive spatial light modulator.

FIG. 17C is a schematic diagram illustrating a front perspective view of a switchable privacy display 100 comprising a transmissive spatial light modulator 48. Features of the embodiment of FIG. 17C not discussed in further detail may be assumed to correspond to the features with equivalent reference numerals as discussed above, including any potential variations in the features.

In comparison to the arrangement of FIG. 1A, the alternative arrangement of FIG. 17C differs in some respects.

In a first respect, the additional polariser 318A is arranged on the output side of the display polariser 218 and the polar control retarder 300A is arranged between the output display polariser 218 and the additional polariser 318A.

In a second aspect a reflective polariser 302 is arranged between the display polariser 218 and the polar control retarder 300A. The electric vector transmission direction of the display polariser 218, the reflective polariser 302 and the additional polariser 318A are parallel. In operation in a public mode of operation, the reflective polariser 302 is arranged to substantially not reflect light for on-axis and non-axis external illumination. Advantageously no increase in reflectivity is provided. In the privacy mode of operation, light rays that pass through the additional polariser 318 and are incident on the reflective polariser 302 have low reflectance for directions that are substantially parallel to the optical axis 199 (z-direction) but are reflected with high reflectance for directions that are inclined to the optical axis 199. Advantageously increased security factor may be achieved for off-axis viewing directions and low reflectance may be achieved for the primary user near to the optical axis 199.

In a third aspect a pair of waveguides 1A, 1B and respective aligned light sources 15A, 15B are arranged to provide output illumination in directions 445, 447 respectively. Advantageously increased brightness and uniformity may be provided in comparison to the arrangement of FIG. 1A.

Figure 17D:
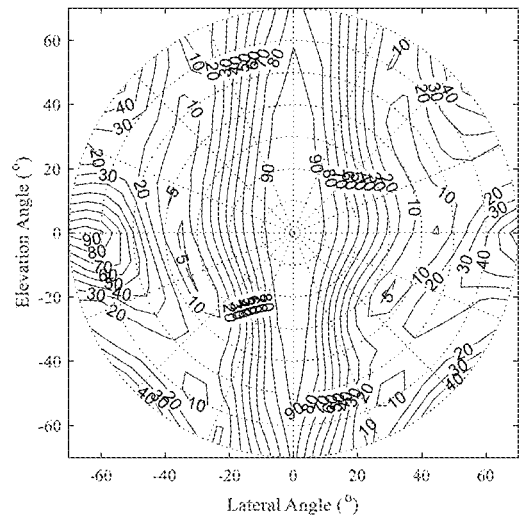
FIG. 17D is a schematic graph illustrating the polar variation of transmission for a first polar control retarder with non-rotated alignment layers.
Figure 17E:
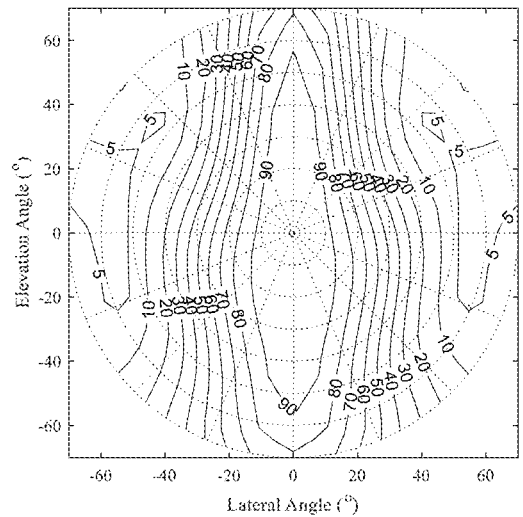
FIG. 17E is a schematic graph illustrating the polar variation of transmission for a second polar control retarder with non-rotated alignment layers.

FIG. 17D is a schematic graph illustrating the polar variation of transmission for a first polar control retarder with non-rotated alignment layers, that is the angle 617 is zero across the alignment layers 417A, 417B of the polar control retarders of the display 100; and FIG. 17E is a schematic graph illustrating the polar variation of transmission for a second polar control retarder with non-rotated alignment layers; that is the angle 617 is zero across the alignment layers 417A, 417B of the polar control retarders of the display 100.

Figure 17F:
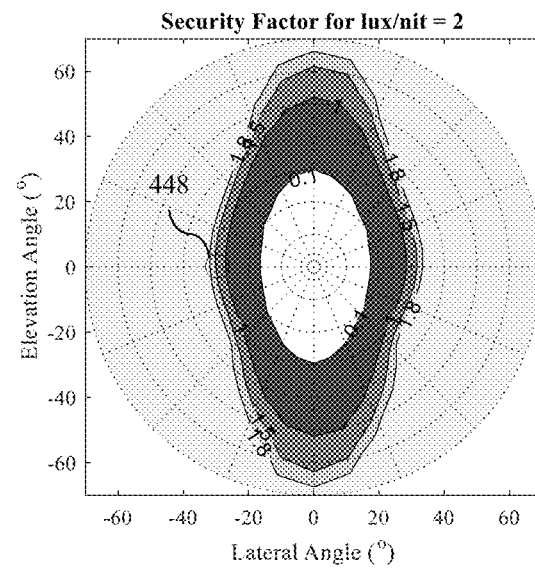
FIG. 17F is a schematic graph illustrating the polar variation of visual security level, S in a privacy mode of operation for the display device of FIG. 1A and profiles of FIGS. 17D-E with a display head-on luminance, of value $Y_{max}$ measured in nits that is half of the illuminance of value I measured in lux.

FIG. 17F is a schematic graph illustrating the polar variation of visual security level, S in a privacy mode of operation for the display device of FIG. 17C and profiles of FIGS. 17D-E with a display head-on luminance, of value $Y_{max}$ measured in nits that is half of the illuminance of value I measured in lux.

Figure 17G:
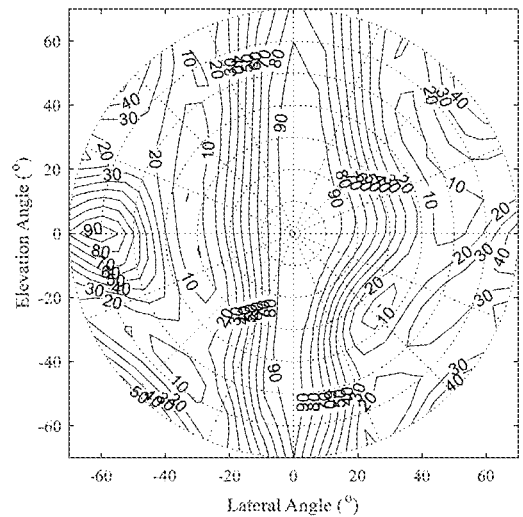
FIG. 17G is a schematic graph illustrating the polar variation of transmission for a first polar control retarder with rotated alignment layers.
Figure 17H:
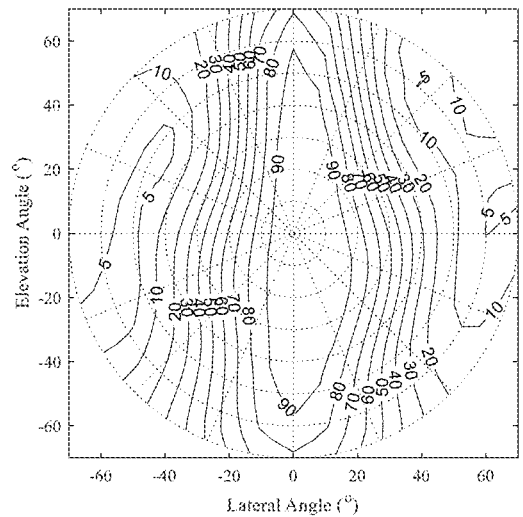
FIG. 17H is a schematic graph illustrating the polar variation of transmission for a second polar control retarder with rotated alignment layers.

FIG. 17G is a schematic graph illustrating the polar variation of transmission for a first polar control retarder with rotated alignment layers; and FIG. 17H is a schematic graph illustrating the polar variation of transmission for a second polar control retarder with rotated alignment layers, that is the angle 617 is an acute non-zero angle.

The angle 617 may be between 10 degrees and −10 degrees from the transmission direction 319 of the additional polariser 318 across at least one of the alignment layers 417A, 417B of the polar control retarders of the display 100. In the illustrative example of FIGS. 17G-I is +5 degrees from the transmission direction 319 of the additional polariser 318 across at least one of the alignment layers 417A, 417B of the polar control retarders of the display 100.

Figure 17I:
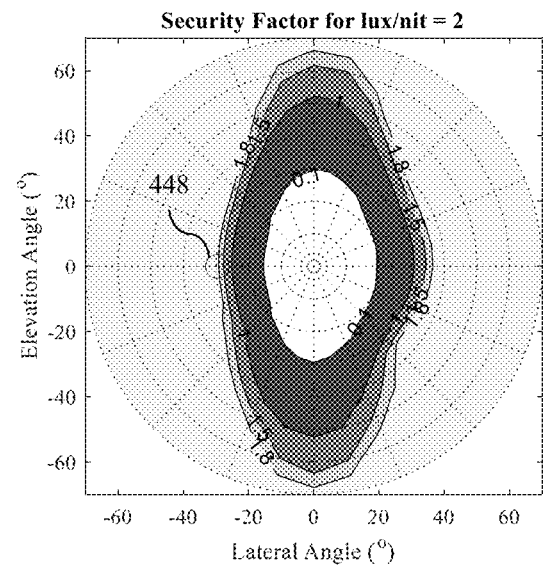
FIG. 17I is a schematic graph illustrating the polar variation of visual security level, S in a privacy mode of operation for the display device of FIG. 1A and profiles of FIGS. 17G-H with a display head-on luminance, of value $Y_{max}$ measured in nits that is half of the illuminance of value I measured in lux.

FIG. 17I is a schematic graph illustrating the polar variation of visual security level, S in a privacy mode of operation for the display device of FIG. 17C and profiles of FIGS. 17G-H with a display head-on luminance, of value $Y_{max}$ measured in nits that is half of the illuminance of value I measured in lux.

Comparing FIG. 17F and FIG. 17I, the polar location 448 of light ray 447 as illustrated in FIG. 17A is illustrated. For the non-rotated alignment of FIG. 17F, the security factor is less than 1.5 at the location 448. For the rotated alignment of FIG. 17I, the security factor is increased to greater than 1.8. Advantageously the security factor is increased to a level at which the image is invisible to the driver when attempting to look at the display. Such an arrangement achieves desirable increase in the safety for driver 47 changes of position from the nominal seating position.

It may be desirable to provide light sources 15, 17 at the top and bottom bezels rather than the left and right bezels of the display 100.

Figure 18A:
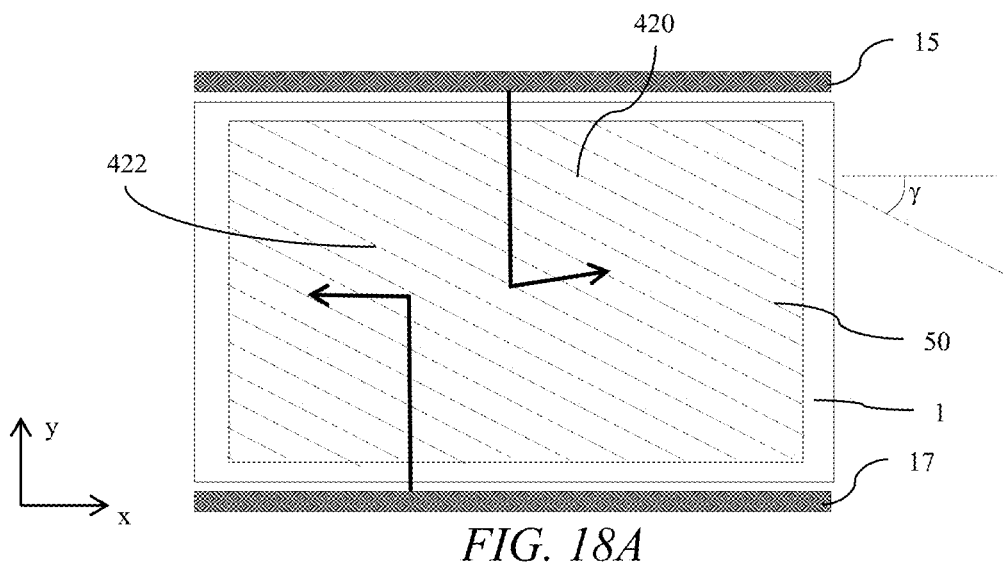
FIG. 18A is a schematic diagram illustrating a front view of an alternative waveguide arrangement.
Figure 18B:
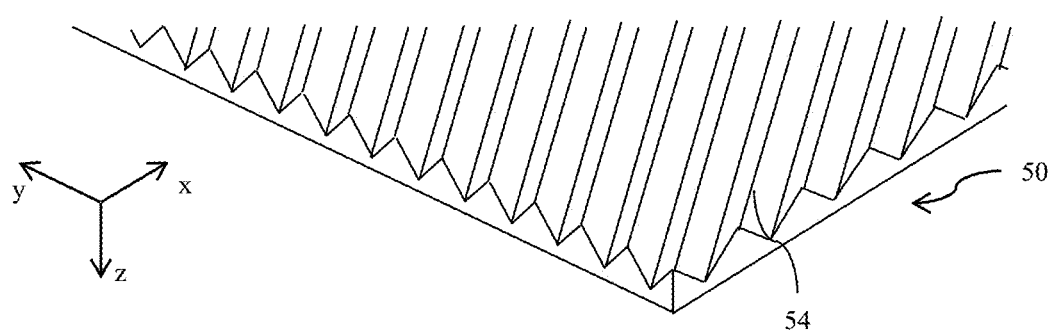
FIG. 18B is a schematic diagram illustrating a rear perspective view of an optical turning film component for use in a backlight comprising the waveguide arrangement of FIG. 18A.

FIG. 18A is a schematic diagram illustrating a front view of an alternative waveguide arrangement 11; and FIG. 18B is a schematic diagram illustrating a rear perspective view of an optical turning film component 50 for use in a backlight 20 comprising the waveguide arrangement 11 of FIG. 18A. Features of the embodiments of FIGS. 18A-B not discussed in further detail may be assumed to correspond to the features with equivalent reference numerals as discussed above, including any potential variations in the features.

Thus a backlight apparatus 20 comprises: a waveguide 1 extending across a plane and comprising: first and second opposed light guiding surfaces 6,8 arranged to guide light along the optical waveguide 1, the second light guiding surface being arranged to guide light by total internal reflection, and first and second input ends arranged between the first and second light guiding surfaces 6,8 and extending in a lateral direction between the first and second light guiding surfaces 6,8; and at least one first light source 15 arranged to input light 445 into the waveguide 1 through the first input end 2 and at least one second light source 17 arranged to input light 445 into the waveguide 1 through the second input end 4, wherein the waveguide 1 is arranged to cause light from the at least one first light source 15 and the at least one second light source 17 to exit from the waveguide 1 through one of the first and second light guiding surfaces 6,8 by breaking total internal reflection; and an optical turning film component 50 comprising: an input surface 56 arranged to receive the light 445, 447 exiting from a waveguide 1 through a light guiding surface of the waveguide 1 by breaking total internal reflection, the input surface extending across the plane; and an output surface 58 facing the input surface 56, wherein the input surface 56 comprises an array of elongate prismatic elements 52 each comprising a pair of elongate facets 53A, 53B defining a ridge 54 therebetween, the ridges 54 extending across the plane at non-zero angles γ to the lateral direction.

In comparison to the arrangements of FIGS. 7A-B and FIG. 15, the ridges 54 extend across the plane at non-zero angles γ to the lateral direction. The ridges 54 extend in the plane at angles γ of no more than 55° from the lateral direction. Such an arrangement can be used with the single waveguide 1 of FIG. 7A, or alternatively the two stacked waveguides 1A, 1B of FIG. 15.

Advantageously the side bezel width of the display is reduced.

It may be desirable to provide increased reduction of luminance to the user 47. An arrangement with first, second and third polar control retarders 300A, 300B, 300C arranged between polariser 210 and additional polarisers 318A, 318B and 318C will now be described.

Figure 19A:
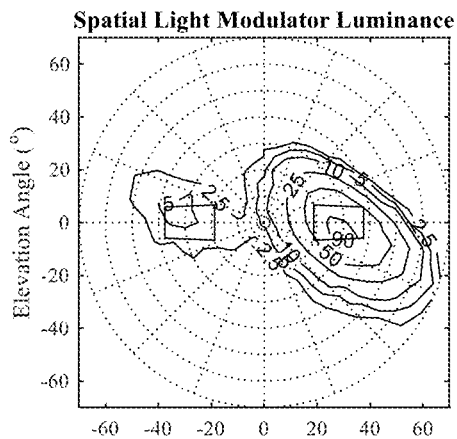
FIG. 19A is a schematic graph illustrating the polar variation of luminance output for the backlight of FIG. 18A operating to direct light to a first user and to provide a private image to a second user.
Figure 19B:
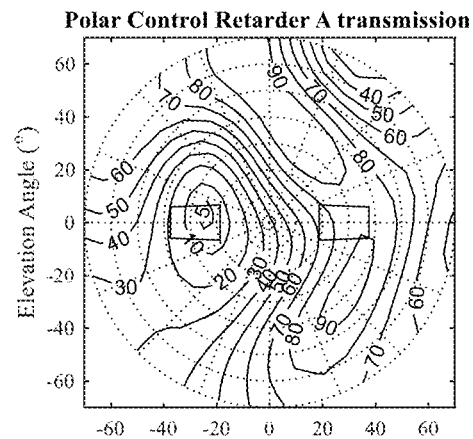
FIG. 19B is a schematic graph illustrating the polar variation of transmission for a first polar control retarder.
Figure 19C:
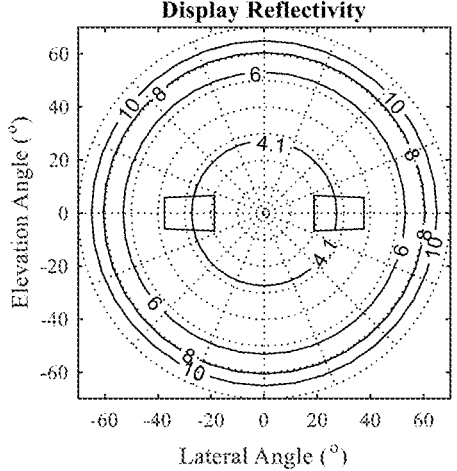
FIG. 19C is a schematic graph illustrating the polar variation of front surface reflectivity for a display device comprising the backlight of FIG. 18A.
Figure 19D:
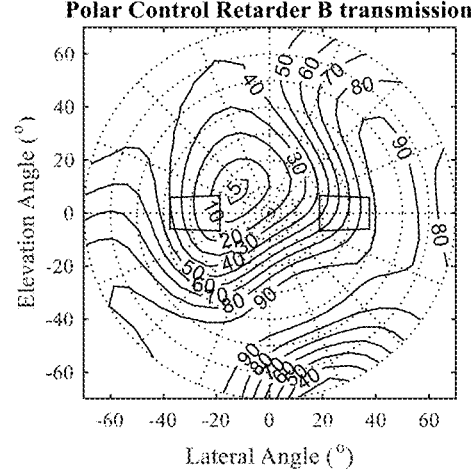
FIG. 19D is a schematic graph illustrating the polar variation of transmission for a second polar control retarder.
Figure 19E:
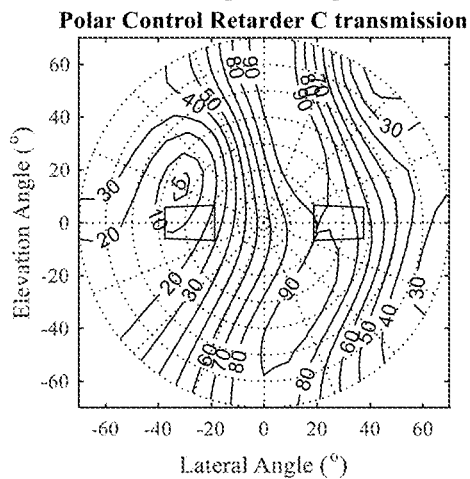
FIG. 19E is a schematic graph illustrating the polar variation of transmission for a third polar control retarder.
Figure 19F:
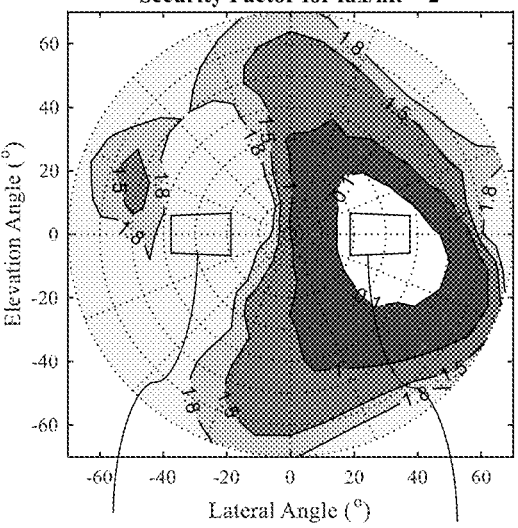
FIG. 19F is a schematic graph illustrating the polar variation of visual security level, S in a privacy mode of operation for the display device of FIG. 1A and profiles of FIGS. 19A-E with a display head-on luminance, of value $Y_{max}$ measured in nits that is half of the illuminance of value I measured in lux.

FIG. 19A is a schematic graph illustrating the polar variation of luminance output for the backlight 20 of FIG. 18A operating to direct light to a first user 45 and to provide a private image to a second user 47; FIG. 19B is a schematic graph illustrating the polar variation of transmission for a first polar control retarder 300A; FIG. 19C is a schematic graph illustrating the polar variation of front surface reflectivity for a display device 100 comprising the backlight 20 of FIG. 18A; FIG. 19D is a schematic graph illustrating the polar variation of transmission for a second polar control retarder 300B; FIG. 19E is a schematic graph illustrating the polar variation of transmission for a third polar control retarder 300C; and FIG. 19F is a schematic graph illustrating the polar variation of visual security level, S in a privacy mode of operation for the display device 100 of FIG. 1A and profiles of FIGS. 19A-E with a display device 100 head-on luminance, of value $Y_{max}$ measured in nits that is half of the illuminance of value I measured in lux.

The polar control retarders 300A, 300B, 300C comprise the illustrative embodiment of TABLE 1 with angles 617AA, 617AB of 30°, 617BA, 617BB of 20°, and 617CA, 617CB of 40° respectively. Advantageously the size of the region for which the image is invisible for all image data (S≥1.8) is increased and the user 45 sees an image with high image visibility.

Figure 20A:
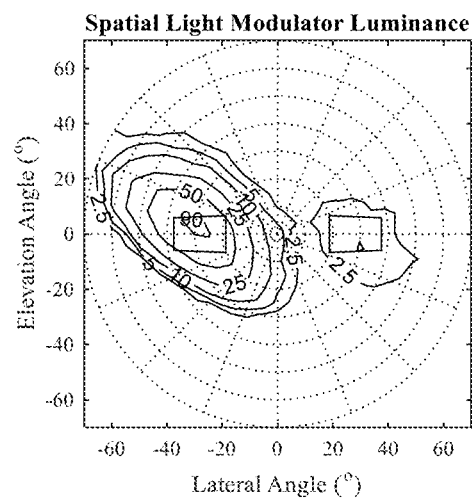
FIG. 20A is a schematic graph illustrating the polar variation of luminance output for the backlight of FIG. 15 operating to direct light to the second user.
Figure 20B:
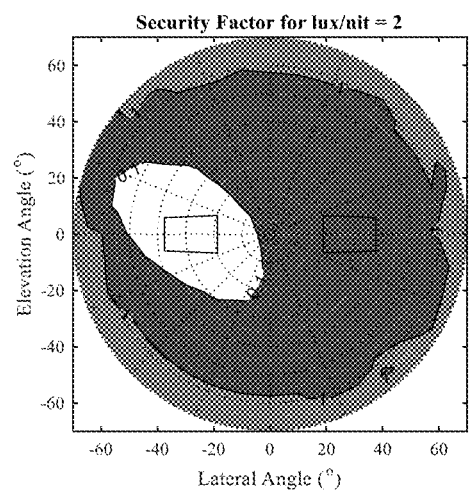
FIG. 20B is a schematic graph illustrating the polar variation of visual security level, S in a low stray light mode of operation for the display device of FIG. 1A and backlight luminance profile of FIG. 20A with a display head-on luminance, of value $Y_{max}$ measured in nits that is half of the illuminance of value I measured in lux.

FIG. 20A is a schematic graph illustrating the polar variation of luminance output for the backlight 20 of FIG. 15 operating to direct light to the second user 47; and FIG. 20B is a schematic graph illustrating the polar variation of visual security level, S in a low stray light mode of operation for the display device 100 of FIG. 1A and backlight 20 luminance profile of FIG. 20A with a display device 100 head-on luminance, of value $Y_{max}$ measured in nits that is half of the illuminance of value I measured in lux wherein the polar control retarders 300A, 300B, 300C are driven for high wide angle transmission. Advantageously the user 47 may be provided with high image visibility over a wide polar region.

Figure 21A:
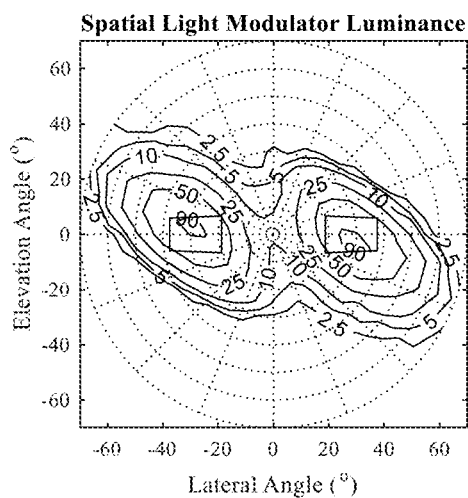
FIG. 21A is a schematic graph illustrating the polar variation of luminance output for the backlight of FIG. 15 operating to direct light to the first and second users.
Figure 21B:
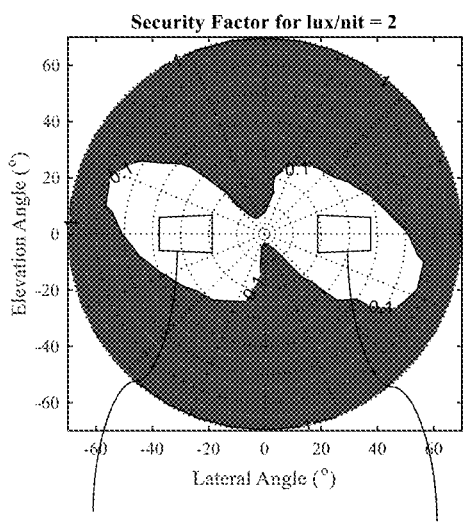
FIG. 21B is a schematic graph illustrating the polar variation of visual security level, S in a dual user mode of operation for the display device of FIG. 1A and backlight luminance profile of FIG. 21A with a display head-on luminance, of value $Y_{max}$ measured in nits that is half of the illuminance of value I measured in lux.

FIG. 21A is a schematic graph illustrating the polar variation of luminance output for the backlight 20 of FIG. 15 operating to direct light to the first and second users 45, 47; and FIG. 21B is a schematic graph illustrating the polar variation of visual security level, S in a dual user mode of operation for the display device 100 of FIG. 1A and backlight 20 luminance profile of FIG. 21A with a display device 100 head-on luminance, of value $Y_{max}$ measured in nits that is half of the illuminance of value I measured in lux wherein the polar control retarders 300A, 300B, 300C are driven for high wide angle transmission. Advantageously the users 45,47 may be provided with high image visibility over a wide polar region.

It may be desirable to increase the viewing freedom of one of the user 47.

Figure 22:
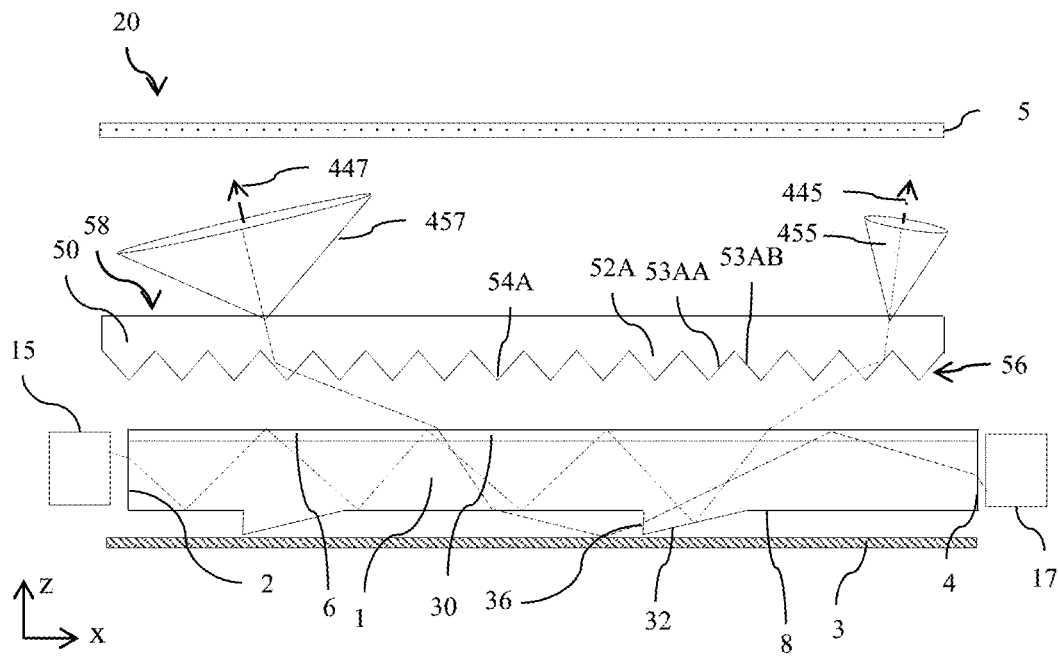
FIG. 22 is a schematic diagram illustrating a side view of an alternative switchable backlight comprising a waveguide arrangement comprising asymmetric light extraction facets, a rear reflector and an optical turning film and outputting light beams in first and second lobe directions with different angular distributions.
Figure 23:
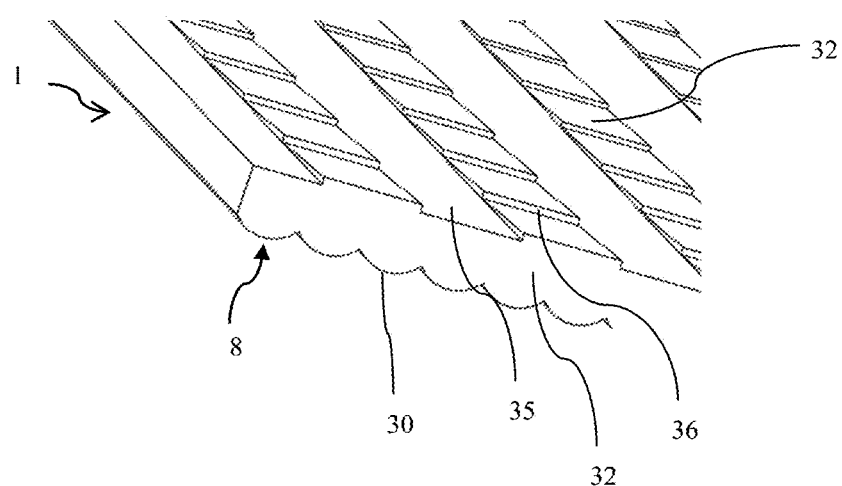
FIG. 23 is a schematic diagram illustrating a front perspective view of an optical waveguide for the waveguide arrangement of FIG. 22 comprising microstructures on first and second sides of the optical waveguide.

FIG. 22 is a schematic diagram illustrating a side view of an alternative switchable backlight 20 comprising a waveguide arrangement 11 comprising waveguide 1 with asymmetric facets 32, 36, a rear reflector 3 and an optical turning film component 50 and outputting light beams 445, 447 in first and second directions with different angular distributions 455, 457; and FIG. 23 is a schematic diagram illustrating a front perspective view of an optical waveguide 1 for the waveguide arrangement 11 of FIG. 22 comprising microstructures on first and second sides of the optical waveguide 1.

Features of the embodiment of FIG. 22 not discussed in further detail may be assumed to correspond to the features with equivalent reference numerals as discussed above, including any potential variations in the features.

The waveguide 1 is arranged to cause light 445, 447 from the at least one first light source 15 and the at least one second light source 17 to exit from the waveguide 1 with different angular distributions 455, 457. In comparison to the arrangement of FIG. 7A, the waveguide 1 is provided with vertical facets 36 rather than gently sloped facets 32B. Light source 17 is provided at the second end and light escapes through the facets 36 with an increased angular distribution 447 compared to the angular distribution 445.

Figure 24A:
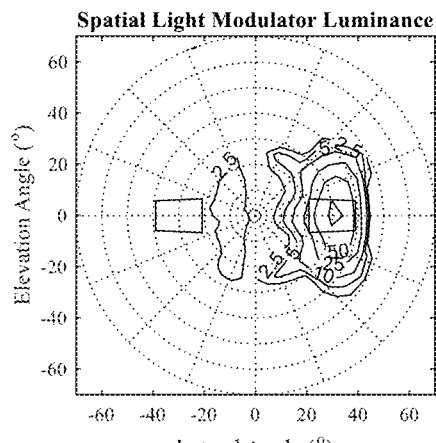
FIG. 24A is a schematic graph illustrating the polar variation of luminance output for the backlight of FIG. 22 operating to direct light to a first user and to provide a private image to a second user.
Figure 24B:
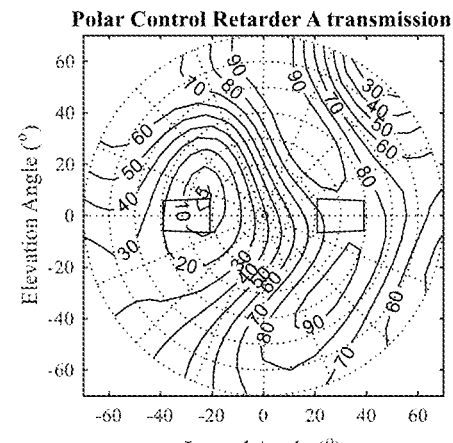
FIG. 24B is a schematic graph illustrating the polar variation of transmission for a first polar control retarder.
Figure 24C:
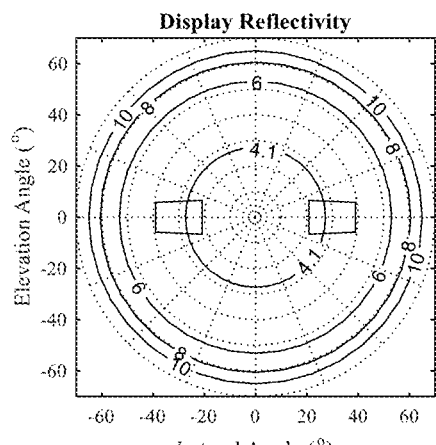
FIG. 24C is a schematic graph illustrating the polar variation of front surface reflectivity for a display device comprising the backlight of FIG. 22.
Figure 24D:
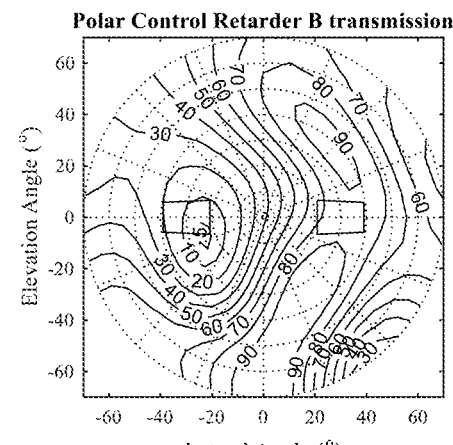
FIG. 24D is a schematic graph illustrating the polar variation of transmission for a second polar control retarder.

FIG. 24A is a schematic graph illustrating the polar variation of luminance output for the backlight 20 of FIG. 22 operating to direct light to a first user 45 and to provide a private image to a second user 47; FIG. 24B is a schematic graph illustrating the polar variation of transmission for a first polar control retarder 300A with angles 617AA, 617AB of 30°; FIG. 24C is a schematic graph illustrating the polar variation of front surface reflectivity for a display device 100 comprising the backlight 20 of FIG. 22; FIG. 24D is a schematic graph illustrating the polar variation of transmission for a second polar control retarder 300B with angles 617BA, 617BB of 30° and flipped about an axis extending in the lateral direction.

Figure 24E:
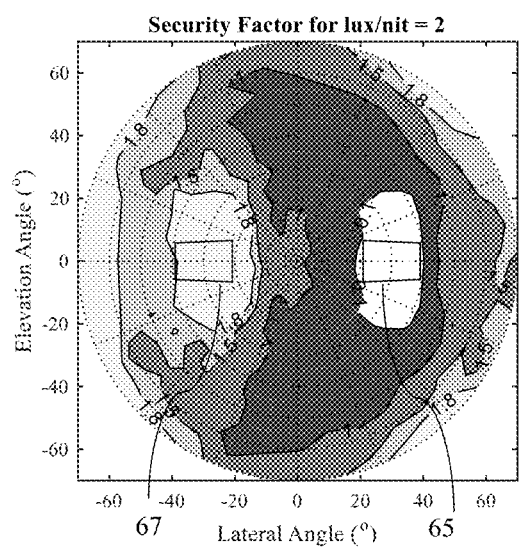
FIG. 24E is a schematic graph illustrating the polar variation of visual security level, S in a privacy mode of operation for the display device of FIG. 1A and profiles of FIGS. 24A-D with a display head-on luminance, of value $Y_{max}$ measured in nits that is half of the illuminance of value I measured in lux.

FIG. 24E is a schematic graph illustrating the polar variation of visual security level, S in a privacy mode of operation for the display device 100 of FIG. 1A and profiles of FIGS. 24A-D with a display device 100 head-on luminance, of value $Y_{max}$ measured in nits that is half of the illuminance of value I measured in lux. Advantageously high image visibility is provided to the user 45 and high image security over a large polar region to the user 47.

Other modes of operation will now be described.

Figure 25A:
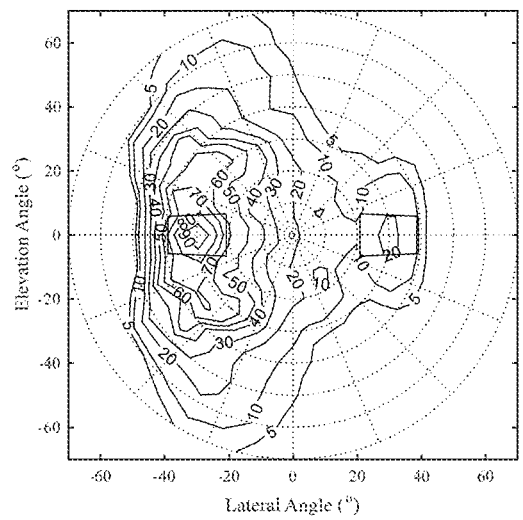
FIG. 25A is a schematic graph illustrating the polar variation of luminance output for the backlight of FIG. 22 operating to direct light to the second user.
Figure 25B:
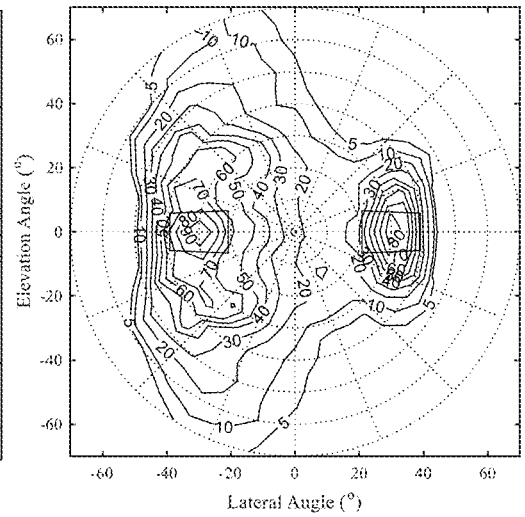
FIG. 25B is a schematic graph illustrating the polar variation of luminance output for the backlight of FIG. 22 operating to direct light to the first and second users.

FIG. 25A is a schematic graph illustrating the polar variation of luminance output for the backlight 20 of FIG. 22 operating to direct light to the user 47; and FIG. 25B is a schematic graph illustrating the polar variation of luminance output for the backlight 20 of FIG. 22 operating to direct light to the users 45, 47, wherein the polar control retarder(s) 300 are arranged to provide wide angle transmission. FIG. 25A illustrates luminance distribution for a low stray light mode of operation for user 47 and FIG. 25B illustrates luminance distribution for dual users 45, 47.

Figure 26:
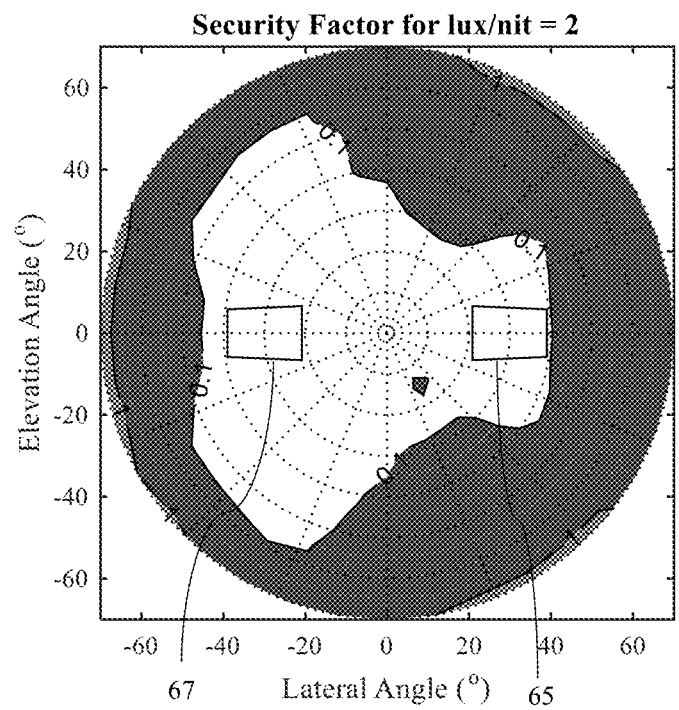
FIG. 26 is a schematic graph illustrating the polar variation of visual security level, S in a public mode of operation for the display device of FIG. 1A and profile of FIG. 25B with a display head-on luminance, of value $Y_{max}$ measured in nits that is half of the illuminance of value I measured in lux.

FIG. 26 is a schematic graph illustrating the polar variation of visual security level, S in a public mode of operation for the display device 100 of FIG. 1A and profile of FIG. 25B with a display device 100 head-on luminance, of value $Y_{max}$ measured in nits that is half of the illuminance of value I measured in lux wherein the polar control retarder(s) 300 are arranged to provide wide angle transmission. Advantageously the freedom of movement of user 47 is increased in comparison to FIGS. 13A, 17A, 20A and 21A.

Alternative waveguide structures for use in the backlight 20 of FIG. 22 will now be described.

Figure 27A:
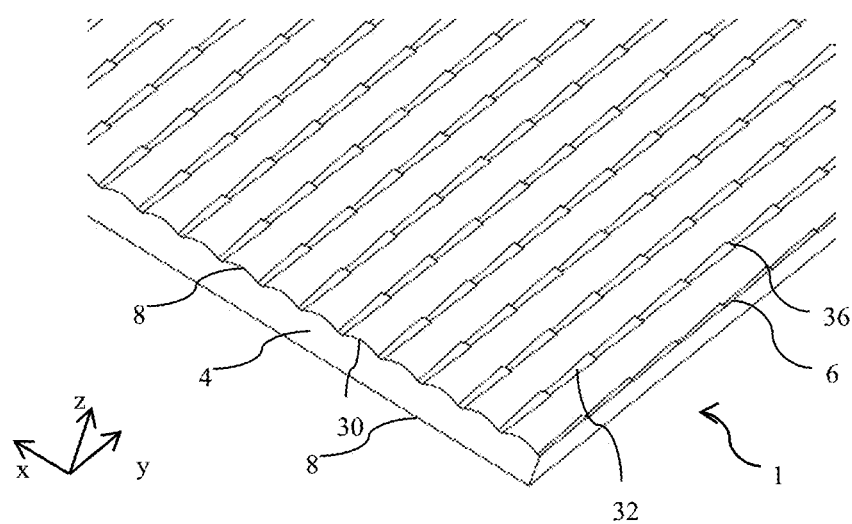
FIGS. 27A-B are schematic diagrams illustrating a front perspective views of alternative optical waveguides for the waveguide arrangement of FIG. 22 comprising microstructures on the same side of the optical waveguide.
Figure 27B:
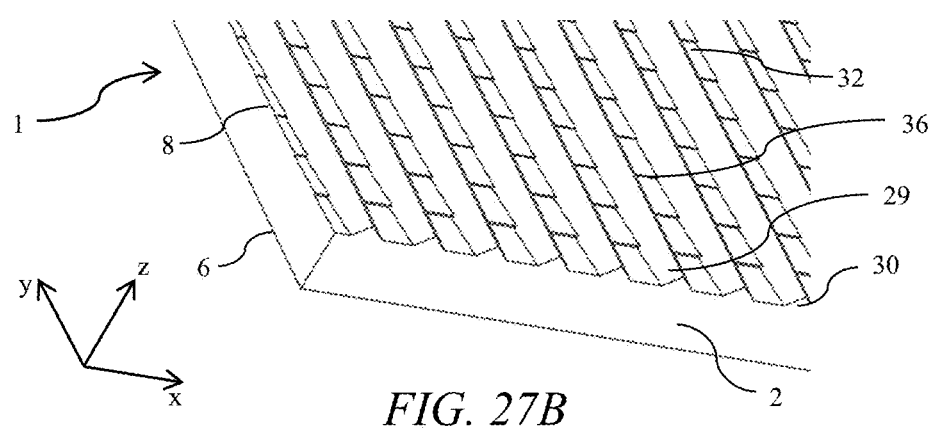

FIGS. 27A-B are schematic diagrams illustrating a front perspective views of alternative optical waveguides 1 for the waveguide arrangement 11 of FIG. 22 comprising microstructures on the same side of the optical waveguide 1. Features of the embodiments of FIGS. 27A-B not discussed in further detail may be assumed to correspond to the features with equivalent reference numerals as discussed above, including any potential variations in the features. In comparison to the waveguide of FIG. 23, the waveguides 1 of FIGS. 27A-B are provided with microstructures on a single surface of the waveguide. The principles of operation are otherwise similar. The surfaces may be provided on a single surface of the waveguide 1, advantageously achieving reduced cost and complexity.

It may be desirable to provide different outputs for different regions of a display.

Figure 28:
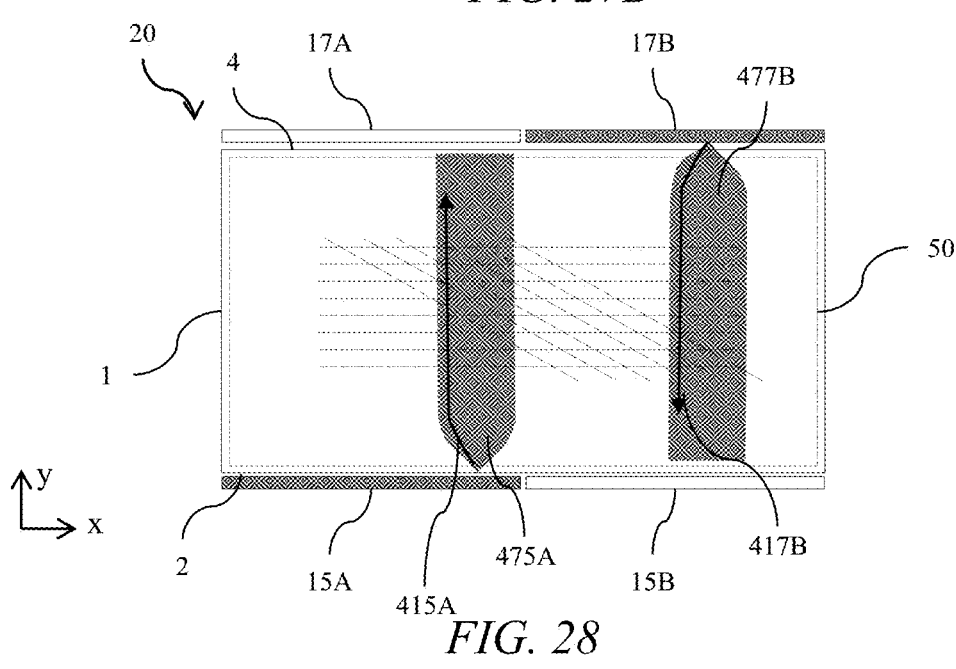
FIG. 28 is a schematic diagram illustrating a top view of a segmented backlight.

FIG. 28 is a schematic diagram illustrating a top view of some elements of a backlight 20 that is segmented. Features of the embodiment of FIG. 28 not discussed in further detail may be assumed to correspond to the features with equivalent reference numerals as discussed above, including any potential variations in the features.

First light source 15 comprises first and second parts 15A, 15B and second light source 17 comprises first and second parts 17A, 17B. Waveguide 1 may be of the type illustrated elsewhere herein, or may be first and second waveguides 1A, 1B for example as illustrated in FIG. 16B, in which case light sources 15AA, 15AB and light sources 15BA, 15BB are provided at respective ends of the waveguide.

Light rays 415A propagating within the waveguide 1 are input with an expanding cone in the lateral direction. The microstructures on the surfaces 6,8 of the waveguide 1 adjust the ray 415A propagation directions to achieve some collimation in the lateral direction and thus illumination regions 475A are provided with limited extent in the lateral direction. Such collimation can achieve partial illumination of the backlight in regions 475A that are determined by the location of the light source along the first input end 2.

Similarly light rays 417B propagating within the waveguide 1 are input with an expanding cone in the lateral direction. Some collimation is provided in the lateral direction and thus illumination regions 477B are provided with limited extent in the lateral direction. Such collimation can achieve partial illumination of the backlight in regions 477B that are determined by the location of the light source along the input end 4.

By control of light sources 15A, 15B and 17A, 17B, the directionality of output may be different for different regions of the backlight 20. In an illustrative example, in one mode of operations, the left side of the display may be arranged for high image visibility to the driver 47 and passenger 45 and the right side of the display may be provided for high image security factor to the driver 47 with high image visibility to the passenger 45. In other illustrative modes of operation, the whole display may be arranged to be seen by both occupants, or the whole display may be arranged to be private to the driver.

The number of light sources 15A-N may be adjusted to increase the number of addressable regions of display control.

Embodiments to increase the perceived uniformity of luminance and security factor across the field of view 65, 67 will now be described.

FIG. 29A is a schematic diagram illustrating a front view of one alignment layer 419B having pretilt directions 417 with a component 417Bp in the plane of the layer 314 of liquid crystal material 414 that is at an acute non-zero angle 617B to the electric vector transmission directions of the display device 100 polariser and the additional polariser 318 and which vary across the plane of the alignment layer 419. Features of the embodiment of FIG. 29A not discussed in further detail may be assumed to correspond to the features with equivalent reference numerals as discussed above, including any potential variations in the features.

In comparison to the arrangement of FIG. 5B, the angle 617B varies such that the angle 617BL on the left hand side is greater than the angle 617BC in the centre which is greater than the angle 617BR on the right hand side. Thus, the acute non-zero angle 617B has an average value that is equal to the angle 617BC in the centre and so is itself acute and non-zero.

In general, at least one of the surface alignment layers 419A, h419B has a pretilt having a pretilt direction 417 with a component 417Ap, 417Bp in the plane of the layer 314 of liquid crystal material 414 that is at an acute non-zero angle 617 to the electric vector transmission directions 211, 219, 319 of the display polariser 210, 218 and the additional polariser 318 that varies monotonically along a predetermined axis across the surface alignment layer 419.

Figure 29B:
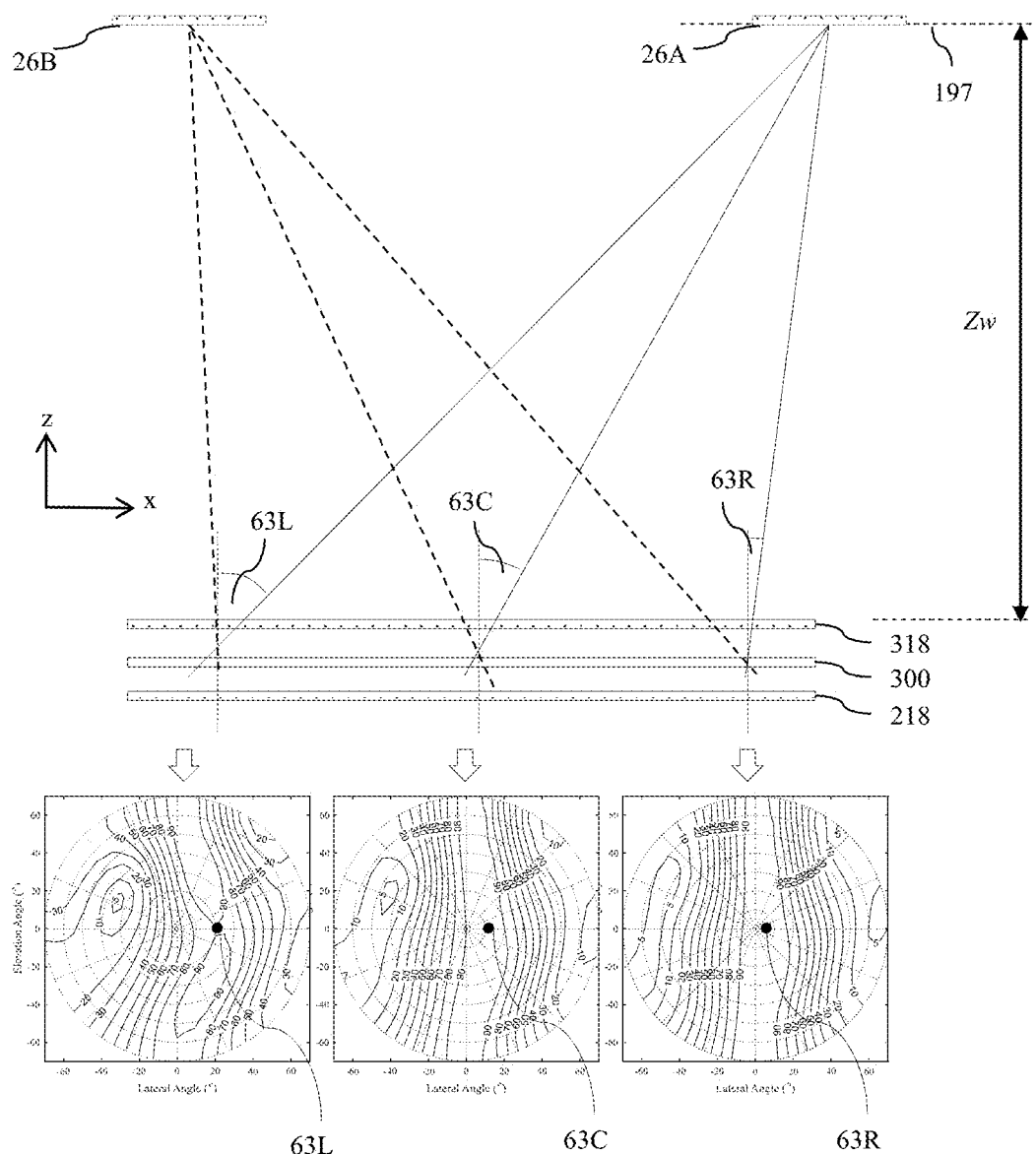
FIG. 29B is a schematic diagram illustrating pupillation of a polar control retarder and graphs illustrating the polar variation of transmission with location across the plane of the alignment layer.

FIG. 29B is a schematic diagram illustrating pupillation of a polar control retarder and graphs illustrating the polar variation of transmission with location across the plane of the alignment layer 419. Features of the embodiment of FIG. 29B not discussed in further detail may be assumed to correspond to the features with equivalent reference numerals as discussed above, including any potential variations in the features.

Polar angles 693L, 63C, 63R for points across the display field of view as seen by a user 45 in optical window 26A are illustrated. The angle 617Bp may be provided so that the luminance to the user 45 is optimised for each viewing angle. Advantageously the luminance uniformity across the display 100 is increased.

Alternatively the luminance provided to the user 47 in the nominal viewing location at a viewing window 26B may be minimised to optimise security factor uniformity across the window 26B.

In the present disclosure optical window 26A refers to the directing of light by the display 100 to defined spatial regions in a window plane 197, that is at the window distance Z from the illumination apparatus. The optical window 26A may also be referred to as an optical pupil. An observation from a location within the optical window provides light rays with common or substantially common optical properties from across the display apparatus 100.

The use of the term optical window 26 in the present embodiments is distinct and different from the use of the term window when used to refer to sheets or panes of glass or other transparent material such as plastics for use in house windows, car windows and windscreens, and other types of protective windows. Such sheets or panes do not contribute to the creation of desirable viewing regions with improved uniformity as described herein.

Pupillated illumination for display apparatus 100 will now be described.

Figure 30A:
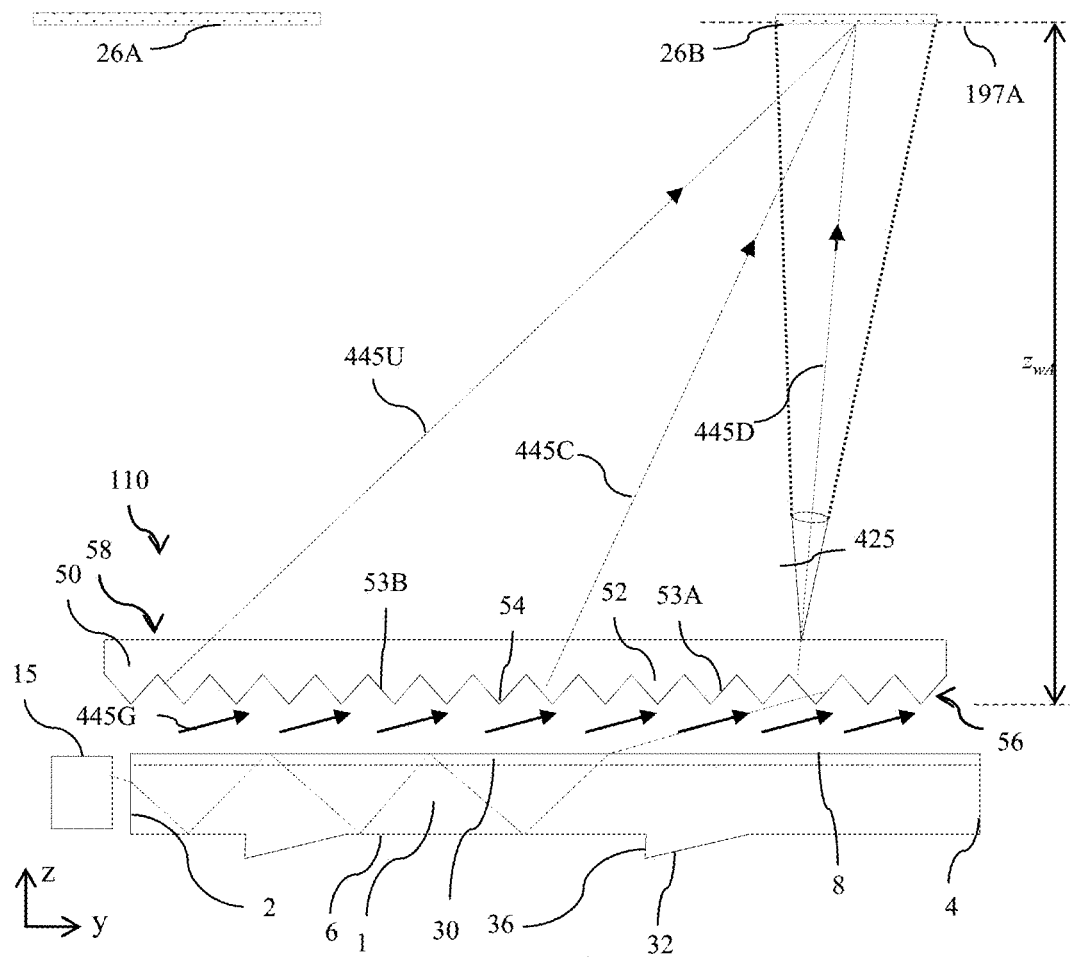
FIG. 30A is a schematic diagram illustrating a side view of an alternative switchable backlight comprising an optical turning film wherein the facet tilt varies in the direction orthogonal to the lateral direction across the plane of the optical turning film.
Figure 30B:
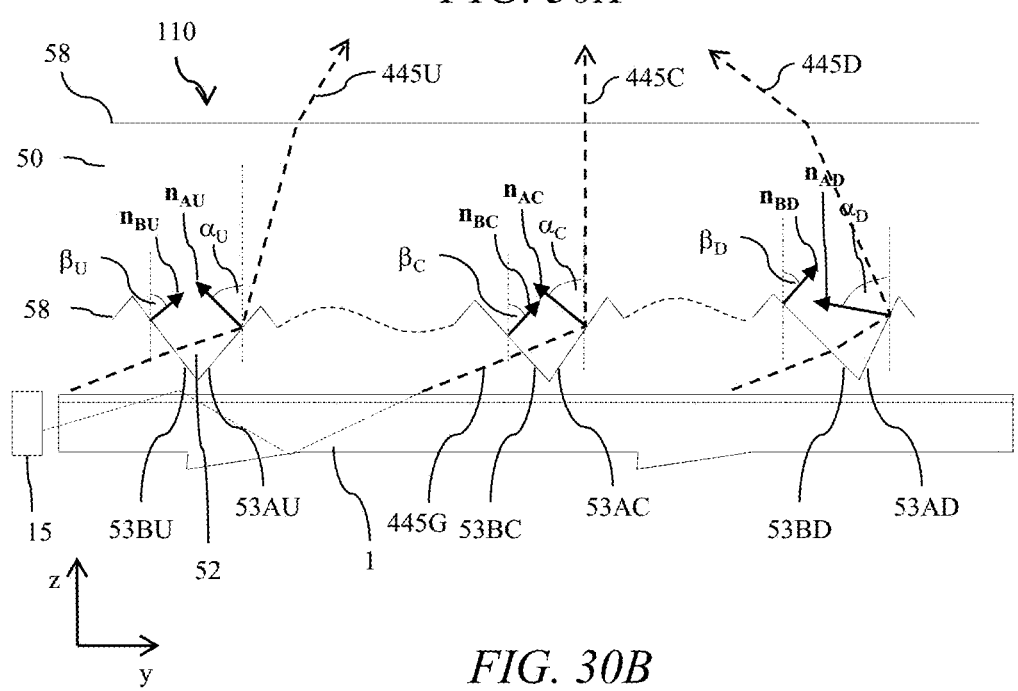
FIG. 30B is a schematic diagram illustrating a side view of an alternative switchable backlight comprising an optical turning film wherein the facet tilt varies in the direction orthogonal to the lateral direction across the plane of the optical turning film.

FIG. 30A is a schematic diagram illustrating a side view of a pupillated backlight 20 for a first light source 15; and FIG. 30B is a schematic diagram illustrating a side view of operation of variable tilt facets 53 of an optical turning film component 50 of a pupillated backlight 20 for a first light source 15. Features of the embodiment of FIGS. 30A-B not discussed in further detail may be assumed to correspond to the features with equivalent reference numerals as discussed above, including any potential variations in the features.

Grazing output light rays 445G from source 15 are output from the waveguide 1 with a cone angle 445 and substantially uniform output angle across the plane of the waveguide 1.

The prismatic elements 52 of the optical turning film component 50 are arranged to deflect the light 445G exiting the waveguide 1, the deflection varying in at least one direction across the plane.

Near the upper edge of the display, light rays 445G are refracted by facets 53BU with facet angle $\beta_U$ and reflected by total internal reflection at facets 53AU with surface normal direction $n_{AU}$ with facet angle $\alpha_U$ such that output light ray 445U is directed towards a window 26A at a window distance $Z_{wA}$ from the backlight apparatus 20. In at least one cross sectional plane, the size of the window 26 in the window plane 197A is determined by the angular width of the light cone 455, that may be for example by the full width half maximum luminance of the angular distribution 455.

Similarly near the centre of the display, light rays 445G are refracted by facets 53BC with facet angle $\beta_C$ and reflected by total internal reflection at facets 53AC with surface normal direction $n_{AC}$ with facet angle $\alpha_C$ such that output light ray 445C is directed towards a window 26A in the window plane 197A at a window distance $Z_{WA}$ from the backlight apparatus 20.

Similarly near the lower edge of the display, light rays 445G are refracted by facets 53BD with facet angle $\beta_D$ and reflected by total internal reflection at facets 53AD with surface normal direction $n_{AD}$ with facet angle $\alpha_D$ such that output light ray 445D is directed towards a window 26A in the window plane 197A at a window distance $\%_A$ from the backlight apparatus 20.

Facet angles α, β vary continuously with location across the length of the optical turning film component 50. The deflected light rays 445U, 445C, 445D are directed towards a common optical window 26A in front of the backlight apparatus 20.

The operation of the optical turning film component with ridges 54 that are arranged as straight lines will now be further described.

Figure 30C:
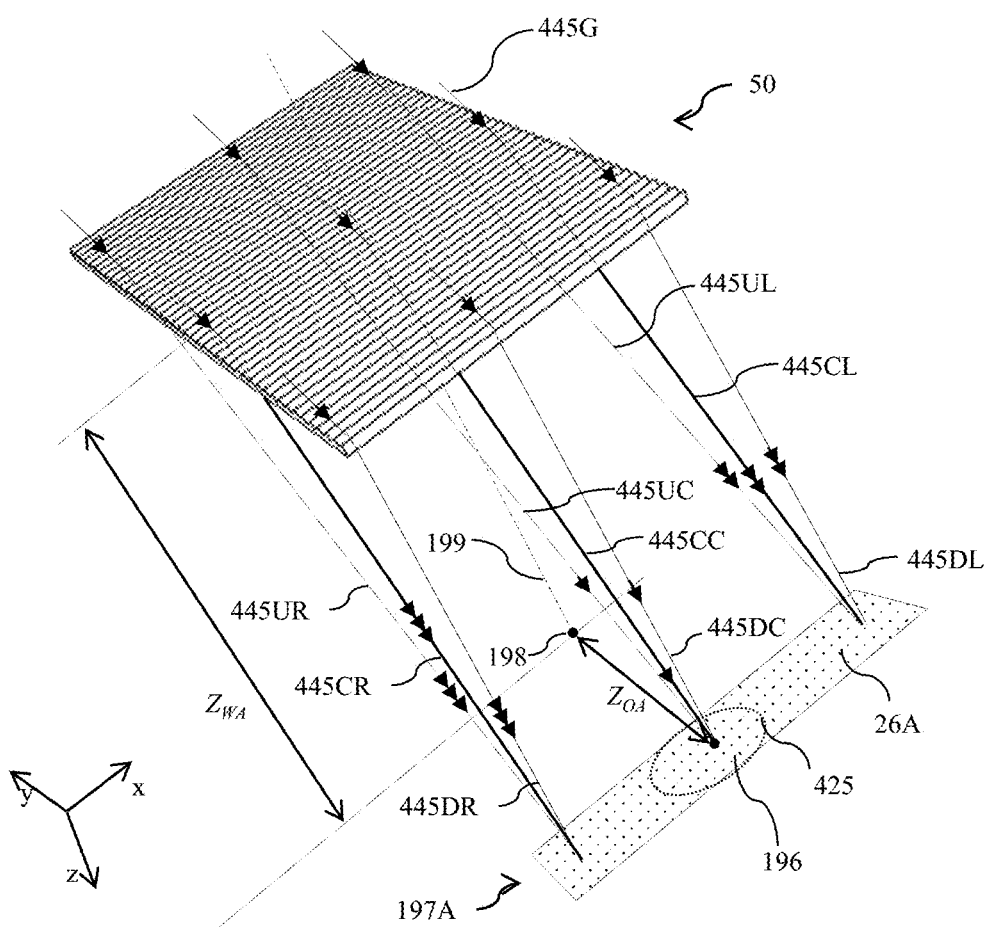
FIG. 30C is a schematic diagram illustrating a rear perspective view of light output from a pupillated linear optical turning film component comprising variable tilt facets.

FIG. 30C is a schematic diagram illustrating a rear perspective view of light output from a pupillated linear optical turning film component 50 comprising variable tilt facets 53 of FIGS. 30A-B. Features of the embodiment of FIG. 30C not discussed in further detail may be assumed to correspond to the features with equivalent reference numerals as discussed above, including any potential variations in the features.

FIG. 30C illustrates that the ridges 54 extend along an array of lines across the plane in which the input surface 56 extends. The optical turning film component 50 has a rectangular shape across the plane and the lateral direction is along a major or minor axis of the rectangular shape.

Facet 53 angles of respective facets 53, defined between a normal to the facet 53 and a normal to the plane, vary across the array so that the deflection varies in a direction orthogonal to an optical axis 199 that is normal to the plane, the direction corresponding to a direction orthogonal to the lateral direction.

The lines are straight and facet 53 angles of respective facets 53, defined between a normal to the facet 53 and a normal to the plane, vary across the array so that the deflection varies in a direction orthogonal to the optical axis 199 corresponding to a direction orthogonal to the lateral direction.

The lines of the array have an arithmetic mean tangential angle projected on to the plane of 0° from the lateral direction, that is the lines are parallel to the x-axis direction that is the lateral direction in the present embodiment.

Thus, the rays 445G are directed by the optical turning film component 50 towards the common window 26A. Light rays 445UL, 445CL, 445DL from the upper, central and lower parts of the left edge region of the optical turning film are located to the window 26A at a location corresponding to the lateral location of the left edge region in the lateral direction. Light rays 445UC, 445CC, 445DC from the upper, central and lower parts of the central region of the optical turning film are located to the window 26A at a location in the lateral corresponding to the lateral location of the central region in the lateral direction. Light rays 445UR, 445CR, 445DR from the upper, central and lower parts of the right edge region of the optical turning film are located to the window 26A at a location in the lateral corresponding to the lateral location of the right edge region in the lateral direction.

In the embodiment of FIG. 30C there is no deflection in the lateral direction and the optical window 26A is thus has an extent in the lateral direction that is determined by the width of the optical turning film component 50 and by the size of the solid angle of the angular distribution 455; and a width that is determined by the size of the solid angle of the angular distribution 455. The size of the optical window 26A in the window plane 197A may also be controlled by means of diffusion such as diffusers in the optical stack 5 of the display as illustrated in FIG. 1A.

The embodiment of FIG. 30C further illustrates that the common optical window 26A is offset from an optical axis 199 that extends from the centre of optical turning film component 50 normal to the plane. Thus the point 198 at which the optical axis 199 intersects the window plane 197A is offset by distance $Z_{OA}$ from the point 196 at which the ray 445CC intersects the window plane 197A. As will be described hereinbelow, off-axis illumination locations may be achieved with increased uniformity across the backlight apparatus 20.

It may be desirable to provide an optical window 26 with reduced extent in the direction orthogonal to the lateral direction.

Figure 31A:
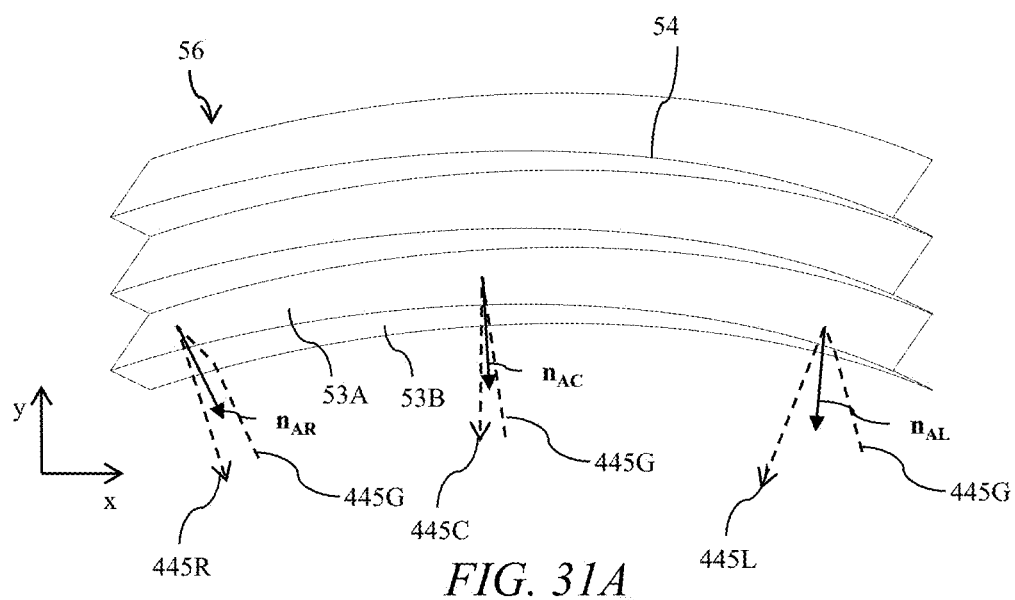
FIG. 31A is a schematic diagram illustrating a front perspective view of operation of facets of a curved optical turning film component of a pupillated backlight for light from a first light source.
Figure 31B:
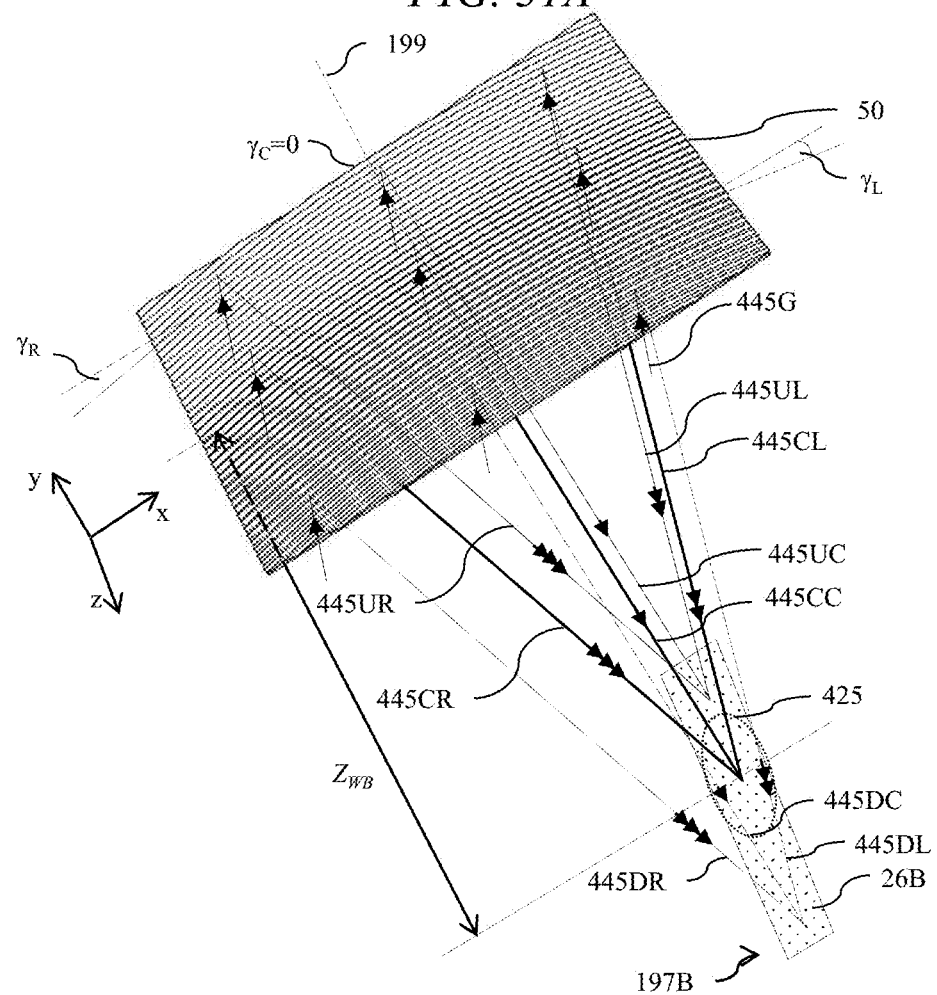
FIG. 31B is a schematic diagram illustrating a rear perspective view of light output from a curved optical turning film component comprising uniform tilt facets.

FIG. 31A is a schematic diagram illustrating a front perspective view of operation of facets 53 of a curved optical turning film component 50 of a pupillated backlight 20 for light from a first light source 15; and FIG. 31B is a schematic diagram illustrating a rear perspective view of light output from a curved optical turning film component 50 comprising uniform tilt facets 53. Features of the embodiment of FIGS. 31A-B not discussed in further detail may be assumed to correspond to the features with equivalent reference numerals as discussed above, including any potential variations in the features.

FIGS. 31A-B illustrate an alternative embodiment to the arrangement of FIGS. 30A-C. In comparison to the arrangement of FIG. 30C, the lines of the ridges 54 are curved across the plane so that the deflection varies in a direction orthogonal to an optical axis 199 that is normal to the plane, the direction corresponding to the lateral direction.

The curved facets have surface normal directions $n_{AR}$, $n_{AC}$, $n_{AL}$ that vary across the width of the optical turning film 50, that is the surface normal directions vary in the lateral direction along a ridge such that light rays 445G from the waveguide 1 are directed towards a common window 26B in a window plane 197B at a distance $Z_{WB}$ from the optical turning film component 50 of the backlight apparatus 20.

The optical window 26B has a cone width defined by cone 457 in directions orthogonal to the lateral direction and an extent determined by the cone 457 width and the height of the optical turning film component 50, and is thus orthogonal to the optical window 26A illustrated in FIG. 30C.

In the embodiment of FIG. 31B, the centre of the optical window 26B is illustrated as aligned with the centre of the backlight apparatus 20, that is the common optical window 26 is aligned with an optical axis 199 that extends from the centre of optical turning film component normal to the plane. The offset $Z_{OB}$ of the optical window 26B is zero and the lines of the array have an arithmetic mean tangential angle projected on to the plane that is inclined at of 0° from the lateral direction.

The orientation of the lines of the array is described by facet peak 54 rotations γ where $γ_R$ is rotation at the right side of the display $γ_C$ is the rotation in the centre and $γ_L$ is the rotation at the left edge. The arithmetic mean tangential angle projected on to the plane is the average rotation γ across the lateral direction.

The lines of the array may alternatively have an arithmetic mean tangential angle that is inclined at more than 0° from the lateral direction. Such an arrangement achieves an offset $Z_{OB}$ that is non-zero. Advantageously the nominal window 26B location may be set for off-axis illumination with desirable properties as will be described further hereinbelow.

It may be desirable to provide a common optical window for all points across the backlight apparatus 20.

Figure 31C:
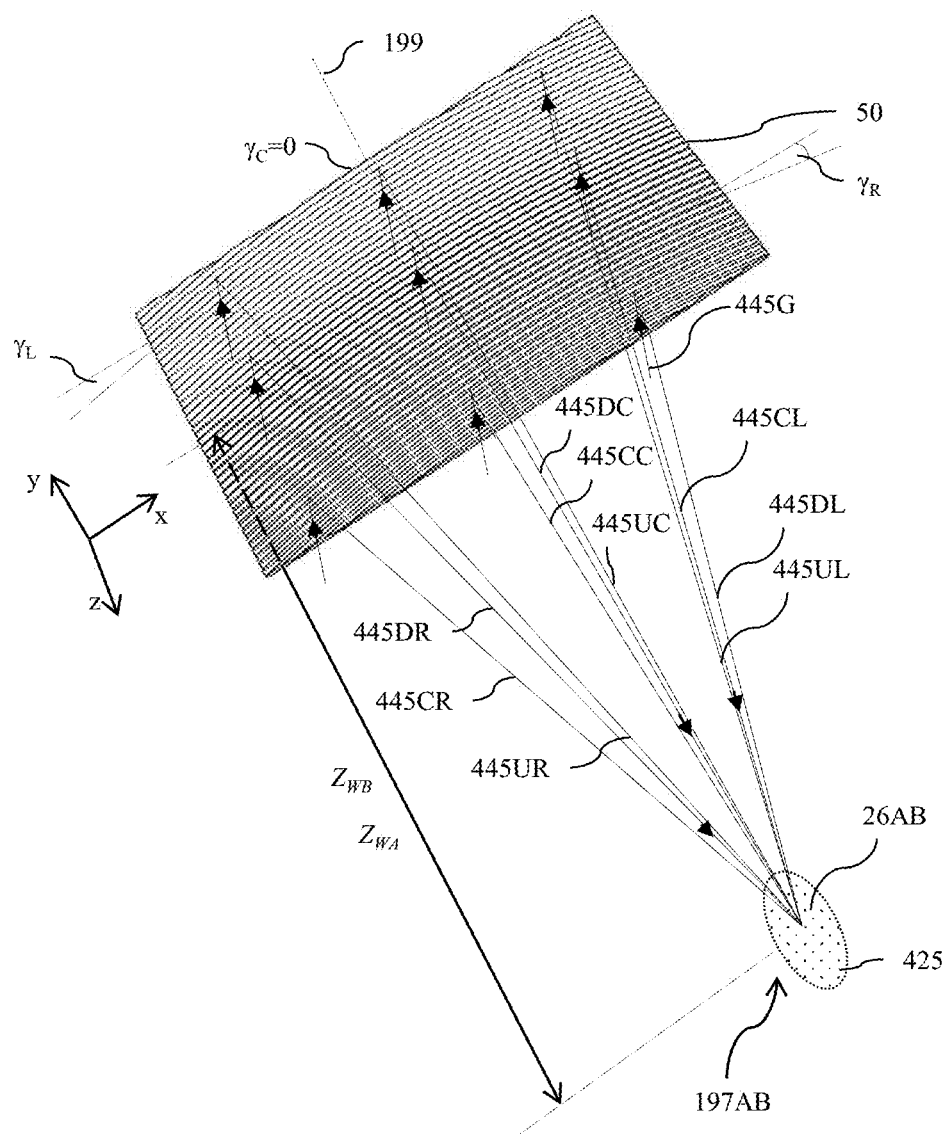
FIG. 31C is a schematic diagram illustrating a rear perspective view of light output from a curved optical turning film component comprising variable tilt facets with a common optical window distance.

FIG. 31C is a schematic diagram illustrating a rear perspective view of light output from a curved optical turning film component 50 comprising variable tilt facets 53 with a common optical window across the illumination apparatus. Features of the embodiment of FIG. 31C not discussed in further detail may be assumed to correspond to the features with equivalent reference numerals as discussed above, including any potential variations in the features.

The facet surfaces 53 are provided to achieve operation for rays 445G as illustrated in both FIG. 30B and FIG. 31A. Facet 53 angles of respective facets 53, defined between a normal to the facet 53 and a normal to the plane, vary across the array so that the deflection further varies in a direction orthogonal to the optical axis 199, corresponding to a direction orthogonal to the lateral direction, so that the deflected light is directed towards a further, common optical window 26AB in front of the backlight apparatus 20.

The first mentioned common optical window 26A and the further common optical window 26B are defined the same distance in front of the backlight apparatus 20, achieving common optical window 26AB. Advantageously increased uniformity of output is achieved across the whole of the backlight apparatus 20 from observation locations within the optical window 26AB.

Figure 31D:
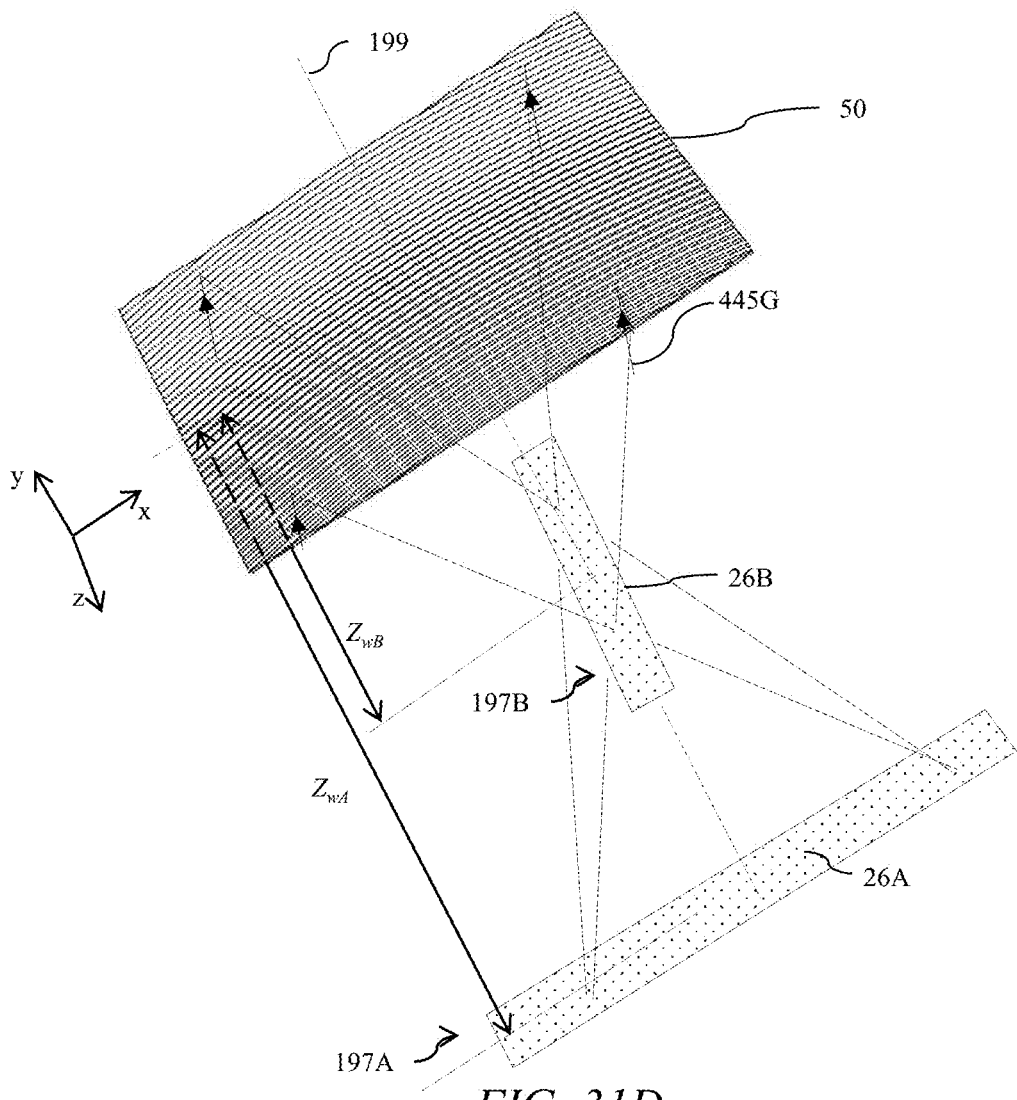
FIG. 31D is a schematic diagram illustrating a rear perspective view of light output from a curved optical turning film component comprising variable tilt facets with first and second different optical window distances.

FIG. 31D is a schematic diagram illustrating a rear perspective view of light output from a curved optical turning film component 50 comprising variable tilt facets 53 with first and second different optical window distances 197A, 197B.

The first mentioned common optical window 26A and the further common optical window 26B are defined at different distances $Z_{WA}$, $Z_{WB}$ in front of the backlight apparatus 20. Further as described above, the offset ZOA may be provided by facet 53 angle selection and offset ZOB may be achieved by selection of the arithmetic mean tangential angle projected on to the plane of the inclination of the lines formed by the ridges 54 of the array. Advantageously increased uniformity may be achieved for two different nominal observation distances and angular locations.

The operation of the backlight apparatus 20 in a backlight 20 of a display apparatus 100 will now be described. For the purposes of the present description the backlights 20 are further referred to as pupillated backlights, that is backlights that provide optical windows 26.

Figure 32A:
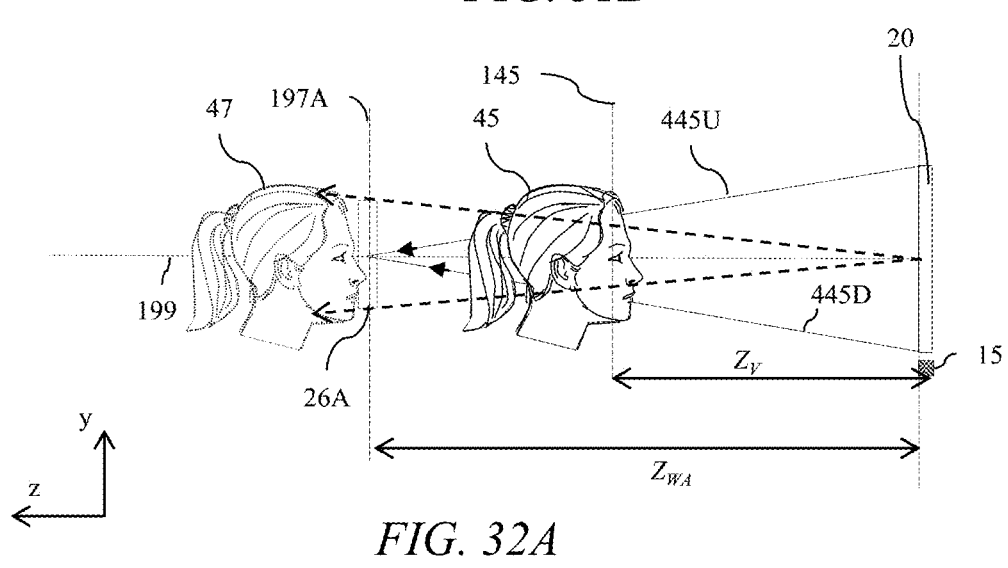
FIG. 32A is a schematic diagram illustrating a side view of operation of a turning film comprising variable tilt facets of a pupillated backlight.

FIG. 32A is a schematic diagram illustrating a side view of operation of an optical turning film component 50 comprising variable tilt facets 53 of a pupillated backlight 20.

Light source array 15 is arranged at the lower edge of the backlight and rays 445L, 445R are directed towards optical window 26A that has an extent in the lateral direction as described above. In typical operation, the window distance between the backlight 20 and the window plane 197 is arranged to be greater than the typical observer location.

In an illustrative example, a laptop display of diagonal size 14 inches is arranged with a window distance $Z_{WA}$ of 700 mm, while the nominal observer location is in plane 145 at a distance $Z_V$ of 500 mm. The window distance $Z_{WA}$ may be arranged by design of waveguide 1 and facets 53 to be at a nominal snooper distance which may for example be 700 mm.

Figure 32B:
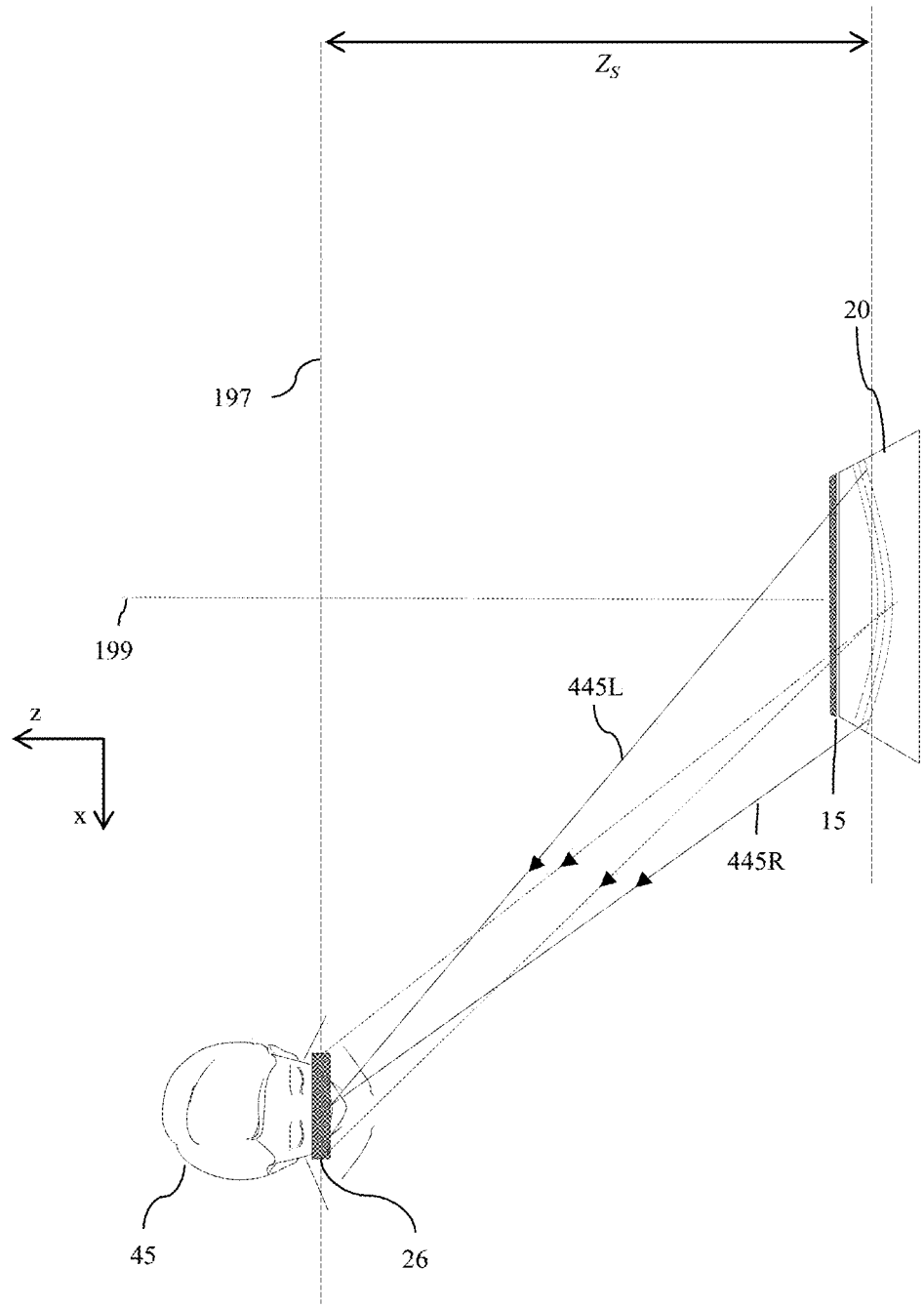
FIG. 32B is a schematic diagram illustrating a top view of operation of a curved optical turning film component of a pupillated backlight.

FIG. 32B is a schematic diagram illustrating a top view of operation of a curved optical turning film component 50 of a pupillated backlight 20 wherein the user 45 is offset in the lateral direction.

As will be described further in an illustrative example below, the arrangement of FIGS. 32A-B advantageously achieve increased luminance uniformity across the backlight 20 for at least one of the users 45, 47.

In operation the user 45 sees an image that has increased uniformity in comparison to unpupillated backlights (i.e. backlights which do not provide a common optical window 26, or in other words provide a common optical window at optical infinity). Thus light rays 445L, 445R are directed with substantially the same luminance to the optical window 26. Advantageously increased uniformity across the display area may be achieved for an increased range of observer 45 locations. Further increased security factor in privacy mode of operation may be achieved for an increased range of user 47 locations.

Features of the embodiment of FIGS. 32A-B not discussed in further detail may be assumed to correspond to the features with equivalent reference numerals as discussed above, including any potential variations in the features.

Figure 33:
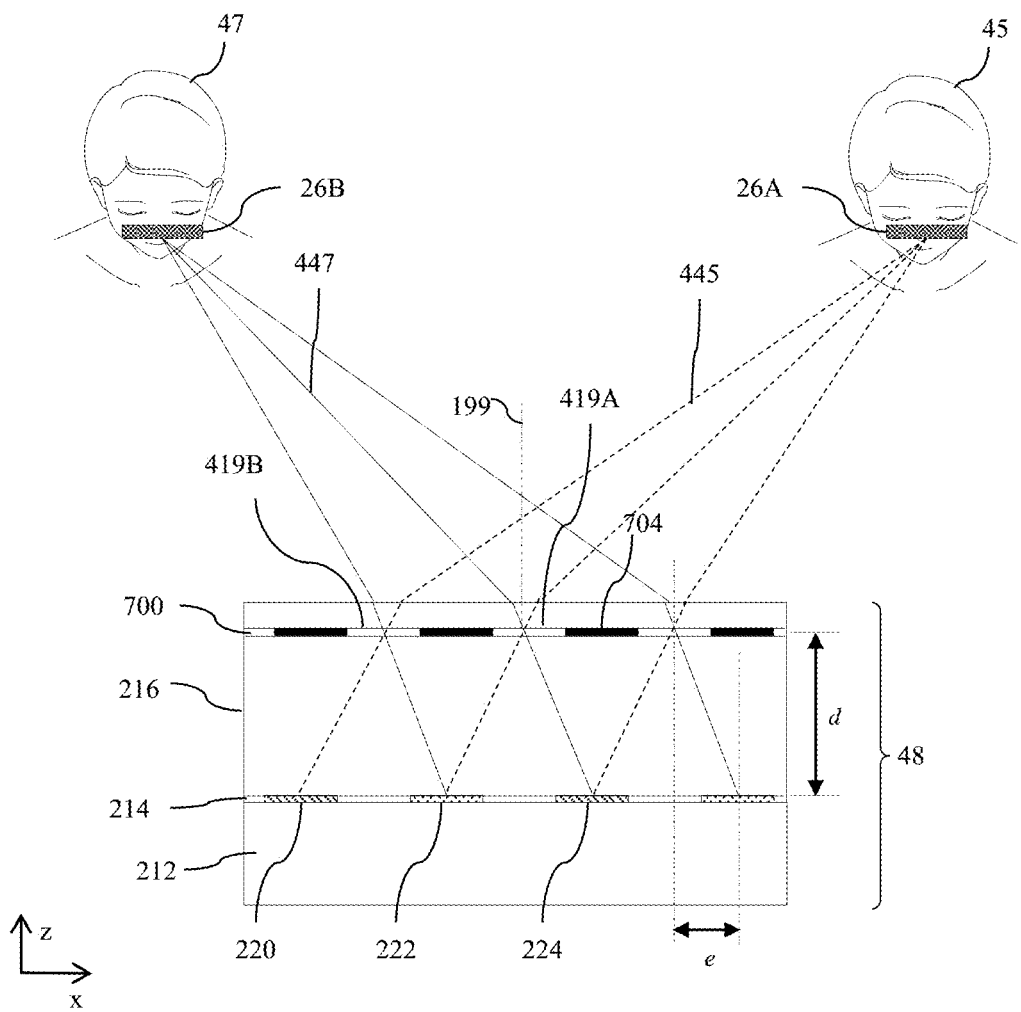
FIG. 33 is a schematic diagram illustrating a side view of operation of the emissive spatial light modulator of FIG. 3.

FIG. 33 is a schematic diagram illustrating a side view of operation of the emissive spatial light modulator of FIG. 3. Apertures 419 are offset by distance e from the respective aligned emitting pixels 220, 222, 224. Considering pixel 222, light 445 is directed through aperture 419A to optical window 26A and light 447 is directed through aperture 419B to optical window 26B. Such an arrangement can provide optical windows 26A, 26B at nominal user 45, 47 locations. Considering FIG. 3, polar control retarder 300 is arranged in one mode of operation to advantageously achieve high image visibility to user 45 and high image security level, S to user 47 as described elsewhere herein. Advantageously an emissive display such as a CSD may be provided.

The operation of the polar control retarders of FIG. 1A and FIG. 1B will now be described.

Figure 34:
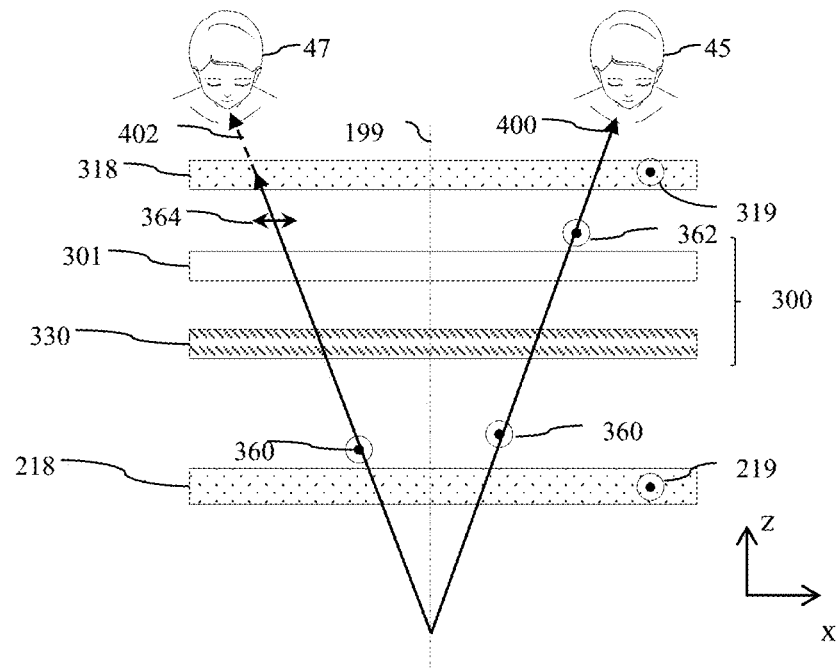
FIG. 34 is a schematic diagram illustrating in side view propagation of light through the polar control retarders of FIGS. 1A-B in a privacy (narrow angle) mode of operation.
Figure 35:
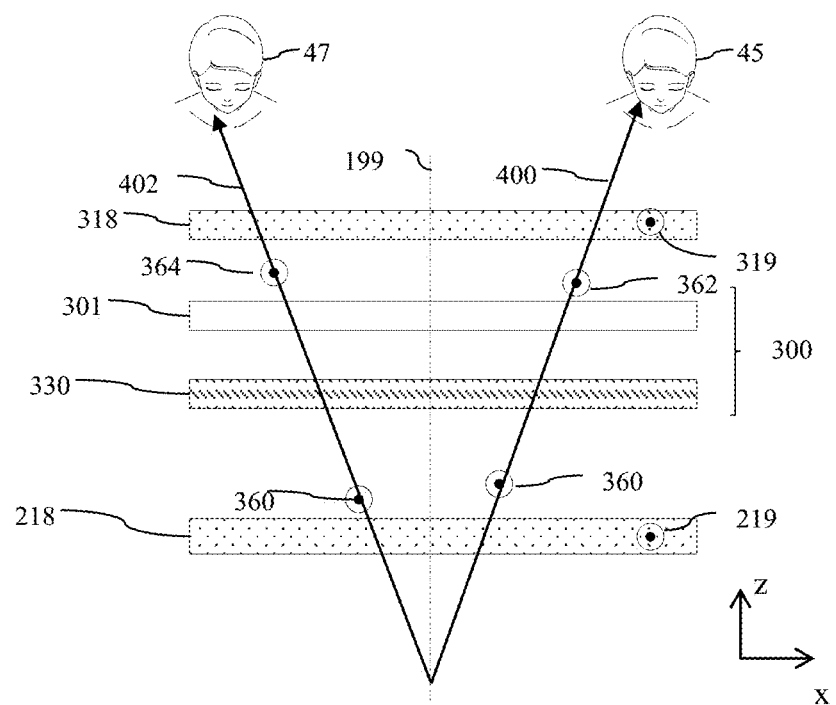
FIG. 35 is a schematic diagram illustrating in side view propagation of light through the polar control retarders of FIGS. 1A-B in a wide-angle mode of operation.

FIG. 34 is a schematic diagram illustrating in side view propagation of light through the polar control retarders 300 of FIG. 1B in a privacy (narrow angle) mode of operation; and FIG. 35 is a schematic diagram illustrating in side view propagation of light through the polar control retarders 300 of FIG. 1B in a privacy (narrow angle) mode of operation.

When the layer 314 of liquid crystal material 414 is driven to operate in the privacy mode, the retarders 300 provide no overall transformation of polarisation component 360 along axis 400 that is inclined to the normal 199 to the plane of the polar control retarder 300. In the present discussion, polarisation component refers to the polarisation state that arises from the phase and amplitude of two orthogonal components.

The polariser 219 provides a linear polarisation component 360 that is incident on the polar control retarder 300. As illustrated in FIG. 5A, the liquid crystal retarder 301 has the surface alignment layers 419B with a pretilt having a pretilt direction 417B with a component 417Bp in the plane of the layer of liquid crystal material 414 that is at an acute non-zero angle 617B to the electric vector transmission directions of the display polariser 218 and the additional polariser 318.

Such an acute non-zero angle 617 provides an axis direction 400 at an acute angle to the normal 199 to the polar control retarder 300, along which substantially no phase difference is provided to the incident polarisation component 360 and the transmitted polarisation component 362 is the same as polarisation component 360. The additional polariser 318 transmits the polarisation component 360 and high luminance transmission is achieved along the axis 400.

Considering the axis 402 that is inclined at an acute angle to the perpendicular to the plane of the retarders towards the user 47, the polar control retarder 300 further provides an overall transformation of polarisation component 360 to light rays 447 passing along axis 402. At a minimum, the polarisation component 361 is transformed to a linear polarisation component 364 and absorbed by additional polariser 318. More generally, the polarisation component 361 is transformed to an elliptical polarisation component, that is partially absorbed by additional polariser 318. Thus transmission varies with polar angle in the manner described for example in FIG. 6A.

Operation in the public mode will now be described.

When the liquid crystal retarder 301 is in driven such that the molecules of the liquid crystal material 414 are substantially aligned with the optical axis, the retardance of the liquid crystal layer 314 is compensated by the retardance of the passive retarder 330 so that zero or a low net retardance is provided for all polar angles of incidence onto the polar control retarder.

The retarders 300 thus provide no overall transformation of polarisation component 360 to output light passing therethrough perpendicular to the plane of the polar control retarder 301 or at an acute angle to the perpendicular to the plane of the polar control retarder 301. That is polarisation component 362 is substantially the same as polarisation component 360 and polarisation component 364 is substantially the same as polarisation component 360. Thus the angular transmission profile is substantially uniformly transmitting across a wide polar region. Advantageously a display may be switched to a wide field of view.

Other types of switchable privacy display will now be described.

A display device 100 that may be switched between privacy and public modes of operation comprises an imaging waveguide and an array of light sources as described in U.S. Pat. No. 9,519,153, which is incorporated by reference herein in its entirety. The imaging waveguide images an array of light sources to optical windows that may be controlled to provide high luminance on-axis and low luminance off-axis in a privacy mode, and high luminance with a large solid angle cone for public operation.

As may be used herein, the terms "substantially" and "approximately" provide an industry-accepted tolerance for its corresponding term and/or relativity between items. Such an industry-accepted tolerance ranges from zero percent to ten percent and corresponds to, but is not limited to, component values, angles, et cetera. Such relativity between items ranges between approximately zero percent to ten percent.

While various embodiments in accordance with the principles disclosed herein have been described above, it should be understood that they have been presented by way of example only, and not limitation. Thus, the breadth and scope of this disclosure should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the embodiment(s) set out in any claims that may issue from this disclosure. Specifically and by way of example, although the headings refer to a "Technical Field," the claims should not be limited by the language chosen under this heading to describe the so-called field. Further, a description of a technology in the "Background" is not to be construed as an admission that certain technology is prior art to any embodiment(s) in this disclosure. Neither is the "Summary" to be considered as a characterization of the embodiment(s) set forth in issued claims. Furthermore, any reference in this disclosure to "invention" in the singular should not be used to argue that there is only a single point of novelty in this disclosure. Multiple embodiments may be set forth according to the limitations of the multiple claims issuing from this disclosure, and such claims accordingly define the embodiment(s), and their equivalents, that are protected thereby. In all instances, the scope of such claims shall be considered on their own merits in light of this disclosure, but should not be constrained by the headings set forth herein.

The invention claimed is:

1. A display device comprising:
  a spatial light modulator arranged to output spatially modulated light;
  a display polariser arranged on a side of the spatial light modulator, the display polariser being a linear polariser;
  an additional polariser arranged on the same side of the spatial light modulator as the display polariser, the additional polariser being a linear polariser; and
  at least one polar control retarder arranged between the display polariser and the additional polariser, wherein the at least one polar control retarder comprises:
    a switchable liquid crystal retarder comprising a layer of liquid crystal material and two surface alignment layers disposed adjacent to the layer of liquid crystal material and on opposite sides thereof, wherein at least one of the surface alignment layers has a pretilt having a pretilt direction with a component in the plane of the layer of liquid crystal material that is at an acute non-zero angle to the electric vector transmission directions of at least one of the display polariser and the additional polariser in at least part of the display device.

2. A display device according to claim 1, wherein the display polariser and the additional polariser have electric vector transmission directions that are parallel.

3. A display device according to claim 1, wherein one of the surface alignment layers is arranged to provide homogeneous alignment in the adjacent liquid crystal material, said one of the surface alignment layers having said pretilt having a pretilt direction with a component in the plane of the layer of liquid crystal material that is at an acute non-zero angle to the electric vector transmission directions of at least one of the display polariser and the additional polariser in at least part of the display device.

4. A display device according to claim 3, wherein the other of the surface alignment layers is arranged to provide homeotropic alignment in the adjacent liquid crystal material.

5. A display device according to claim 4, wherein the display polariser and the additional polariser have electric vector transmission directions that are parallel, and the other of the surface alignment layers has said pretilt having a pretilt direction with a component in the plane of the layer of liquid crystal material that is parallel or orthogonal to the electric vector transmission directions of the display polariser and the additional polariser.

6. A display device according to claim 3, wherein the other of the surface alignment layers is arranged to provide homogeneous alignment in the adjacent liquid crystal material.

7. A display device according to claim 4, wherein the other of the surface alignment layers has said pretilt having a pretilt direction with a component in the plane of the layer of liquid crystal material that is at an acute non-zero angle to the electric vector transmission directions of at least one of the display polariser and the additional polariser in at least part of the display device.

8. A display device according to claim 1, wherein each of the surface alignment layers is arranged to provide homeotropic alignment in the adjacent liquid crystal material, said surface alignment layers having said pretilt having a pretilt direction with a component in the plane of the layer of liquid crystal material that is at an acute non-zero angle to the electric vector transmission directions of at least one of the display polariser and the additional polariser in at least part of the display device.

9. A display device according to claim 1, wherein each of the surface alignment layers has a pretilt having a pretilt direction with a component in the plane of the layer of liquid crystal material that is at an acute non-zero angle to the electric vector transmission directions of at least one of the display polariser and the additional polariser in at least part of the display device.

10. A display device according to claim 1, wherein the at least one polar control retarder further includes at least one passive compensation retarder.

11. A display device according to claim 10, wherein the at least one passive compensation retarder comprises a passive compensation retarder having its optical axis perpendicular to the plane of the retarder.

12. A display device according to claim 10, wherein the at least one passive compensation retarder comprises a pair of passive compensation retarders which have optical axes in the plane of the retarders that are crossed.

13. A display device according to claim 12, wherein the angle between the optical axes is bisected by the electric vector transmission direction of at least one of the display polariser and additional polariser.

14. A display device according to claim 1, wherein said at least one of the surface alignment layers has a pretilt having a pretilt direction with a component in the plane of the layer of liquid crystal material that is at the same acute non-zero angle to the electric vector transmission directions of the display polariser and the additional polariser at all positions across the surface alignment layer.

15. A display device according to claim 1, wherein said at least one of the surface alignment layers has a pretilt having a pretilt direction with a component in the plane of the layer of liquid crystal material that is at an acute non-zero angle to the electric vector transmission directions of the display polariser and the additional polariser that varies monotonically along a predetermined axis across the surface alignment layer in at least part of the display device.

16. A display device according to claim 15, wherein said acute non-zero angle has an acute non-zero average value.

17. A display device according to claim 1, wherein said display polariser is an output display polariser arranged on the output side of the spatial light modulator.

18. A display device according to claim 17, wherein there is not a reflective polariser arranged between the output display polariser and the at least one polar control retarder.

19. A display device according to claim 17, further comprising a reflective polariser arranged between the output polariser and the at least one polar control retarder, the reflective polariser being a linear polariser arranged to pass the same linearly polarised polarisation component as the output polariser.

20. A display device according to claim 17, wherein the spatial light modulator comprises an emissive spatial light modulator arranged to emit the spatially modulated light.

21. A display device according to claim 1, wherein the display device further comprises a backlight arranged to output light, and wherein the spatial light modulator comprises a transmissive spatial light modulator arranged to receive and spatially modulate the output light from the backlight.

22. A display device according to claim 1, wherein the display device further comprises a backlight arranged to output light, and wherein the spatial light modulator comprises a transmissive spatial light modulator arranged to receive and spatially modulate the output light from the backlight and said display polariser is an input display polariser arranged on the input side of the spatial light modulator.

23. A display device according to claim 22, further comprising:
an output display polariser arranged on the output side of the spatial light modulator;
a further additional polariser arranged on the output side of the spatial light modulator, the further additional polariser being a linear polariser having an electric vector transmission direction that is parallel to the electric vector transmission directions of the display polariser and the additional polariser; and
at least one further polar control retarder arranged between the further additional polariser and the output display polariser.

24. A display device according to claim 1, further comprising:
a further additional polariser arranged on the same side of the spatial light modulator as the additional polariser outside the additional polariser, the further additional polariser being a linear polariser having an electric vector transmission direction that is parallel to the electric vector transmission directions of the display polariser and the additional polariser; and
at least one further polar control retarder arranged between the additional polariser and the further additional polariser.

25. A display device according to claim 21, wherein the backlight comprises:
at least one first light source arranged to provide input light;
at least one second light source arranged to provide input light in an opposite direction from the at least one first light source;
a waveguide arrangement comprising at least one waveguide, the waveguide arrangement being arranged to receive the input light from the at least one first light source and the at least one second light source and to cause light from the at least one first light source and the at least one second light source to exit from the waveguide arrangement by breaking total internal reflection; and
an optical turning film component comprising:
an input surface arranged to receive the light exiting from a waveguide through a light guiding surface of the waveguide by breaking total internal reflection, the input surface extending across the plane; and
an output surface facing the input surface, wherein the input surface comprises an array of elongate prismatic elements.

26. A display device according to claim 25, wherein the waveguide arrangement comprises:

a waveguide extending across a plane and comprising:
- first and second opposed light guiding surfaces arranged to guide light along the optical waveguide, the second light guiding surface being arranged to guide light by total internal reflection, and
- first and second input ends arranged between the first and second light guiding surfaces and extending in a lateral direction between the first and second light guiding surfaces;

wherein the at least one first light source is arranged to input light into the waveguide through the first input end and the at least one second light source is arranged to input light into the waveguide through the second input end, and the waveguide is arranged to cause light from the at least one first light source and the at least one second light source to exit from the waveguide through one of the first and second light guiding surfaces by breaking total internal reflection.

27. A display device according to claim 25, wherein the waveguide arrangement comprises:
- a first waveguide extending across a plane and comprising
  - first and second opposed light guiding surfaces arranged to guide light along the optical waveguide, the second light guiding surface being arranged to guide light by total internal reflection; and
  - a first input end arranged between the first and second light guiding surfaces and extending in a lateral direction between the first and second light guiding surfaces;
- wherein the at least one first light source is arranged to input light into the first waveguide through the first input end, and the first waveguide is arranged to cause light from the at least one first light source to exit from the first waveguide through one of the first and second light guiding surface by breaking total internal reflection;
- a second waveguide extending across the plane arranged in series with the first waveguide and comprising
  - first and second opposed light guiding surfaces arranged to guide light along the optical waveguide, the second light guiding surface being arranged to guide light by total internal reflection, and
  - a second input end arranged between the first and second light guiding surfaces and extending in a lateral direction between the first and second light guiding surfaces;
- wherein the at least one second light source is arranged to input light into the second waveguide through the second input end, and the second waveguide is arranged to cause light from the at least one second light source to exit from the second waveguide through one of the first and second light guiding surfaces by breaking total internal reflection, and
- wherein the first and second waveguides are oriented so that at least one first light source and at least one second light source input light into the first and second waveguides in opposite directions.

28. A display device according to claim 25, wherein the prismatic elements each comprise a pair of elongate facets defining a ridge therebetween.

29. A display device according to claim 28, wherein the ridges extend across the plane at non-zero angles to the lateral direction.

30. A display device according to claim 28, wherein the ridges extend across the plane parallel to the lateral direction.

* * * * *